US012796235B2

(12) United States Patent
Song et al.

(10) Patent No.: US 12,796,235 B2
(45) Date of Patent: Nov. 10, 2026

(54) DISPLAY DEVICE

(71) Applicant: Samsung Display Co., LTD., Yongin-si (KR)

(72) Inventors: Tae Young Song, Yongin-si (KR); Bu Yong Kim, Yongin-si (KR); Jin Won Kim, Yongin-si (KR); Dong Gyu Baeck, Yongin-si (KR); Hye Jin Paek, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 320 days.

(21) Appl. No.: 18/744,289

(22) Filed: Jun. 14, 2024

(65) Prior Publication Data

US 2025/0120261 A1 Apr. 10, 2025

(30) Foreign Application Priority Data

Oct. 10, 2023 (KR) ........................ 10-2023-0134280

(51) Int. Cl.
*H10K 59/122* (2023.01)
*H10K 59/80* (2023.01)

(52) U.S. Cl.
CPC ......... *H10K 59/122* (2023.02); *H10K 59/873* (2023.02)

(58) Field of Classification Search
None
See application file for complete search history.

(56) References Cited

U.S. PATENT DOCUMENTS

2020/0328256 A1* 10/2020 Lee ...................... H10K 50/115
2022/0052121 A1* 2/2022 Jang ...................... H10K 59/122
2023/0100355 A1* 3/2023 Hwang ................ H10K 50/125 257/79
2024/0244918 A1 7/2024 Kim et al.

FOREIGN PATENT DOCUMENTS

KR 10-2019-0122919 A 10/2019
KR 10-2024-0114323 A 7/2024

* cited by examiner

*Primary Examiner* — Hung K Vu
(74) *Attorney, Agent, or Firm* — Womble Bond Dickinson (US) LLP

(57) ABSTRACT

A display device includes: a first substrate including an emission area and a non-emission area; a light emitting element on the first substrate in the emission area; a pixel defining layer on the first substrate in the non-emission area; an encapsulation layer on the light emitting element and the pixel defining layer; a first bank on the encapsulation layer in the non-emission area; and a second bank on the encapsulation layer in the non-emission area, and including: a main portion that does not overlap with the first bank; and a protrusion portion overlapping with the first bank, and connected to the main portion.

20 Claims, 43 Drawing Sheets

DISPLAY DEVICE

CROSS-REFERENCE TO RELATED APPLICATION

The present application claims priority to and the benefit of Korean Patent Application No. 10-2023-0134280, filed on Oct. 10, 2023, in the Korean Intellectual Property Office, the entire disclosure of which is incorporated by reference herein.

BACKGROUND

1. Field

Aspects of embodiments of the present disclosure relate to a display device.

2. Description of the Related Art

The importance of display devices has steadily increased with the development of multimedia technology. Accordingly, various kinds of display devices, such as a liquid crystal display (LCD) device, an organic light emitting diode (OLED) display device, and the like, have been developed.

Among the display devices, a self-light emitting display device includes a self-light emitting element, such as an organic light emitting element. The self-light emitting element may include two opposite electrodes, and a light emitting layer interposed therebetween. In the case of using the organic light emitting element as the self-light emitting element, the electrons and holes from the two electrodes are recombined in the light emitting layer to produce excitons, which transition from an excited state to a ground state, thereby emitting light.

The above information disclosed in this Background section is for enhancement of understanding of the background of the present disclosure, and therefore, it may contain information that does not constitute prior art.

SUMMARY

A display device may include a color conversion element that implements color by receiving light from an organic light emitting element or the like. For example, the color conversion element receives blue light from the organic light emitting element, and emits blue, green, and red colors, respectively, so that images having various colors may be visually recognized. The color conversion element may be disposed on a display device in the form of a separate substrate, or may be formed by being directly integrated with elements in the display device.

One or more embodiments of the present disclosure may be directed to a display device having a narrower non-emission area or light blocking area.

One or more embodiments of the present disclosure may be directed to a display device having a larger pixel size and a higher luminance.

However, the aspects and features of the present disclosure are not restricted to those set forth above. The above and other aspects and features of the present disclosure will become more apparent to those having ordinary skill in the art from the detailed description with reference to the drawings.

According to one or more embodiments of the present disclosure, a display device includes: a first substrate including an emission area and a non-emission area; a light emitting element on the first substrate in the emission area; a pixel defining layer on the first substrate in the non-emission area; an encapsulation layer on the light emitting element and the pixel defining layer; a first bank on the encapsulation layer in the non-emission area; and a second bank on the encapsulation layer in the non-emission area, and including: a main portion that does not overlap with the first bank; and a protrusion portion overlapping with the first bank, and connected to the main portion.

In an embodiment, the first bank and the main portion of the second bank may be located at the same layer as each other.

In an embodiment, a minimum height of the main portion of the second bank may be less than a height of the first bank.

In an embodiment, the display device may further include a capping layer on the first bank and the second bank, and the capping layer may include a section curved along the protrusion portion of the second bank in a cross-sectional view.

In an embodiment, the display device may further include: a filling portion on the first bank and the second bank; and a second substrate on the filling portion. The protrusion portion of the second bank may be located between the first bank and the filling portion.

In an embodiment, the display device may further include: a filling portion between the encapsulation layer and the first bank, and between the encapsulation layer and the second bank; and a second substrate on the filling portion. The protrusion portion of the second bank may be located between the first bank and the filling portion.

In an embodiment, the first bank may include a plurality of sub-banks, and the sub-banks of the first bank may be spaced from each other in a first direction. The second bank may include a plurality of sub-banks, and the sub-banks of the second bank may be spaced from each other in a second direction crossing the first direction.

In an embodiment, two sub-banks from among the plurality of sub-banks of the first bank may be spaced from each other with the main portion of the second bank interposed therebetween.

In an embodiment, each of the sub-banks of the second bank may extend in the first direction, and over the sub-banks of the first bank.

In an embodiment, the main portion of the second bank may be connected to the protrusion portion overlapping with the first bank located on one side of the second bank in the first direction, and the protrusion portion overlapping with the first bank located on another side of the second bank in the first direction.

In an embodiment, the display device may further include a capping layer in contact with the first bank, and in contact with the main portion and the protrusion portion of the second bank.

In an embodiment, the emission area may include a first emission area, a second emission area, and a third emission area sequentially along a first direction, and a width of the second emission area may be greater than a width of the first emission area and a width of the third emission area.

In an embodiment, the protrusion portion of the second bank may be located between the first emission area and the second emission area.

In an embodiment, the first bank may include a plurality of sub-banks, and each of the sub-banks of the first bank may overlap with the second bank.

In an embodiment, any one of the sub-banks of the first bank may extend in a second direction crossing the first direction, and one end and another end of the one of the sub-banks of the first bank in the second direction may overlap with the second bank.

In an embodiment, the one of the sub-banks of the first bank may include a central portion located between the one end and the other end, and the central portion of the one of the sub-banks of the first bank may overlap with the second bank.

In an embodiment, the second emission area may extend in a second direction crossing the first direction, and the first bank may include sub-banks located on one side and another side of the second emission area in the second direction, respectively.

In an embodiment, an entire top surface of the first bank may overlap with the second bank.

According to one or more embodiments of the present disclosure, a display device includes: a first substrate including an emission area and a non-emission area; a light emitting element on the first substrate in the emission area; a pixel defining layer on the first substrate in the non-emission area; an encapsulation layer on the light emitting element and the pixel defining layer; a first bank on the encapsulation layer in the non-emission area, and including a plurality of sub-banks spaced from each other; a second bank on the encapsulation layer in the non-emission area, and including a main portion that does not overlap with the first bank, and a protrusion portion overlapping with the first bank; and a capping layer in contact with the first bank and the second bank.

In an embodiment, the display device may further include a light transmitting member on the encapsulation layer in the emission area, and a side surface of the light transmitting member may face a side surface of the first bank and a side surface of the main portion of the second bank.

According to one or more embodiments of the present disclosure, a display device may include a second bank overlapping with a first bank, and thus, the display device may have excellent luminance characteristics.

However, the aspects and features of the present disclosure are not limited to those described above. Additional aspects and features will be set forth, in part, in the detailed description that follows with reference to the drawings, and in part, may be apparent therefrom, or may be learned by practicing one or more of the presented embodiments of the present disclosure.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
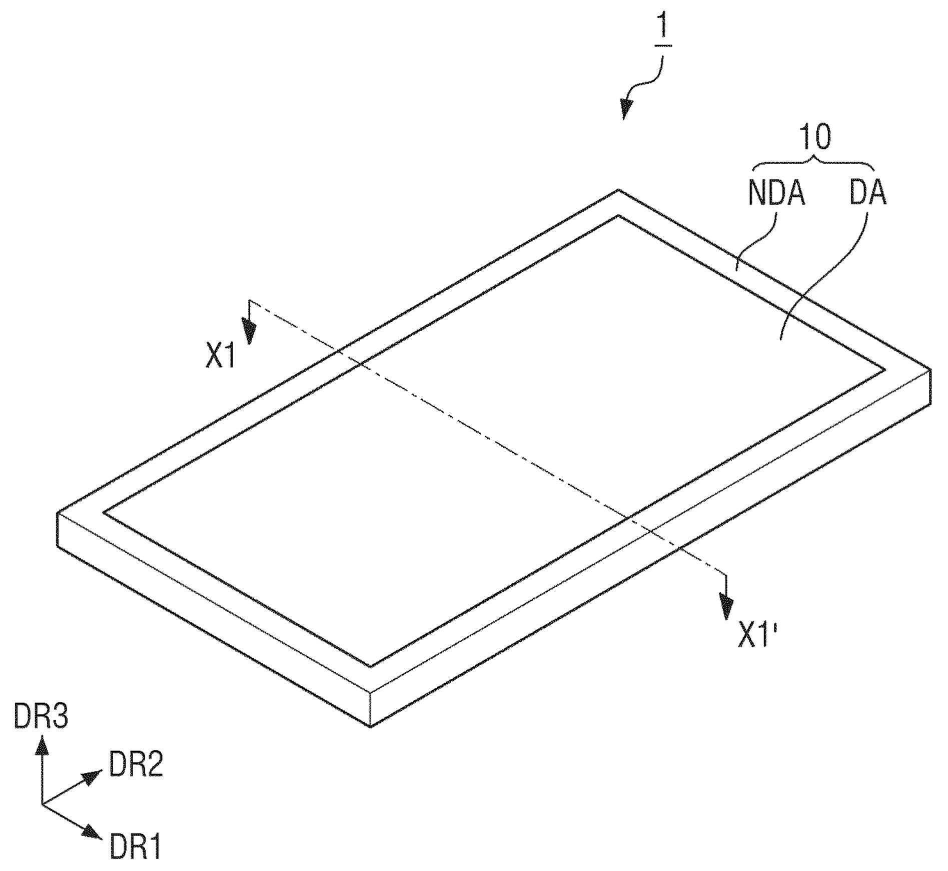
FIG. 1 is a perspective view showing a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
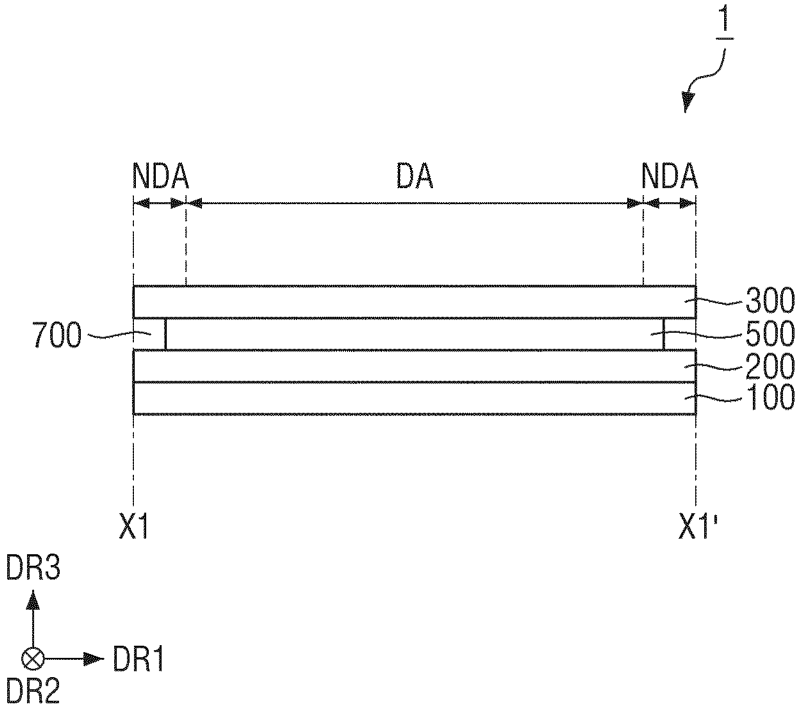
FIG. 2 is a cross-sectional view schematically taken along the line X1-X1' of FIG. 1 according to an embodiment.

FIG. 1 is a perspective view showing a display device according to an embodiment. FIG. 2 is a cross-sectional view schematically taken along the line X1-X1' of FIG. 1 according to an embodiment.

Referring to FIG. 1, a display device 1 according to one or more embodiments may be applied to various suitable portable electronic devices, such as a mobile phone, a smartphone, a tablet personal computer, a mobile communication terminal, an electronic organizer, an electronic book, a portable multimedia player (PMP), a navigation system, an ultra mobile PC (UMPC), or the like. In other embodiments, the display device 1 may be applied as a display unit of a television, a laptop, a monitor, a billboard, or an Internet-of-Things (IoT) terminal. However, the present disclosure is not limited thereto, and the display device 1 may be applied to other suitable electronic devices as needed or desired.

A first direction DR1, a second direction DR2, and a third direction DR3 are shown in FIG. 1. The first direction DR1 and the second direction DR2 may be perpendicular to or substantially perpendicular to each other. The first direction DR1 and the third direction DR3 may be perpendicular to or substantially perpendicular to each other. The second direction DR2 and the third direction DR3 may be perpendicular to or substantially perpendicular to each other. The first direction DR1 may refer to a vertical direction, the second direction DR2 may refer to a horizontal direction, and the third direction DR3 may refer to an upward and downward direction (e.g., a thickness direction) in the drawings. As used herein, unless otherwise specified, a "direction" may refer to any one of (e.g., both of) opposite directions extending along the direction. Further, one side of a "direction" may be referred to as "one side in the direction" and the other side of the "direction" may be referred to as "the other side in the direction." Referring to FIG. 1, a direction in which an arrow is directed is referred to as one side, and the opposite direction is referred to as the other side. Also, the third direction DR3 may be referred to as a thickness direction.

Hereinafter, when referring to the display device 1 or the surfaces of each member constituting the display device 1, one surface facing to one side in the direction in which the image is displayed, that is, the third direction DR3, is referred to as a top surface, and the opposite surface of the one surface is referred to as a bottom surface. However, the present disclosure is not limited thereto, and the one surface and the other surface of the member may be referred to as a front surface and a rear surface, respectively. In addition, the relative position of each of the members of the display device 1 may be described, such that one side of the third direction DR3 may be referred to as an upper side and the other side of the third direction DR3 may be referred to as a lower side.

The display device 1 has a three-dimensional shape. For example, the display device 1 may have a rectangular parallelepiped shape or a three-dimensional shape similar thereto. In an embodiment, the display device 1 may have a planar shape similar to a quadrilateral shape. In other words, the display device 1 according to an embodiment may have a planar shape similar to a quadrilateral shape having long sides along the first direction DR1 and short sides along the second direction DR2, as shown in FIG. 1, but the present disclosure is not limited thereto. For example, in a planar shape of the display device 1 according to an embodiment, a corner at which a long side in the first direction DR1 and a short side in the second direction DR2 meet each other may be formed to be rounded and have a curvature (e.g., a predetermined curvature), or may be formed at a right angle. The planar shape of the display device 1 is not limited to a quadrilateral shape, and may be a shape similar to another polygonal shape, a circular shape, or an elliptical shape.

The display device 1 may include a display panel 10, a flexible circuit board (FPC), and a driving chip. The display panel may include a display area DA in which a screen is displayed, and a non-display area NDA in which a screen is not displayed. In an embodiment, the non-display area NDA may be disposed to surround (e.g., around a periphery of) the edge of the display area DA, but the present disclosure is not limited thereto. An image displayed in the display area DA may be viewed by a user on one side in the third direction DR3 with reference to FIG. 1.

As shown in FIG. 2, the display panel 10 includes a light emitting portion 100, a light transmitting portion 200 disposed on the light emitting portion 100, and a color filter portion 300 on (e.g., facing) the light transmitting portion 200. The display panel 10 may further include a sealing member 700 that combines the light transmitting portion 200 with the color filter portion 300, and a filling portion 500 filled between the light transmitting portion 200 and the color filter portion 300.

The light emitting portion 100 may include elements and circuits for displaying an image, for example, such as a pixel circuit having a switching element, a pixel defining layer 170, and a self-light emitting element that define an emission area and a non-emission area, which will be described in more detail below, in the display area DA. In an embodiment, the self-light emitting element may include at least one of an organic light emitting diode, a quantum dot light emitting diode, an inorganic material-based micro light emitting diode (e.g., micro LED), or an inorganic material-based light emitting diode having a nano size (e.g., nano LED). Hereinafter, for convenience, a case where the self-light emitting element is an organic light emitting element will be described as a representative example.

The light transmitting portion 200 may be located on the light emitting portion 100. In an embodiment, the light transmitting portion 200 may include a color conversion pattern for converting a color of incident light emitted from the light emitting portion 100 and irradiated to the light transmitting portion 200. In an embodiment, the color filter portion 300 may include a light transmitting member described in more detail below as the color conversion pattern, and a bank pattern surrounding (e.g., around a periphery of) the light transmitting member. The light transmitting member may include at least one of a wavelength conversion shifter or a light scatterer.

The color filter portion 300 may be located on the light transmitting portion 20, and face the light emitting portion 100 and the light transmitting portion 200. In an embodiment, the color filter portion 300 may include first to third color filters, and may optionally further include a black matrix.

The sealing member 700 may be located between the light transmitting portion 200 and the color filter portion 300 in the non-display area NDA. The sealing member 700 may be disposed along edges of the light transmitting portion 200 and the color filter portion 300 in the non-display area NDA to surround (e.g., around a periphery of) the display area DA in a plan view. The light transmitting portion 200 and the color filter portion 300 may be connected to (e.g., coupled to or attached to) each other via the sealing member 700.

In an embodiment, the sealing member 700 may include (e.g., may be made of) an organic material. For example, the sealing member 700 may include (e.g., may be made of) an epoxy-based resin, but the present disclosure is not limited thereto. In another embodiment, the sealing member 700 may be applied in the form of a frit including glass or the like.

The filling portion 500 may be located in a space surrounded (e.g., around a periphery thereof) by the sealing member 700 between the light transmitting portion 200 and the color filter portion 300. The filling portion 500 may fill the space between the light transmitting portion 200 and the color filter portion 300.

In an embodiment, the filling portion 500 may include (e.g., may be made of) a material that can transmit light. In an embodiment, the filling portion 500 may include (e.g., may be made of) an organic material. For example, the filling portion 500 may include (e.g., may be made of) a silicone-based organic material, an epoxy-based organic material, a mixture of a silicone-based organic material and an epoxy-based organic material, or the like.

Hereinafter, the emission area and the non-emission area defined in the display area DA of the display panel 10 will be described in more detail.

Figure 3:
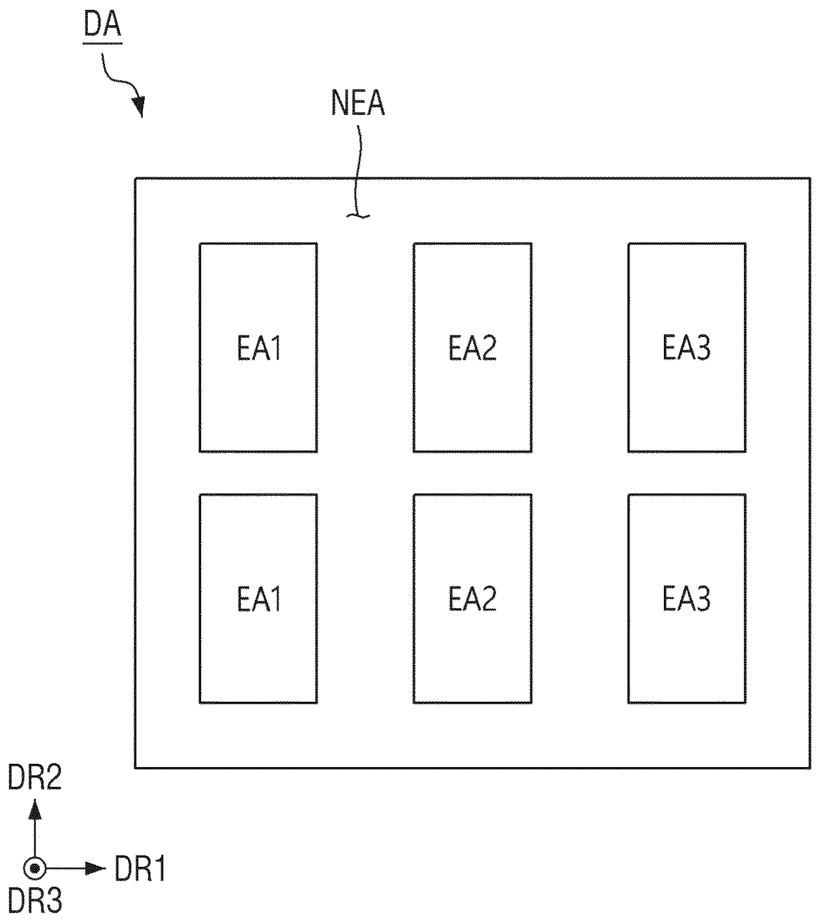
FIG. 3 is a plan view of a display area of the display device according to an embodiment.

FIG. 3 is a plan view of a display area of the display device according to an embodiment. For example, FIG. 3 is a plan view showing a layout of the display area of the display device.

Referring to FIG. 3, a plurality of emission areas EA1, EA2, and EA3 may be defined in the display area DA of the display device 1 according to an embodiment, and a non-emission area NEA may be disposed to surround (e.g., around peripheries of) the emission areas EA1, EA2, and EA3. The display area DA and the non-emission area NEA defined in FIG. 3 may also be applicable to the light emitting portion 100, the light transmitting portion 200, and the color filter portion 300.

In the display area DA, a first emission area EA1, a second emission area EA2, and a third emission area EA3 may be defined as illustrated in FIG. 3. The first emission area EA1, the second emission area EA2, and the third emission area EA3 may be areas in which light generated by the light emitting elements of the light emitting portion 100 is emitted to the outside of the light emitting portion 100, and the non-emission area NEA may be an area in which light is not emitted to the outside of the light emitting portion 100. In an embodiment, the non-emission area NEA may surround (e.g., around peripheries of) the first emission area EA1, the second emission area EA2, and the third emission area EA3 within the display area DA, but the present disclosure is not limited thereto. The non-emission area may also be referred to as a light blocking area.

In an embodiment, light emitted from the light emitting portion 100 in the first emission area EA1, the second emission area EA2, and the third emission area EA3 may be light of the first color. In an embodiment, the light of the first color may be blue light. In another embodiment, the light of the first color may be mixed light, and may be a mixture of two or more of blue light, green light, and/or red light. Red light may have a peak wavelength in a range of about 610 nm to 650 nm. Green light may have a peak wavelength in a range of about 510 nm to 550 nm. Blue light may have a peak wavelength in a range of about 440 nm to 480 nm. The peak wavelength may refer to a wavelength at which the intensity of light is at a maximum.

In an embodiment, as illustrated in FIG. 3, the first emission area EA1, the second emission area EA2, and the third emission area EA3 may be sequentially disposed along the first direction DR1. The first emission area EA1 may be a plurality in number, and the plurality of first emission areas EA1 may be disposed along the second direction DR2. The first emission area EA1, the second emission area EA2, and the third emission area EA3 constitute one group, and the group may be repeatedly disposed along the first direction DR1 and the second direction DR2 within the display area DA, but the present disclosure is not limited thereto. Hereinafter, for convenience, a case in which the first emission area EA1, the second emission area EA2, and the third emission area EA3 are disposed as illustrated in FIG. 3 will be described in more detail as an example.

In an embodiment, the area of the first emission area EA1, the area of the second emission area EA2, and the area of the third emission area EA3 may be the same or substantially the same as each other, but the present disclosure is not limited thereto. For example, the area of the first emission area EA1, the area of the second emission area EA2, and the area of the third emission area EA3 may be different from each other. In an embodiment, the first emission area EA1, the second emission area EA2, and the third emission area EA3 may have a rectangular shape in a plan view, but the present disclosure is not limited thereto. Hereinafter, for convenience, the first emission area EA1, the second emission area EA2, and the third emission area EA3 may be described in more detail as having a rectangular shape in a plan view and having the same or substantially the same area as each other, but the present disclosure is not limited thereto.

As described above, the light of the first color provided by the light emitting portion 100 may pass through the light transmitting portion 200, the filling portion 500, and the color filter portion 300 to be provided to the outside of the display device 1. Light emitted from the first emission area EA1 to the outside of the display device 1 may be referred to as first emission light. Light emitted from the second emission area EA2 to the outside of the display device 1 may be referred to as second emission light. Light emitted from the third emission area EA3 to the outside of the display device 1 may be referred to as third emission light. The first emission light may be the light of the third color, the second emission light may be the light of the second color, and the third emission light may be the light of the first color. In an embodiment, the light of the first color may be blue light, the light of the second color may be green light, and the light of the third color may be red light.

Hereinafter, the light transmitting portion 200 will be described in more detail.

Figure 4:
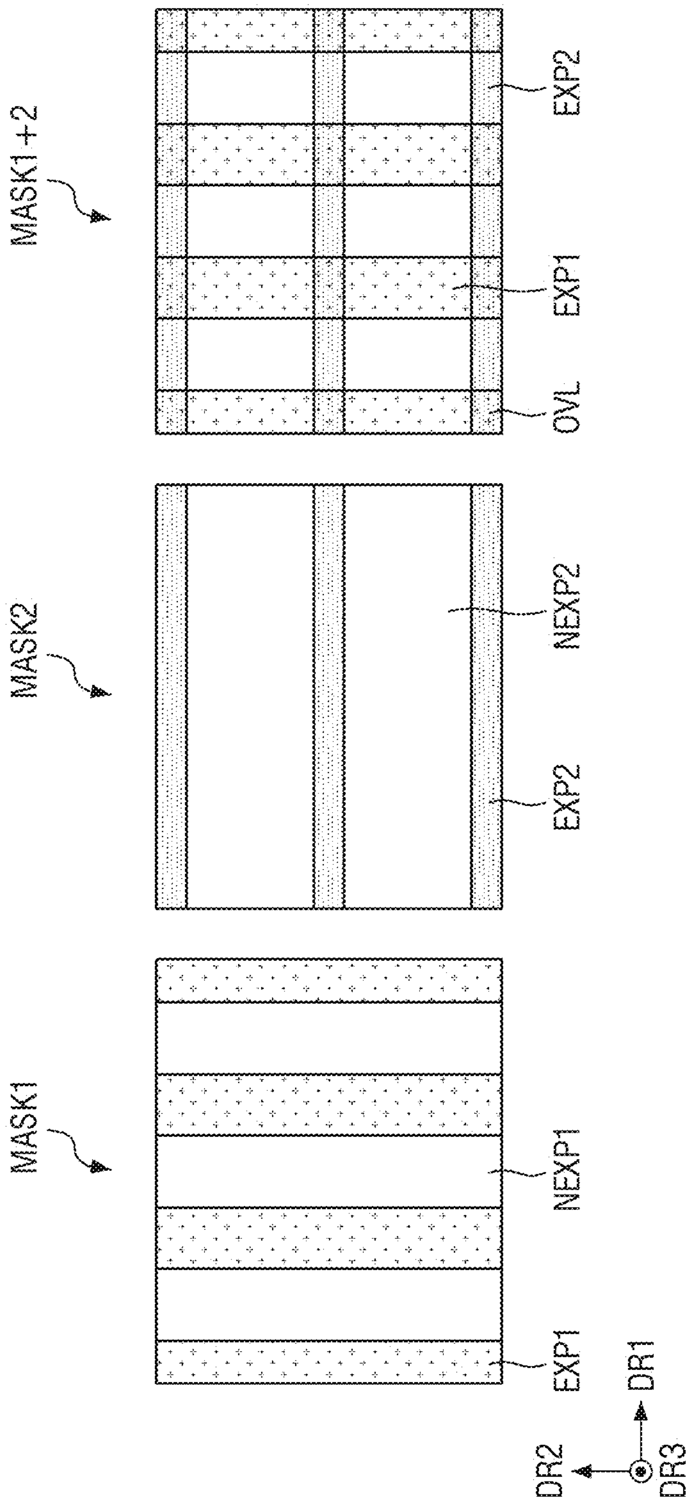
FIG. 4 is a plan view illustrating a mask for a bank for forming a display area of FIG. 3 according to an embodiment.
Figure 5:
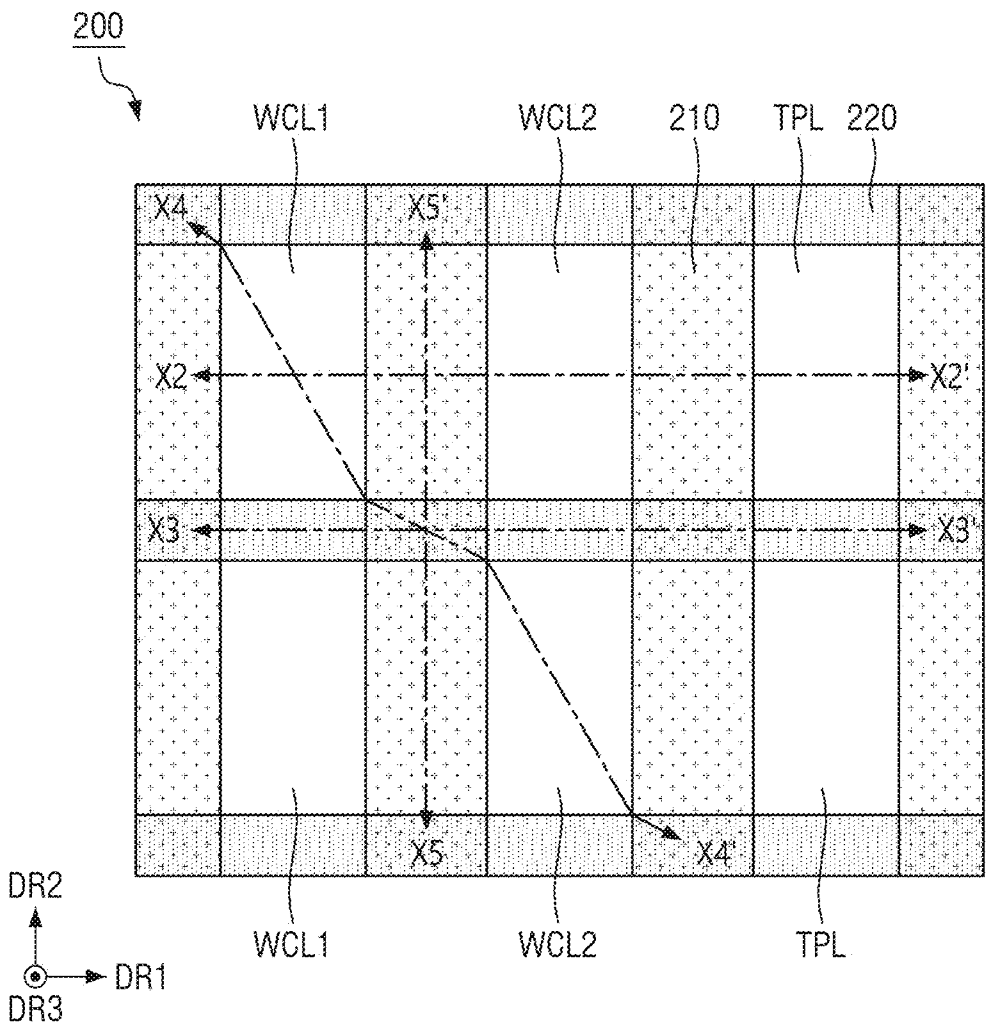
FIG. 5 is a plan view of a light transmitting portion formed by using the mask of FIG. 4.

FIG. 4 is a plan view illustrating a mask for a bank for forming a display area of FIG. 3 according to an embodiment. FIG. 5 is a plan view of the light transmitting portion 200 formed by using the mask of FIG. 4.

Referring to FIGS. 4 and 5, the light transmitting portion 200 may include light transmitting members WCL1, WCL2, and TPL overlapping with the emission areas EA1, EA2, and EA3, respectively, in the display area of FIG. 3. The light transmitting portion 200 may also include a bank pattern 210 and 220 overlapping with the non-emission area NEA. The bank pattern may include a first bank 210 and a second bank 220.

The first bank 210 may be formed through a photolithography process using a first mask MASK1, and the second bank 220 may be formed through a photolithography process using a second mask MASK2. The first mask MASK1 may include an exposed portion EXP1 and a non-exposed portion NEXP1, and the second mask MASK2 may include an exposed portion EXP2 and a non-exposed portion NEXP2. The exposed portion EXP1 of the first mask MASK1 and the exposed portion EXP2 of the second mask MASK2 may include an overlapping area OVL where they overlap with each other. The exposed portion EXP1 and the non-exposed portion NEXP1 of the first mask MASK1 are shown on the left side of FIG. 4, the exposed portion EXP2 and the non-exposed portion NEXP2 of the second mask MASK2 are shown at the center of FIG. 4, and the first mask MASK1 and the second mask MASK2 are shown as overlapped with each other on the right side of FIG. 4.

Referring to FIG. 5, the first bank 210 may be disposed in an area corresponding to the exposed portion EXP1 of the first mask MASK1, and the second bank 220 may be disposed in an area corresponding to the exposed portion EXP2 of the second mask MASK2. The first bank 210 and the second bank 220 may be formed from a negative photoresist to be located in the exposed portions EXP1 and EXP2. FIG. 4 and FIG. 5 illustrate a case where the bank pattern 210 and 220 is formed through the photolithography process of the negative photoresist, but the present disclosure is not limited thereto. In some embodiments, a bank may be formed from a positive photoresist, in which the photoresist in an exposed portion is removed while the photoresist in a non-exposed portion remains.

The first bank 210 may include a plurality of sub-banks, and the sub-banks of the first bank 210 may be spaced apart from each other in the first direction DR1. The second bank 220 may include a plurality of sub-banks, and the sub-banks of the second bank 220 may be spaced apart from each other in the second direction DR2. Although FIGS. 4 and 5 illustrate a case where the first bank 210 and the second bank 220 cross or intersect each other at a right angle, the present disclosure is not limited thereto. For example, in some embodiments, the first bank 210 and the second bank 220 may cross or intersect each other at an acute angle or an obtuse angle. The second bank 220 may be formed after the first bank 210 is formed. The second bank 220 may be formed over the first bank 210.

The bank pattern including the first bank 210 and the second bank 220 may expose a partial area. The partial area may include the emission areas EA1, EA2, and EA3, and the partial area of the light transmitting portion 200 may include the light transmitting members WCL1, WCL2, and TPL.

Hereinafter, a structure of the display device 1 will be described in more detail.

Figure 6:
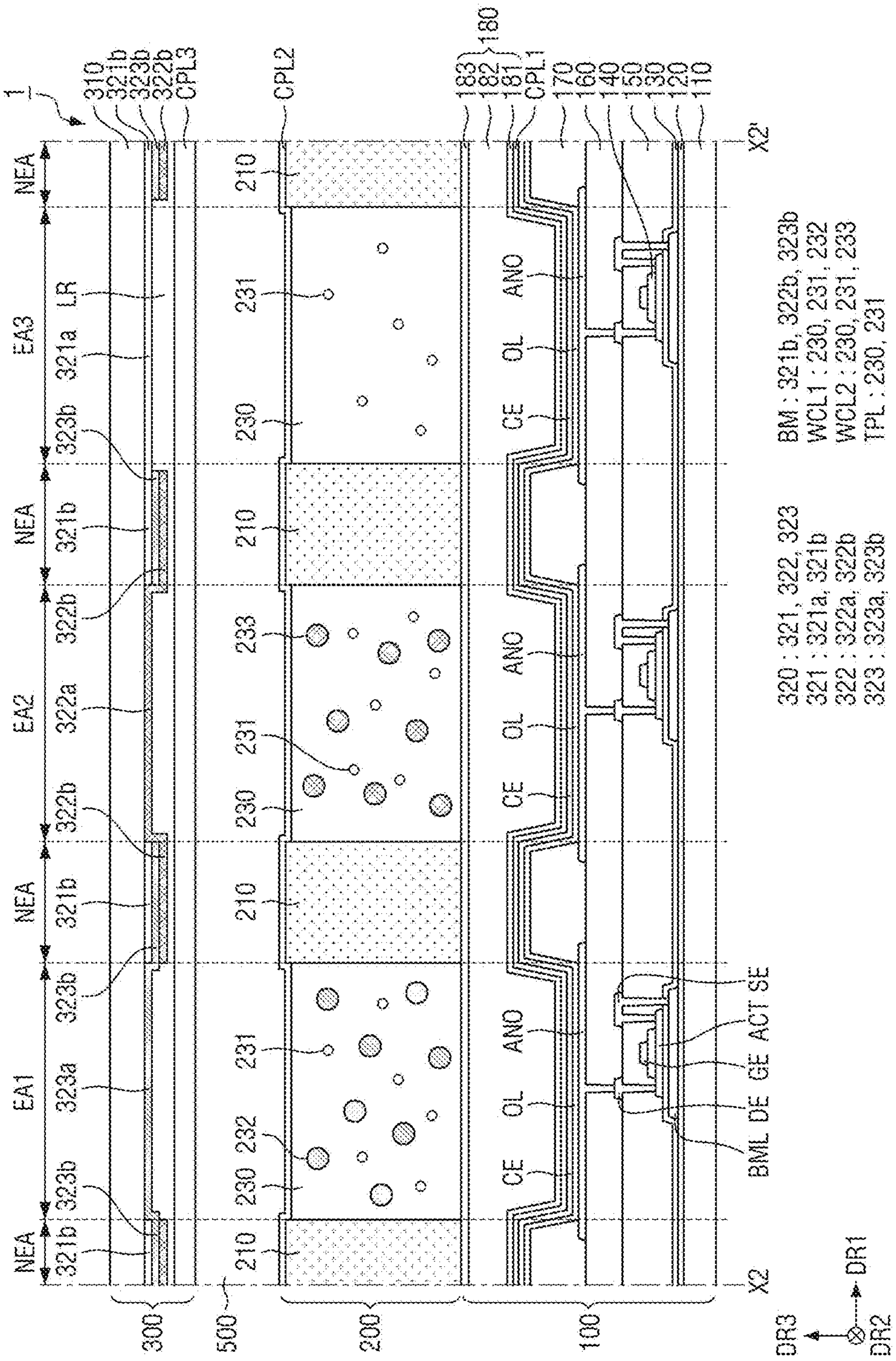
FIG. 6 is a cross-sectional view schematically taken along the line X2-X2' of FIG. 5.
Figure 7:
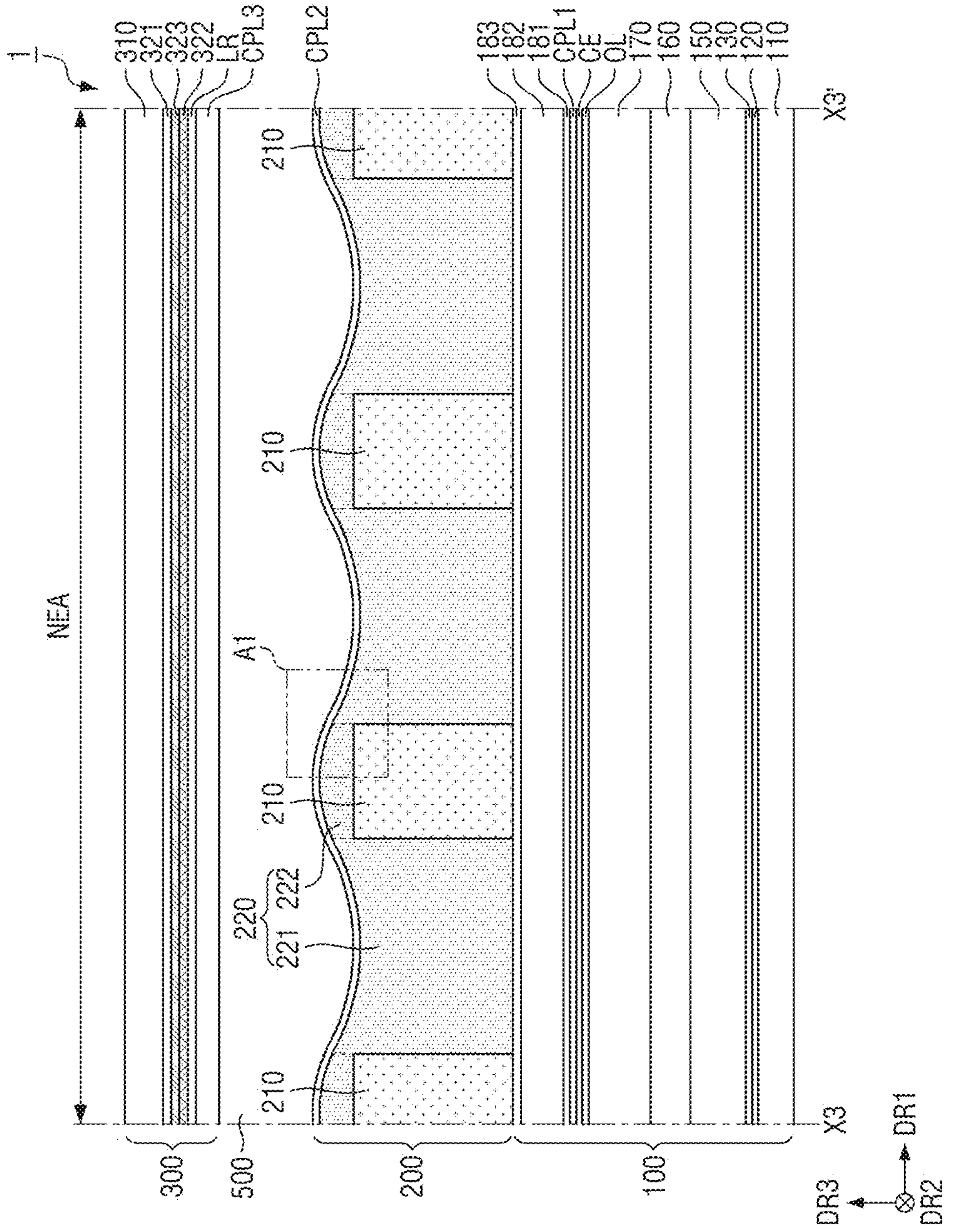
FIG. 7 is a cross-sectional view schematically taken along the line X3-X3' of FIG. 5.
Figure 8:
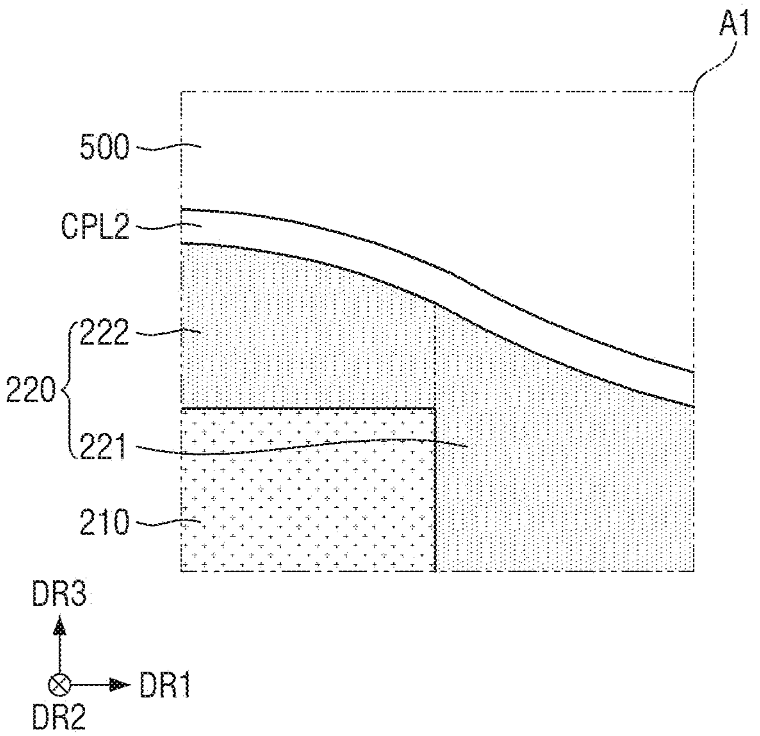
FIG. 8 is an enlarged view of the area A1 in FIG. 7.
Figure 9:
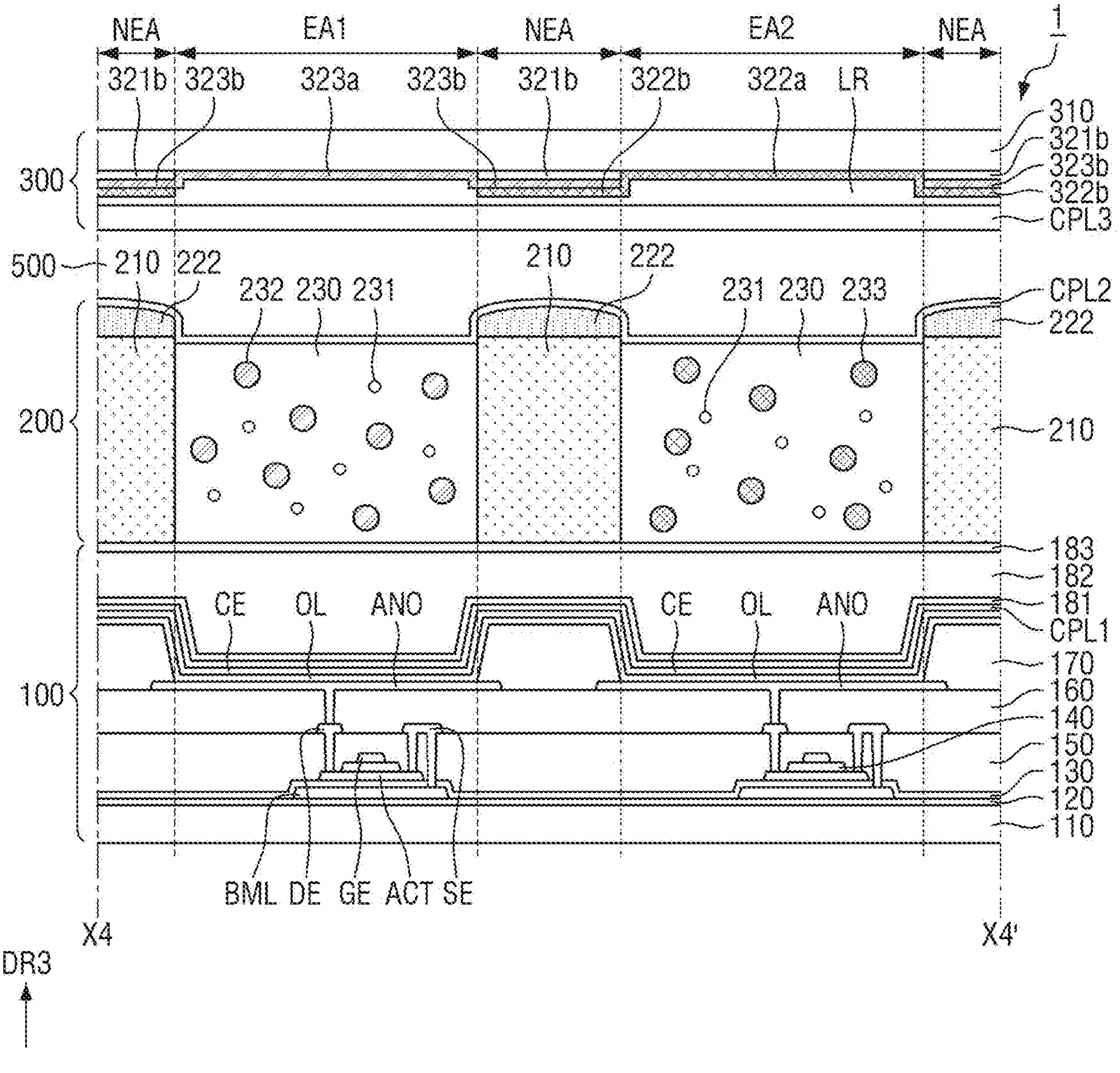
FIG. 9 is a cross-sectional view schematically taken along the line X4-X4' of FIG. 5.
Figure 10:
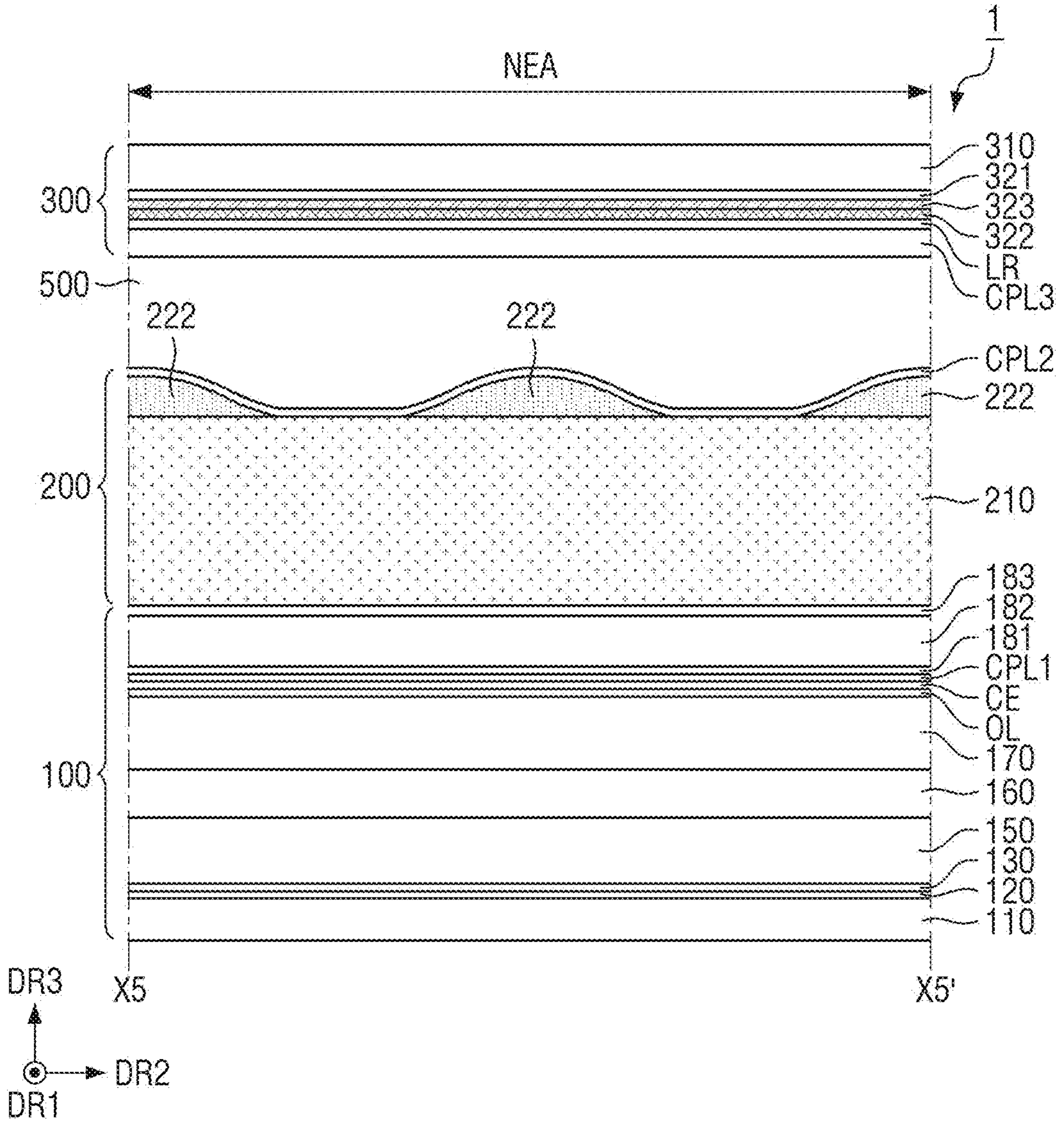
FIG. 10 is a cross-sectional view schematically taken along the line X5-X5' of FIG. 5.

FIG. 6 is a cross-sectional view schematically taken along the line X2-X2' of FIG. 5. FIG. 7 is a cross-sectional view schematically taken along the line X3-X3' of FIG. 5. FIG. 8 is an enlarged view of the area A1 in FIG. 7. FIG. 9 is a cross-sectional view schematically taken along the line X4-X4' of FIG. 5. FIG. 10 is a cross-sectional view schematically taken along the line X5-X5' of FIG. 5.

Referring to FIG. 6, the display device 1 may include the light emitting portion 100, the light transmitting portion 200 disposed on the light emitting portion 100, the color filter portion 300 disposed on the light transmitting portion 200 and facing the light transmitting portion 200, and the filling portion 500 interposed between the light transmitting portion 200 and the color filter portion 300. Hereinafter, the light emitting portion 100, the light transmitting portion 200, the color filter portion 300, and the filling portion 500 will be described in more detail in that order.

The light emitting portion 100 may be a structure in which a first substrate 110, a buffer layer 120, a lower metal layer BML, a first insulating layer 130, a semiconductor layer ACT, a gate electrode GE, a gate insulating layer 140, a second insulating layer 150, a source/drain electrode SE/DE, a third insulating layer 160, a light emitting element, the pixel defining layer 170, a first capping layer CPL1, and a thin film encapsulation layer are sequentially stacked on one side in the third direction DR3.

The first substrate 110 of the light emitting portion 100 may serve as a base (e.g., a base substrate) of the light emitting portion 100. The first substrate 110 may include (e.g., may be made of) a light transmitting material. The first substrate 110 may be a glass substrate or a plastic substrate. When the first substrate 110 is a plastic substrate, the first substrate 110 may have a flexibility. In an embodiment, when the first substrate 110 is a plastic substrate, the first substrate 110 may include polyimide, but the present disclosure is not limited thereto.

The buffer layer 120 of the light emitting portion 100 may be disposed on the first substrate 110. The buffer layer 120 may serve to block foreign matters and/or moisture penetrating through the first substrate 110 to an element disposed on the buffer layer 120.

In an embodiment, the buffer layer 120 may include an inorganic material, such as $SiO_2$, $SiN_x$, or $SiO_xN_y$, and may be formed as a single layer or multilayers, but the present disclosure is not limited thereto.

The lower metal layer BML of the light emitting portion 100 may be disposed on the buffer layer 120. The lower metal layer BML may block external light and/or light emitted from a light emitting element described in more detail below from being introduced into the semiconductor layer ACT. Accordingly, an occurrence of a leakage current due to light in the thin film transistor described in more detail below may be prevented or reduced.

The lower metal layer BML may include (e.g., may be made of) a material that blocks light and has a conductivity. In an embodiment, the lower metal layer BML may include a single material of a metal, such as silver (Ag), nickel (Ni), gold (Au), platinum (Pt), aluminum (Al), copper (Cu), molybdenum (Mo), titanium (Ti), neodium (Nd), or a suitable alloy thereof. In an embodiment, the lower metal layer BML may have a single-layer or multilayered structure. For example, when the lower metal layer BML has a multilayered structure, the lower metal layer BML may include a stacked structure of titanium (Ti)/copper (Cu)/indium tin oxide (ITO), or a stacked structure of titanium (Ti)/copper (Cu)/aluminum oxide ($Al_2O_3$), but the present disclosure is not limited thereto.

In an embodiment, a plurality of lower metal layers BML may be provided to correspond to the semiconductor layers ACT, respectively, and may overlap with the semiconductor layers ACT. In an embodiment, the width of the lower metal layer BML may be greater than the width of the semiconductor layer ACT.

In an embodiment, the lower metal layer BML may be a part of a data line, a power supply line, a wire that electrically connects a thin film transistor and the thin film transistor (e.g., GE, ACT, DE, and SE in FIG. 6) to each other, and/or the like. In an embodiment, the lower metal layer BML may include (e.g., may be made of) a suitable material having a lower resistance than the resistance of the source electrode SE and the drain electrode DE.

The first insulating layer 130 of the light emitting portion 100 may be disposed on the lower metal layer BML. The first insulating layer 130 may serve to electrically insulate the lower metal layer BML from the semiconductor layer ACT. The first insulating layer 130 may cover the lower metal layer BML.

In an embodiment, the first insulating layer 130 may include an inorganic material, such as $SiO_2$, $SiN_x$, $SiO_xN_y$, $Al_2O_3$, $TiO_2$, $Ta_2O$, $HfO_2$, or $ZrO_2$, but the present disclosure is not limited thereto.

The semiconductor layer ACT of the light emitting portion 100 may be disposed on the first insulating layer 130. The semiconductor layer ACT may be disposed to correspond to each of the first emission area EA1, the second emission area EA2, and the third emission area EA3 in the display area DA of the light emitting portion 100. Further, the semiconductor layer ACT may be disposed to overlap with the lower metal layer BML, thereby suppressing a generation of a photocurrent in the semiconductor layer ACT.

The semiconductor layer ACT may include an oxide semiconductor. In an embodiment, the semiconductor layer ACT may be formed of a zinc (Zn) oxide-based material (e.g., Zn oxide, In—Zn oxide, or Ga—In—Zn oxide), and may be an In—Ga—Zn—O (IGZO) semiconductor containing a metal, such as indium (In) or gallium (Ga), but the present disclosure is not limited thereto. For example, the semiconductor layer ACT may include amorphous silicon or polysilicon.

The gate electrode GE of the light emitting portion 100 may be disposed on the semiconductor layer ACT. The gate electrode GE may be disposed to overlap with the semiconductor layer ACT in the display area DA. In an embodiment, the width of the gate electrode GE may be narrower than the width of the semiconductor layer ACT, but the present disclosure is not limited thereto.

In an embodiment, the gate electrode GE may include one or more suitable materials from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu), in consideration of an adhesion with an adjacent layer, a surface flatness of a stacked layer, a processability, and/or the like. The gate electrode GE may be formed as a single layer or multiple layers, but the present disclosure is not limited thereto.

The gate insulating layer 140 of the light emitting portion 100 may be disposed between the semiconductor layer ACT and the gate electrode GE. The gate insulating layer 140 may insulate the semiconductor layer ACT from the gate electrode GE. In an embodiment, the gate insulating layer 140 may not be a single layer disposed on one side of the first substrate 110 in the third direction DR3, but may be constituted with a partially patterned shapes. A width of the gate insulating layer 140 may be narrower than the width of the semiconductor layer ACT, and may be wider than the width of the gate electrode GE, but the present disclosure is not limited thereto.

In an embodiment, the gate insulating layer 140 may include an inorganic material. For example, the gate insulating layer 140 may include at least one of the inorganic materials described above for the first insulating layer 130.

The second insulating layer 150 of the light emitting portion 100 may be disposed on the gate insulating layer 140 to cover the semiconductor layer ACT and the gate electrode GE. In an embodiment, the second insulating layer 150 may function as a planarization layer for providing a flat or substantially flat surface.

The second insulating layer 150 may include an organic material. In an embodiment, the second insulating layer 150 may include at least one of photo acryl (PAC), polystylene, polymethylmethacrylate (PMMA), polyacrylonitrile (PAN), polyamide, polyimide, polyarylether, heterocyclic polymer, parylene, a fluorine-based polymer, an epoxy resin, a benzocyclobutene-based resin, a siloxane-based resin, or a silane resin, but the present disclosure is not limited thereto.

The source electrode SE and the drain electrode DE of the light emitting portion 100 may be spaced apart from each other, and disposed on the second insulating layer 150. The source electrode SE and the drain electrode DE may be connected to the semiconductor layer ACT through contact holes penetrating the second insulating layer 150, respectively. In an embodiment, the source electrode SE may penetrate the first insulating layer 130 as well as the second insulating layer 150, and may be connected to the lower metal layer BML. When the lower metal layer BML is a part of a wire that transmits a signal, a voltage, and/or the like, the source electrode SE may be connected to and electrically coupled to the lower metal layer BML to receive a transmitted voltage and the like provided to the wire. As another example, when the lower metal layer BML is a floating pattern rather than a separate wire, a voltage and the like provided to the source electrode SE may be transmitted to the lower metal layer BML and the like.

The source electrode SE and the drain electrode DE may include aluminum (Al), copper (Cu), titanium (Ti), and/or the like, and may be formed as a multilayered structure or a single layer structure. In an embodiment, the source electrode SE and the drain electrode DE may have a multilayered structure of Ti/Al/Ti, but the present disclosure is not limited thereto.

The semiconductor layer ACT, the gate electrode GE, the source electrode SE, and the drain electrode DE may form a thin film transistor that is a switching element. In an embodiment, a corresponding thin film transistor may be located for each of the first emission area EA1, the second emission area EA2, and the third emission area EA3. In an embodiment, a part of the thin film transistor may be located in the non-emission area NEA.

The third insulating layer 160 of the light emitting portion 100 may be disposed on the second insulating layer 150 to cover the thin film transistor. In an embodiment, the third insulating layer 160 may be a planarization layer.

The third insulating layer 160 may include (e.g., may be made of) an organic material. In an embodiment, the third insulating layer 160 may include an acrylic resin, an epoxy resin, an imide resin, an ester resin, and/or the like, or may include a photosensitive organic material, but the present disclosure is not limited thereto.

A plurality of anode electrodes ANO may be located on the third insulating layer 160 in the display area DA of the light emitting portion 100. The anode electrodes ANO may be spaced apart from each other.

The anode electrodes ANO may overlap with the first emission area EA1, the second emission area EA2, and the third emission area EA3, respectively, and may extend at least partially to the non-emission area NEA. The anode electrodes ANO may be connected to the drain electrodes DE of the thin film transistors.

In an embodiment, the anode electrode ANO may be a reflective electrode, in which case the anode electrode ANO may be a metal layer containing a suitable metal, such as Ag, Mg, Al, Pt, Pd, Au, Ni, Nd, Ir, or Cr. In another embodiment, the anode electrode ANO may further include a metal oxide layer stacked on the metal layer. In an embodiment, the anode electrode ANO may have a multilayered structure, for example, such as a two-layered structure of ITO/Ag, Ag/ITO, ITO/Mg, and/or ITO/MgF, or a three-layered structure of ITO/Ag/ITO.

The pixel defining layer 170 of the light emitting portion 100 may be disposed on the anode electrode ANO. The pixel defining layer 170 may define the first emission area EA1, the second emission area EA2, and the third emission area EA3 as openings exposing the anode electrodes ANO, respectively. The pixel defining layer 170 may overlap with edges of the anode electrodes ANO.

The pixel defining layer 170 may also overlap with the bank pattern 210 and 220, which will be described in more detail below, in the third direction DR3.

In an embodiment, the pixel defining layer 170 may include an organic insulating material selected from the group consisting of an acrylic resin, an epoxy resin, a phenolic resin, a polyamide resin, a polyimide resin, an unsaturated polyester resin, a polyphenylene resin, a polyphenylenesulfide resin, and benzocyclobutene (BCB), but the present disclosure is not limited thereto.

A light emitting layer OL of the light emitting portion 100 may be disposed on the anode electrode ANO. In an embodiment, the light emitting layer OL may be formed on the entire or substantially the entire surface of the display panel to extend over the plurality of emission areas and the non-emission area NEA. In an embodiment, the light emitting layer OL may be located in (e.g., only in) the display area DA, but the present disclosure is not limited thereto. For example, in other embodiments, a part of the light emitting layer OL may be further disposed in the non-display area NDA.

The cathode electrode CE of the light emitting portion 100 may be disposed on the light emitting layer OL. In an embodiment, the cathode electrode CE may be disposed on the light emitting layer OL, and may be formed over the plurality of emission areas EA1, EA2, and EA3 and the non-emission area NEA. In other words, the cathode electrode CE may completely cover the light emitting layer OL.

The cathode electrode CE may have a semi-transmissive or transmissive property. When the cathode electrode CE has a thickness of tens to hundreds of angstroms, the cathode electrode CE may have a semi-transmissive property. In an embodiment, when the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti, or a suitable compound or mixture thereof, such as a mixture of Ag and Mg. The cathode electrode CE may include a transparent conductive oxide to have a transmissive property. In an embodiment, when the cathode electrode CE has the transmissive property, the cathode electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

The anode electrodes ANO, the light emitting layer OL, and the cathode electrode CE may form the light emitting elements. For example, the anode electrode ANO, the light emitting layer OL, and the cathode electrode CE overlapping with the first emission area EA1 may form a first light emitting element, the anode electrode ANO, the light emitting layer OL, and the cathode electrode CE overlapping with the second emission area EA2 may form a second light emitting element, and the anode electrode ANO, the light emitting layer OL, and the cathode electrode CE overlapping with the third emission area EA3 may form a third light emitting element. Each of the first light emitting element, the second light emitting element, and the third light emitting element may emit an emission light.

The emission light emitted from the light emitting layer OL may be mixed light in which a first component LE1 and a second component LE2 are mixed with each other. Each of the first component LE1 and the second component LE2 in the emission light may have a peak wavelength of 440 nm or more and less than 480 nm. In other words, the emission light may be blue light.

In an embodiment, the emission light emitted from the light emitting layer OL may be blue light, and may include a long wavelength component and a short wavelength component. Therefore, the light emitting layer OL may emit blue light having an emission peak in a broader wavelength range as the emission light. Accordingly, color visibility may be improved at a side viewing angle when compared to a comparative light emitting element that emits blue light having a sharp emission peak.

In an embodiment, the light emitting layer OL may not include a red light emitting material layer, and thus, may not emit red light. In other words, the emission light may not include a light component having a peak wavelength of 610 nm to about 650 nm, and the emission light may include (e.g., may only include) a light component having a peak wavelength of 440 nm to 550 nm.

Referring again to FIG. 6, a first capping layer CPL1 may be disposed on the cathode electrode CE. The first capping layer CPL1 may serve to improve viewing angle characteristics and increase external luminous efficiency. The first capping layer CPL1 may be commonly disposed in the first emission area EA1, the second emission area EA2, the third emission area EA3, and the non-emission area NEA. The first capping layer CPL1 may completely cover the cathode electrode CE.

The first capping layer CPL1 may include at least one of an inorganic material having a light transmissive property or an organic material. In other words, the first capping layer CPL1 may be formed of an inorganic layer, an organic layer, or an organic layer including inorganic particles. In an embodiment, the first capping layer CPL1 may include a triamine derivative, a carbazole biphenyl derivative, an arylenediamine derivative, an aluminum chelate compound ($Alq_3$), or the like, but the present disclosure is not limited thereto.

A thin film encapsulation layer 180 of the light emitting portion 100 may be disposed on the first capping layer CPL1. The thin film encapsulation layer 180 may serve to protect the components located under the thin film encapsulation layer 180 from external foreign matter, such as moisture. The thin film encapsulation layer 180 may be commonly disposed in the first emission area EA1, the second emission area EA2, the third emission area EA3, and the non-emission area NEA. The thin film encapsulation layer 180 may completely cover the first capping layer CPL1.

The thin film encapsulation layer 180 may include a lower inorganic encapsulation layer 181, an organic encapsulation layer 182, and an upper inorganic encapsulation layer 183 sequentially stacked on the first capping layer CPL1.

The lower inorganic encapsulation layer 181 may completely cover the first capping layer CPL1 in the display area DA to cover the first light emitting element, the second light emitting element, and the third light emitting element. The organic encapsulation layer 182 may be disposed on the lower inorganic encapsulation layer 181 to completely cover the lower inorganic encapsulation layer 181. The upper inorganic encapsulation layer 183 may be disposed on the organic encapsulation layer 182 to completely cover the organic encapsulation layer 182.

In an embodiment, each of the lower inorganic encapsulation layer 181 and the upper inorganic encapsulation layer 183 may include (e.g., may be made of) silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like, but the present disclosure is not limited thereto.

In an embodiment, the organic encapsulation layer 182 may be formed of an acrylic resin, a methacrylic resin, polyisoprene, a vinyl resin, an epoxy resin, a urethane resin, a cellulose resin, a perylene resin, or the like, but the present disclosure is not limited thereto.

Hereinafter, the light transmitting portion 200 will be described in more detail with reference to FIGS. 5 to 10.

Referring to FIGS. 6 to 10, the light transmitting portion 200 may be disposed on the upper inorganic encapsulation layer 183, and may include a light transmitting member and a bank pattern. In an embodiment, after the light emitting portion 100 is formed on the first substrate 110, the light transmitting portion 200 may be formed thereon.

The bank pattern may be disposed to form a space for accommodating the light transmitting member. A plurality of spaces for accommodating the light transmitting member may be formed, and may be spaced apart from each other. In other words, the bank pattern may serve to partition a space in which a light transmitting member is disposed. The bank pattern may surround (e.g., around a periphery of) the light transmitting member in a plan view. The bank pattern may be disposed to overlap with the non-emission area NEA. The bank pattern may be disposed to overlap with the pixel defining layer 170 of the light emitting portion 100.

Referring to FIGS. 7 and 10, the bank pattern may be formed by sequentially stacking the first bank 210 and the second bank 220 in the third direction DR3 on the upper inorganic encapsulation layer 183. A protrusion portion 222 of the second bank 220 may be disposed in an area overlapping with the first bank 210, and a main portion 221 of the second bank 220 may be disposed in an area not overlapping with the first bank 210. Unless the overlapping direction is explicitly indicated in the present specification, multiple areas or configurations are regarded as being overlapped in the thickness direction of the substrate, or in other words, the third direction DR3.

Referring to FIGS. 4 and 5, the first bank 210 may include the plurality of sub-banks spaced apart from each other. The sub-banks of the first bank 210 may be aligned with one another along the first direction DR1 while being spaced apart from each other. In addition, each of the sub-banks of the first bank 210 may extend in the second direction DR2.

Because the second bank 220 is formed after the first bank 210 is formed, the second bank 220 may be formed on (e.g., above) the first bank 210. The photoresist forming the second bank 220 may have a property such that it flows downwards along the direction of gravity. The photoresist applied on the entire surface of the substrate has a flat or substantially flat top surface in a region overlapping with the first bank 210 and a region not overlapping with the first bank 210. As the solvent of the photoresist evaporates in a pre-bake process, the photoresist flows downwards due to its followability. Afterwards, if a post-bake process is carried out, as shown in FIG. 7, the cross section of the photoresist may have a recessed shape in a region not overlapping with the first bank 210, while having a protruding shape in a region overlapping with the first bank 210.

Because the bank pattern includes the protrusion portion 222 on the surface thereof, it may be capable of supporting the mask during the manufacturing process for the display device 1. When the second bank 220 is patterned on the first bank 210, the protrusion portion 222 having a narrower area may be obtained. By reducing the non-emission area, it may be possible to increase the luminance of the display device. In addition, inkjet margins may be increased during the process. In some embodiments, a process of forming an additional spacer may be omitted to simplify the process.

Referring to FIGS. 4 and 5, the second bank 220 may include the plurality of sub-banks spaced apart from each other. Each of the sub-banks of the second bank 220 may be aligned with one another along the second direction DR2 while being spaced apart from each other. In addition, each of the sub-banks of the second bank 220 may extend in the first direction DR1.

The second bank 220 may include a region that extends over the first bank 210 without being cut off. FIG. 7 illustrates a cross section taken along the first direction DR1, which is the extension direction of the second bank 220. As shown in FIG. 7, the protrusion portion 222 of the second bank 220 is connected to the main portion 221 of the adjacent second bank 220. Referring to FIG. 8, the protrusion portion 222 may share its side surface with the adjacent main portion 221. The protrusion portion 222 is connected to the main portion 221 to stably support the mask. In a plan view, the protrusion portion 222 of the second bank 220 is connected to the adjacent main portion 221 that goes over the first bank 210. Depending on the direction in which the display device 1 is cut, however, there may be a cross section in which the protrusion portion 222 of the second bank 220 is not connected to the main portion 221 (e.g., see FIGS. 9 and 10).

The main portion 221 of the second bank 220 may not overlap with the first bank 210 in the third direction DR3. The main portion 221 of the second bank 220 may be disposed at (e.g., in or on) the same layer as that of the first bank 210. The side surface of the main portion 221 of the second bank 220 may face the side surface of the first bank 210 or the side surface of the light transmitting member. The side surface of the first bank 210 may face the side surface of the light transmitting member.

A minimum height of the main portion 221 of the second bank 220 may be less than the height of the first bank 210. The height of the first bank 210 and the height of the second bank 220 may be lengths measured in a direction perpendicular to or substantially perpendicular to the plane parallel to or substantially parallel to the first substrate 110. In FIG. 7, the bottom surface of the first bank 210 and the bottom surface of the main portion 221 of the second bank 220 are aligned with the upper inorganic encapsulation layer 183, which are at (e.g., in or on) the same plane as each other, and the lengths measured in the third direction DR3 from the upper inorganic encapsulation layer 183 may be the height of the first bank 210 and the height of the second bank 220, respectively. The minimum height of the main portion 221 of the second bank 220 may be less than the maximum height of the protrusion portion 222 of the second bank 220. The maximum height of the main portion 221 of the second bank 220 may be equal to or less than the minimum height of the protrusion portion 222 of the second bank 220. The height of the protrusion portion 222 of the second bank 220 may be a length measured in a direction perpendicular to or substantially perpendicular to the same plane as that of the bottom surface of the main portion 221.

Referring to FIG. 7, two sub-banks of the first bank 210 may be spaced apart from each other with the main portion 221 of the second bank 220 interposed therebetween. The main portion 221 of the second bank 220 may be connected to the protrusion portion 222 overlapping with the first bank 210 disposed on one side of the second bank 220 in the first direction DR1, and may be connected to the protrusion portion 222 overlapping with the first bank 210 disposed on the other side of the second bank 220 in the first direction DR1. In other words, each main portion 221 of the second bank 220 illustrated in FIG. 7 may be connected to the corresponding protrusion portions 222 adjacent thereto on the left and right sides thereof.

In an embodiment, the bank pattern may include an organic material having a photocurability, or an organic material having a photocurability and including a light blocking material, but the present disclosure is not limited thereto. The first bank 210 and the second bank 220 may include (e.g., may contain) the same material as each other or different materials from each other. Although the first bank 210 and the second bank 220 may contain the same material as each other, the first bank 210 may undergo more heat treatment than the second bank 220, so that their physical properties and/or component ratios may be different from each other.

The light transmitting member of the light transmitting portion 200 may be disposed on the upper inorganic encapsulation layer 183 exposed by the separation space between the banks of the bank pattern. The light transmitting member may be surrounded (e.g., around a periphery thereof) by the first bank 210 and the second bank 220 of the bank pattern. The light transmitting member may include a first wavelength conversion layer WCL1 overlapping with the first emission area EA1, a second wavelength conversion layer WCL2 overlapping with the second emission area EA2, and a light transmitting layer TPL overlapping with the third emission area EA3. The light transmitting layer TPL, the first wavelength conversion layer WCL1, and the second wavelength conversion layer WCL2 may be referred to as a wavelength conversion layer or a wavelength conversion material layer.

The first wavelength conversion layer WCL1 may be disposed in a space partitioned by the bank pattern to overlap with the first emission area EA1. The first wavelength conversion layer WCL1 may be in direct contact with one or more of the first bank 210 and/or the second bank 220 of the bank pattern.

The first wavelength conversion layer WCL1 may be a wavelength conversion pattern that converts or shifts the peak wavelength of incident light into light of another specific peak wavelength to emit the light. In more detail, the emission light provided from the first light emitting element may be blue light as described above, and may be converted into red light while passing through the first wavelength conversion layer WCL1 and a third filtering pattern area 323*a* of a third color filter 323 to be emitted to the outside of the display device 1. In other words, the first emission light emitted to the outside through the first emission area EA1 may be red light.

The first wavelength conversion layer WCL1 may include a base resin 230, a light scatterer 231 dispersedly disposed within the base resin 230, and a first wavelength shifter 232 dispersedly disposed within the base resin 230.

In an embodiment, the base resin 230 may include an organic material, such as an epoxy resin, an acrylic resin, a silicone resin, a cardo resin, or an imide resin, but the present disclosure is not limited thereto.

The light scatterer 231 may have a refractive index different from that of the base resin 230, and may form an optical interface with the base resin 230. The light scatterer 231 may be a light scattering particle. The light scatterer 231 may scatter light in a random direction irrespective of the incident direction of the incident light, without converting or substantially converting the wavelength of the light passing through the first emission area EA1.

The light scatterer 231 may be a suitable material that scatters at least a part of transmitted light, and may include metal oxide particles or organic particles. In an embodiment, the light scatterer 231 may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like as the metal oxide, and may include an acrylic resin, a urethane-based resin, or the like as the organic particles, but the present disclosure is not limited thereto.

The first wavelength shifter 232 may convert or shift the peak wavelength of the incident light to another specific peak wavelength. The first wavelength shifter 232 may convert the emission light, which is the blue light provided by the first light emitting element, into red light having a single peak wavelength in a range of about 610 nm to 650 nm, and emit the red light. The first wavelength shifter 232 may convert not only the blue light, but also green light into the red light, and emit the red light.

In an embodiment, the first wavelength shifter 232 may be a quantum dot, a quantum rod, or a fluorescent substance, but the present disclosure is not limited thereto. Hereinafter, for convenience, the first wavelength shifter 232 may be mainly described in more detail in the context of a quantum dot. The quantum dot may be a particulate material that emits light of a desired color (e.g., a specific or predetermined color) when an electron transitions from a conduction band to a valence band. The quantum dot may be a semiconductor nanocrystal material. The quantum dot may have a band gap (e.g., a specific or predetermined band gap) according to its composition and size. Thus, the quantum dot may absorb light, and then emit light having an intrinsic wavelength. Examples of a semiconductor nanocrystal of the quantum dots may include a group IV nanocrystal, a group II-VI compound nanocrystal, a group III-V compound nanocrystal, a group IV-VI nanocrystal, a suitable combination thereof, or the like.

The group II-VI compound may be selected from the group consisting of binary compounds, ternary compounds, and quaternary compounds. The binary compounds may be selected from the group consisting of CdSe, CdTe, ZnS, ZnSe, ZnTe, ZnO, HgS, HgSe, HgTe, MgSe, MgS, and suitable mixtures thereof. The ternary compounds may be selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and suitable mixtures thereof. The quaternary compounds may be selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and suitable mixtures thereof.

The group III-V compound may be selected from the group consisting of binary compounds, ternary compounds, and quaternary compounds. The binary compounds may be selected from the group consisting of GaN, GaP, GaAs, GaSb, AlN, AlP, AlAs, AlSb, InN, InP, InAs, InSb, and suitable mixtures thereof. The ternary compounds may be selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and suitable mixtures thereof. The quaternary compounds may be selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and suitable mixtures thereof.

The group IV-VI compound may be selected from the group consisting of binary compounds, ternary compounds, and quaternary compounds. The binary compounds may be selected from the group consisting of SnS, SnSe, SnTe, PbS, PbSe, PbTe, and suitable mixtures thereof. The ternary compounds may be selected from the group consisting of SnSeS, SnSeTe, SnSTe, PbSeS, PbSeTe, PbSTe, SnPbS, SnPbSe, SnPbTe, and suitable mixtures thereof. The quaternary compounds may be selected from the group consisting of SnPbSSe, SnPbSeTe, SnPbSTe, and suitable mixtures thereof. The group IV element may be selected from the group consisting of Si, Ge, and suitable mixtures thereof. The group IV compound may be a binary compound selected from the group consisting of SiC, SiGe, and suitable mixtures thereof.

In this case, the binary compound, the tertiary compound, or the quaternary compound may exist in particles at a uniform or substantially uniform concentration, or may exist in the same particle divided into states where concentration distributions are partially different. Further, the particles may have a core/shell structure in which one quantum dot surrounds (e.g., around a periphery of) another quantum dot. An interface between the core and the shell may have a concentration gradient in which the concentration of elements present in the shell decreases toward the center.

In an embodiment, the quantum dot may have a core-shell structure including a core including the nanocrystal described above, and a shell surrounding (e.g., around a periphery of) the core. The shell of the quantum dot may serve as a protective layer for maintaining or substantially maintaining semiconductor characteristics by preventing or substantially preventing chemical denaturation of the core, and/or as a charging layer for giving electrophoretic characteristics to the quantum dot. The shell may be a single layer or multilayers. An interface between the core and the shell may have a concentration gradient in which the concentration of elements present in the shell decreases toward the center. Examples of the shell of the quantum dot may include a metal oxide or a non-metal oxide, a semiconductor compound, and/or a suitable combination thereof.

For example, the metal oxide or the non-metal oxide may be a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a tertiary compound, such as $MgAl_2O_4$, $CoFe_2O_4$, $NiFe_2O_4$, and/or $CoMn_2O_4$, but the present disclosure is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The light emitted from the first wavelength shifter 232 may have a full width of half maximum (FWHM) of the emission wavelength spectrum, which is about 45 nm or less, about 40 nm or less, or about 30 nm or less. Thus, the purity and reproducibility of colors displayed by the display device 1 may be further improved. In addition, the light emitted from the first wavelength shifter 232 may be emitted in various directions, regardless of the incident direction of the incident light. Accordingly, side visibility of the third color displayed in the first emission area EA1 may be improved.

Some of the emission light provided from the first light emitting element may pass through the first wavelength conversion layer WCL1, and be emitted without being converted into red light by the first wavelength shifter 232. Among the emission light, a component having a wavelength that is not converted by the first wavelength conversion layer WCL1 and is incident on the third filtering pattern area 323*a* of the third color filter 323 may be blocked by the third filtering pattern area 323*a*. On the other hand, among the emission light, red light converted by the first wavelength conversion layer WCL1 passes through the third filtering pattern area 323*a* and is emitted to the outside. In other words, the first emission light emitted to the outside of the display device 1 through the first emission area EA1 may be red light.

The second wavelength conversion layer WCL2 may be disposed in a space partitioned by the bank pattern, and may overlap with the second emission area EA2 in the third direction DR3. The second wavelength conversion layer WCL2 may be in direct contact with one or more of the first bank 210 and/or the second bank 220 of the bank pattern.

The second wavelength conversion layer WCL2 may be a wavelength conversion pattern that converts or shifts the peak wavelength of incident light into light of another specific peak wavelength to emit the light. In more detail, as described above, the emission light provided from the second light emitting element may be blue light, and may pass through the second wavelength conversion layer WCL2 and the second filtering pattern area 322*a* of the second color filter 322, and be converted into green light to be emitted to the outside of the display device 1. In other words, the second emission light emitted to the outside through the second emission area EA2 may be green light.

The second wavelength conversion layer WCL2 may include a base resin 230, a light scatterer 231 dispersedly disposed within the base resin 230, and a second wavelength shifter 233 dispersedly disposed within the base resin 230.

The second wavelength shifter 233 may convert or shift the peak wavelength of incident light to another specific peak wavelength. The second wavelength shifter 233 may convert the emission light, which is the blue light provided by the second light emitting element, into green light having a single peak wavelength in a range of 510 nm to 550 nm, and emit the green light. In an embodiment, the second wavelength shifter 233 may be a quantum dot, a quantum rod, or a fluorescent substance, but the present disclosure is not limited thereto. When the second wavelength shifter 233 is a quantum dot, it may have the same or substantially the same configuration as that of the first wavelength shifter 232 described above as a quantum dot, and thus, redundant description may not be repeated.

Some of the emission light provided from the second light emitting element may pass through the second wavelength conversion layer WCL2, and be emitted without being converted into green light by the second wavelength shifter 233. Among the emission light, a component having a wavelength that is not converted by the second wavelength conversion layer WCL2 and is incident on the second filtering pattern area 322*a* of the second color filter 322 may be blocked by the second filtering pattern area 322*a*. On the other hand, among the emission light, green light converted by the second wavelength conversion layer WCL2 passes through the second filtering pattern area 322*a*, and is emitted to the outside. In other words, the second emission light emitted to the outside of the display device 1 through the second emission area EA2 may be green light.

The light transmitting layer TPL may be disposed in the space partitioned by the bank pattern, and may overlap with the third emission area EA3 and the first emission area EA1 in the third direction DR3. The light transmitting layer TPL may be in direct contact with one or more of the first bank 210 and/or the second bank 220 of the bank pattern.

The light transmitting layer TPL may have a light transmission pattern that transmits incident light. In more detail, as described above, the emission light provided from the third light emitting element may be blue light, and may pass through the light transmitting layer TPL and the first filtering pattern area 321*a* of the first color filter 321 to be emitted to the outside of the display device 1. In other words, the third emission light emitted to the outside through the third emission area EA3 may be blue light.

The light transmitting layer TPL may include the base resin 230 and the light scatterer 231. The base resin 230 may include (e.g., may be made of) an organic material having a high light transmittance. When necessary or desired, the light scatterer 231 may be omitted.

In an embodiment, the light transmitting layer TPL, the first wavelength conversion layer WCL1, and the second wavelength conversion layer WCL2 overlapping with the emission areas EA may be formed by an inkjet method. The light transmitting layer TPL, the first wavelength conversion layer WCL1, and the second wavelength conversion layer WCL2 may be formed to have a height lower than the top surface of the first bank 210 or the main portion 221 of the second bank 220. Accordingly, a part of the side surface of the first bank 210 or a part of the side surface of the main portion 221 of the second bank 220 may be exposed.

The second capping layer CPL2 of the light transmitting portion 200 may be disposed on the bank pattern 210 and 220 and the light transmitting member WCL1, WCL2, and TPL, and may serve to prevent or substantially prevent impurities, such as moisture or air, from the outside from permeating and damaging or contaminating the light transmitting layer TPL, the first wavelength conversion layer WCL1, and the second wavelength conversion layer WCL2. The second capping layer CPL2 may be in contact with the light transmitting layer TPL, the first wavelength conversion layer WCL1, the second wavelength conversion layer WCL2, the first bank 210, and the second bank 220. Referring to FIGS. 7 and 9, the second capping layer CPL2 may be in contact with the exposed side surface of the first bank 210, the main portion 221 and the protrusion portion 222 of the second bank, and the light transmitting members WCL1, WCL2, and TPL in the vicinity of the protrusion portion 222 of the second bank 220.

The second capping layer CPL2 may also be disposed on the second bank 220 having the protrusion portion 222 and a protruding shape and a recessed shape around the protrusion portion 222. Accordingly, in a cross section taken along the direction DR3 perpendicular to or substantially perpendicular to the first substrate 110 (e.g., see FIGS. 7 and 8), the second capping layer CPL2 may include a section that is curved along the protrusion portion 222 of the second bank 220.

The color filter portion 300 may have a structure in which a second substrate 310, a color filter layer 320, a low refractive layer LR, and a third capping layer CPL3 are sequentially stacked on the other side in the third direction DR3.

The second substrate 310 of the color filter portion 300 may serve as a base of the color filter portion 300. The second substrate 310 may include (e.g., may be made of) a light transmitting material. The second substrate 310 may be a glass substrate or a plastic substrate. When the second substrate 310 is a plastic substrate, the second substrate 310 may have a flexibility. In an embodiment, when the second substrate 310 is a plastic substrate, the second substrate 310 may include polyimide, but the present disclosure is not limited thereto. As described above, because the light emitting portion 100 and the color filter portion 300 face each other in the third direction DR3, the first substrate 110 of the light emitting portion 100 and the second substrate 310 of the color filter portion 300 may face each other in the third direction DR3.

The color filter layer 320 of the color filter portion 300 may be disposed on the other side of the second substrate 310 in the third direction DR3, or in other words, between the second substrate 310 and the light emitting portion 100. The color filter layer 320 may include a filtering pattern area and a light blocking pattern portion. The light blocking pattern portion may surround (e.g., around a periphery of) the filtering pattern area. The filtering pattern area of the color filter layer 320 may overlap with the emission areas EA1, EA2, and EA3, and the light blocking pattern portion may overlap with the non-emission area NEA.

As illustrated in FIG. 6, the color filter layer 320 may include the first color filter 321, the second color filter 322, and the third color filter 323. The first color filter 321 may absorb the light of the second color and the light of the third color, except for the light of the first color. The second color filter 322 may absorb the light of the first color and the light of the third color, except for the light of the second color. The third color filter 323 may absorb the light of the first color and the light of the second color, except for the light of the third color. In other words, the first color filter 321 may transmit the light of the first color, the second color filter 322 may transmit the light of the second color, and the third color filter 323 may transmit the light of the third color.

In an embodiment, the first color filter 321 may be a blue color filter, and may include a blue colorant. As used in the present disclosure, the colorant may include both a dye and a pigment. The first color filter 321 may include a base resin, and the blue colorant may be dispersed in the base resin. In an embodiment, the second color filter 322 may be a green color filter, and may include a green colorant. The second color filter 322 may include a base resin, and the green colorant may be dispersed in the base resin. In an embodiment, the third color filter 323 may be a red color filter, and may include a red colorant. The third color filter 323 may include a base resin, and the red colorant may be dispersed in the base resin.

The first color filter 321 may include a first filtering pattern area 321*a*, and a first blocking pattern area 321*b* surrounding (e.g., around a periphery of) the first filtering pattern area 321*a*. The second color filter 322 may include a second filtering pattern area 322*a*, and a second blocking pattern area 322*b* surrounding (e.g., around a periphery of) the second filtering pattern area 322*a*. The third color filter 323 may include a third filtering pattern area 323*a*, and a third blocking pattern area 323*b* surrounding (e.g., around a periphery of) the third filtering pattern area 323*a*. In more detail, the first filtering pattern area 321*a* of the first color filter 321 may overlap with the third emission area EA3, and the first blocking pattern area 321*b* of the first color filter 321 may surround (e.g., around a periphery of) the first filtering pattern area 321*a* without overlapping with the first emission area EA1 and the second emission area EA2, and may overlap with the non-emission area NEA. The second filtering pattern area 322*a* of the second color filter 322 may overlap with the second emission area EA2, and the second blocking pattern area 322*b* of the second color filter 322 may surround (e.g., around a periphery of) the second filtering pattern area 322*a* without overlapping with the first emission area EA1 and the third emission area EA3, and may overlap with the non-emission area NEA. The third filtering pattern area 323*a* of the third color filter 323 may overlap with the first emission area EA1, and the third blocking pattern area 323*b* of the third color filter 323 may surround (e.g., around a periphery of) the third filtering pattern area 323*a* without overlapping with the second emission area EA2 and the third emission area EA3, and may overlap with the non-emission area NEA. In other words, the filtering pattern area of the color filter layer 320 may include the first filtering pattern area 321*a* of the first color filter 321, the second filtering pattern area 322*a* of the second color filter 322, and the third filtering pattern area 323*a* of the third color filter 323, and the non-emission area NEA may have a structure in which the first blocking pattern area 321*b* of the first color filter 321, the second blocking pattern area 322*b* of the second color filter 322, and the third blocking pattern area 323*b* of the third color filter 323 are stacked to block light.

The first filtering pattern area 321*a* of the first color filter 321 may function as a blocking filter that blocks red light and green light. In more detail, the first filtering pattern area

321*a* may selectively transmit first light (e.g., blue light), and block or absorb second light (e.g., green light) and third light (e.g., red light).

The second filtering pattern area 322*a* of the second color filter 322 may function as a blocking filter that blocks blue light and red light. In more detail, the second filtering pattern area 322*a* may selectively transmit the second light (e.g., green light), and block or absorb the first light (e.g., blue light) and the third light (e.g., red light).

The third filtering pattern area 323*a* of the third color filter 323 may function as a blocking filter that blocks blue light and green light. In more detail, the third filtering pattern area 323*a* may selectively transmit the third light (e.g., red light), and block or absorb the first light (e.g., blue light) and the second light (e.g., green light).

In an embodiment, the light blocking pattern portion overlapping with the non-emission area NEA has a structure in which the first blocking pattern area 321*b*, the third blocking pattern area 323*b*, and the second blocking pattern area 322*b* are sequentially stacked on the other side of the third direction DR3, but the present disclosure is not limited thereto. For example, the light blocking pattern portion may not be constituted with the color filters 321, 322, and 323 described above, and may be formed as a separate organic light blocking material through coating and exposure processes of the organic light blocking material and the like. Hereinafter, for convenience, the light blocking pattern may be described in more detail as having a structure in which the first blocking pattern area 321*b*, the third blocking pattern area 323*b*, and the second blocking pattern area 322*b* are sequentially stacked on the other side of the third direction DR3. In this case, the light blocking pattern portion may absorb all of the light of the first color, the light of the second color, and the light of the third color.

A low refractive layer LR may be disposed on the color filter layer 320. The low refractive layer LR may have a lower refractive index than those of the light transmitting layer TPL, the first wavelength conversion layer WCL1, and the second wavelength conversion layer WCL2, and thus, may serve to recycle light by inducing a total reflection of light traveling from the light transmitting layer TPL, the first wavelength conversion layer WCL1, and the second wavelength conversion layer WCL2 to the low refractive layer LR.

Further, the low refractive layer LR may serve to flatten or substantially flatten a surface by compensating for stepped portions generated by the blocking pattern areas 321*b*, 322*b*, and 323*b* of the color filter layer 320. Accordingly, the third capping layer CPL3 disposed on the low refractive layer LR may be formed to be flat or substantially flat. The thickness of the low refractive layer LR in the non-emission area NEA and the thickness in the emission areas EA1, EA2, and EA3 may be different from each other, and the thickness of the low refractive layer LR in the non-emission area NEA may be smaller than the thickness in the emission areas EA1, EA2, and EA3.

The third capping layer CPL3 of the color filter portion 300 may be disposed on one surface of the low refractive layer LR to cover the low refractive layer LR. The third capping layer CPL3 may prevent or substantially prevent impurities, such as moisture or air from the outside, from permeating into the low refractive layer LR or the color filter layer 320 and damaging or contaminating the low refractive layer LR and the color filter layer 320.

The third capping layer CPL3 may contain an inorganic material. As will be described in more detail below, the third capping layer CPL3 may be formed as a single layer or multiple layers.

As described above, the filling portion 500 may be interposed between the light transmitting portion 200 and the color filter portion 300 to fill a gap between the light transmitting portion 200 and the color filter portion 300. In an embodiment, the filling portion 500 may be in direct contact with the second capping layer CPL2 of the light transmitting portion 200 and the third capping layer CPL3 of the color filter portion 300, but the present disclosure is not limited thereto.

In an embodiment, the filling portion 500 may include (e.g., may be made of) a suitable material having an extinction coefficient of zero or substantially zero. There is a correlation between a refractive index and an extinction coefficient, and as the refractive index decreases, the extinction coefficient also decreases. In addition, when the refractive index is 1.7 or less, the extinction coefficient may converge or substantially converge to zero.

Figure 11:
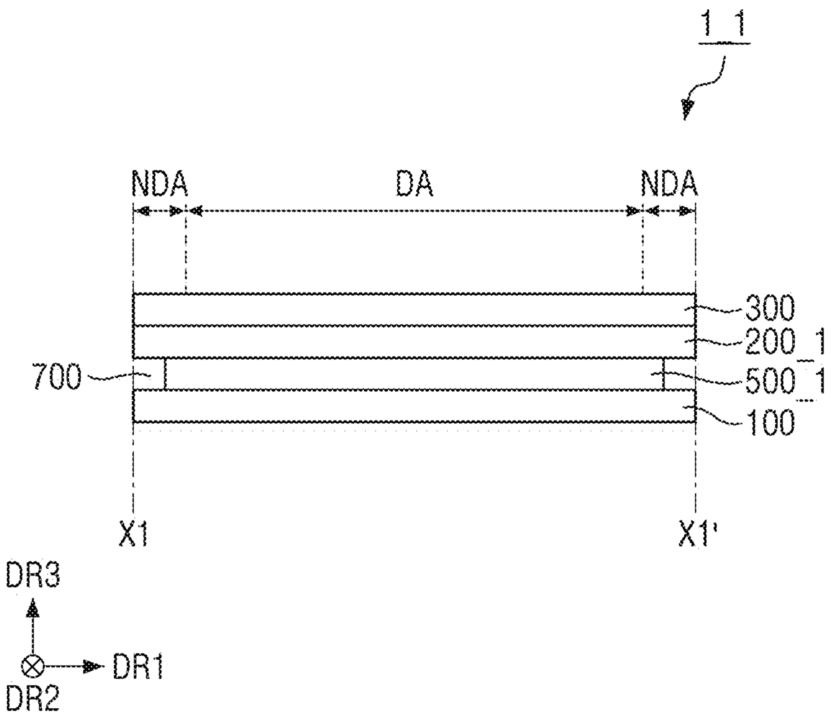
FIG. 11 is a cross-sectional view schematically taken along the line X1-X1' of FIG. 1 according to another embodiment.
Figure 12:
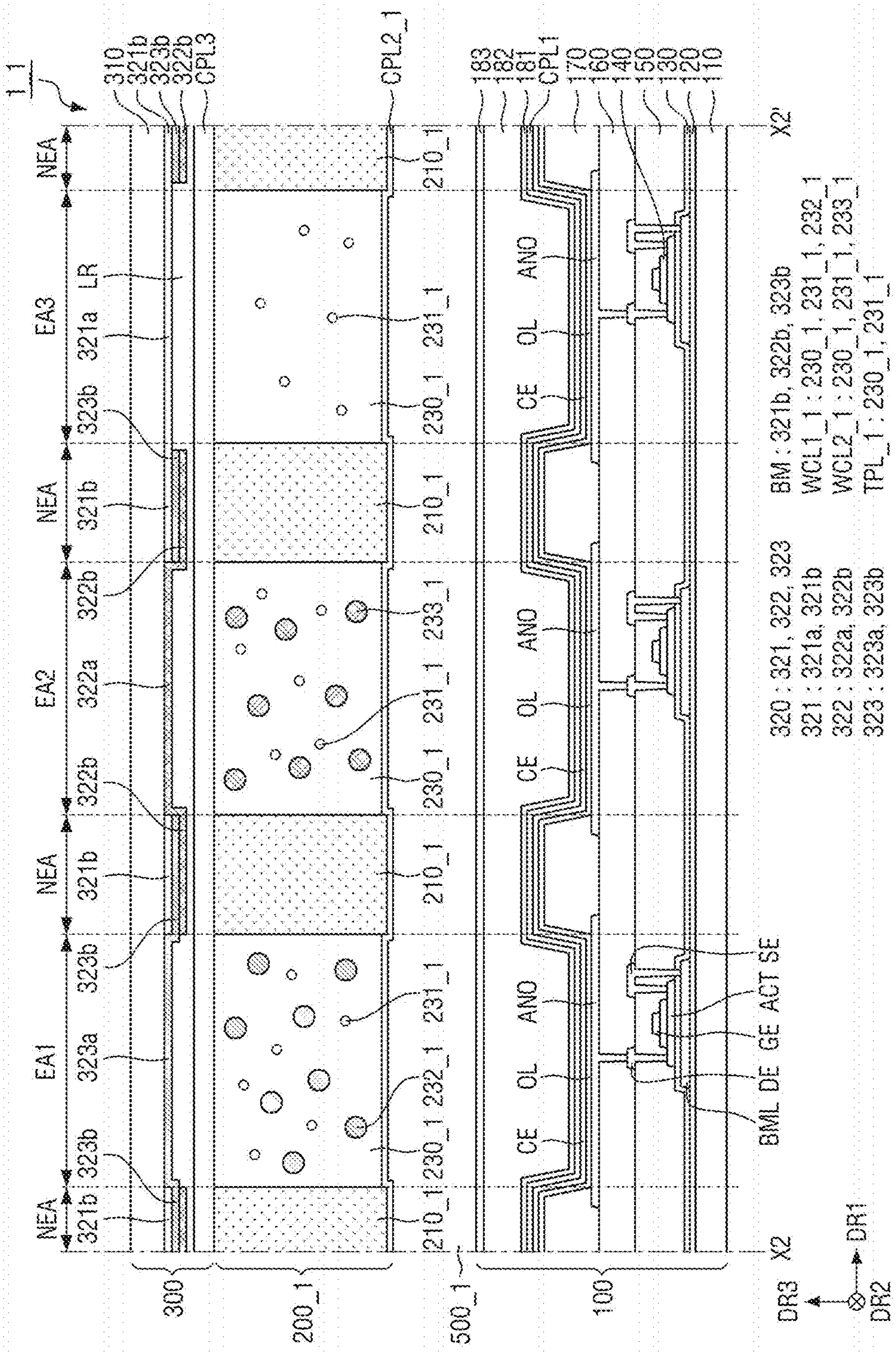
FIG. 12 is a cross-sectional view schematically taken along the line X2-X2' of FIG. 5.
Figure 13:
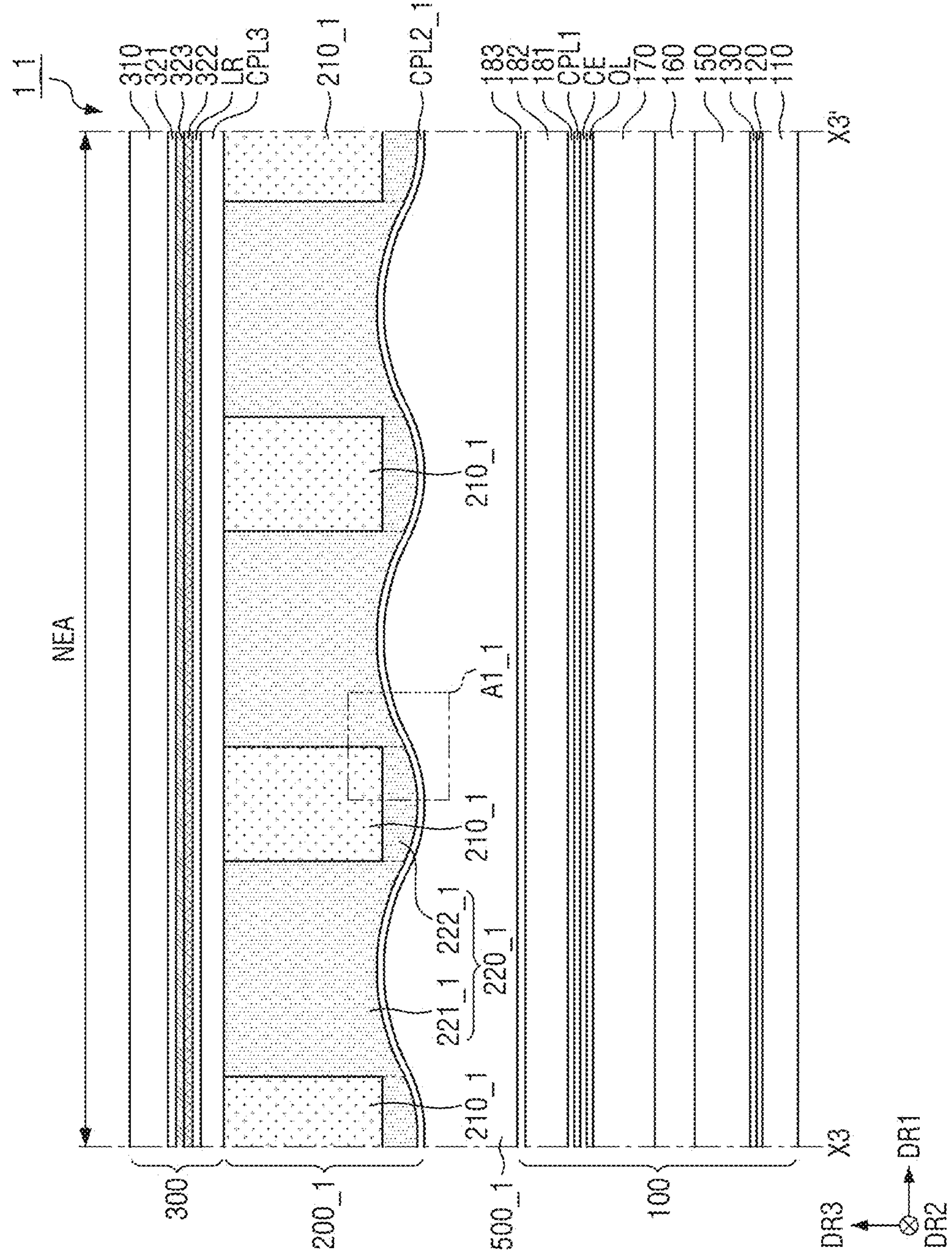
FIG. 13 is a cross-sectional view schematically taken along the line X3-X3' of FIG. 5.
Figure 14:
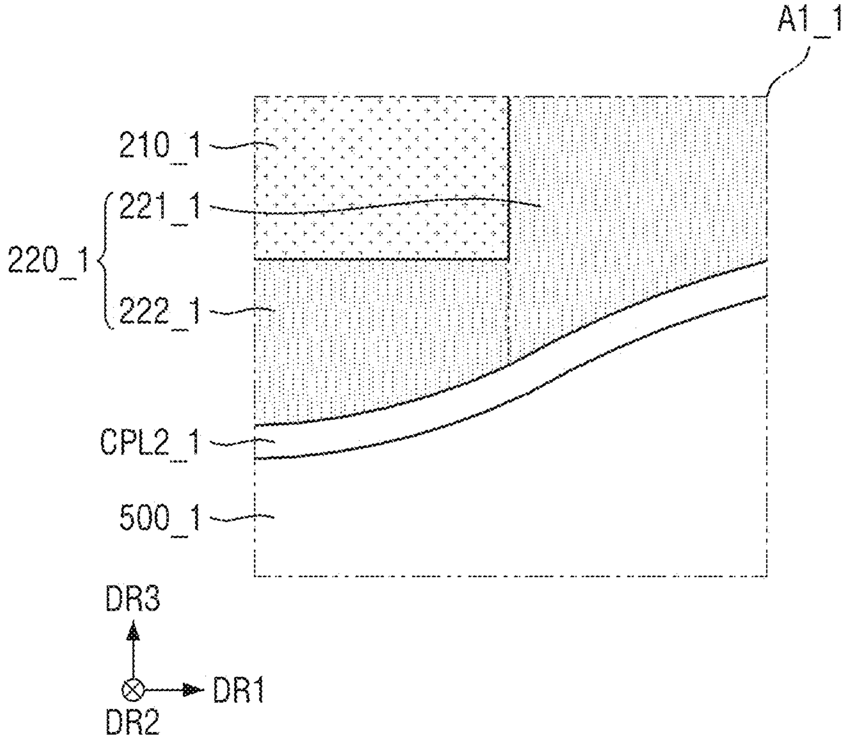
FIG. 14 is an enlarged view of the area A1_1 in FIG. 13.
Figure 15:
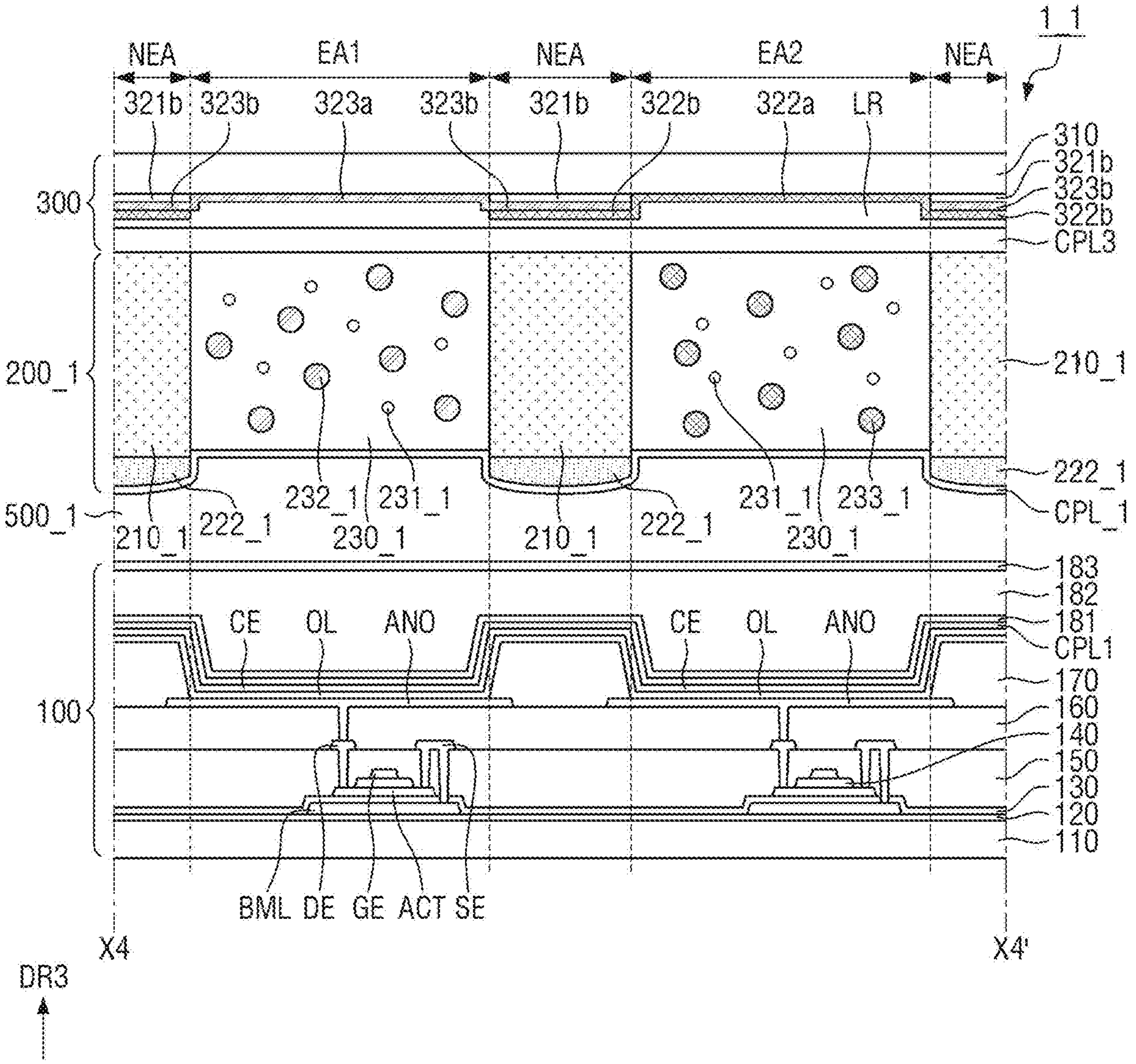
FIG. 15 is a cross-sectional view schematically taken along the line X4-X4' of FIG. 5.
Figure 16:
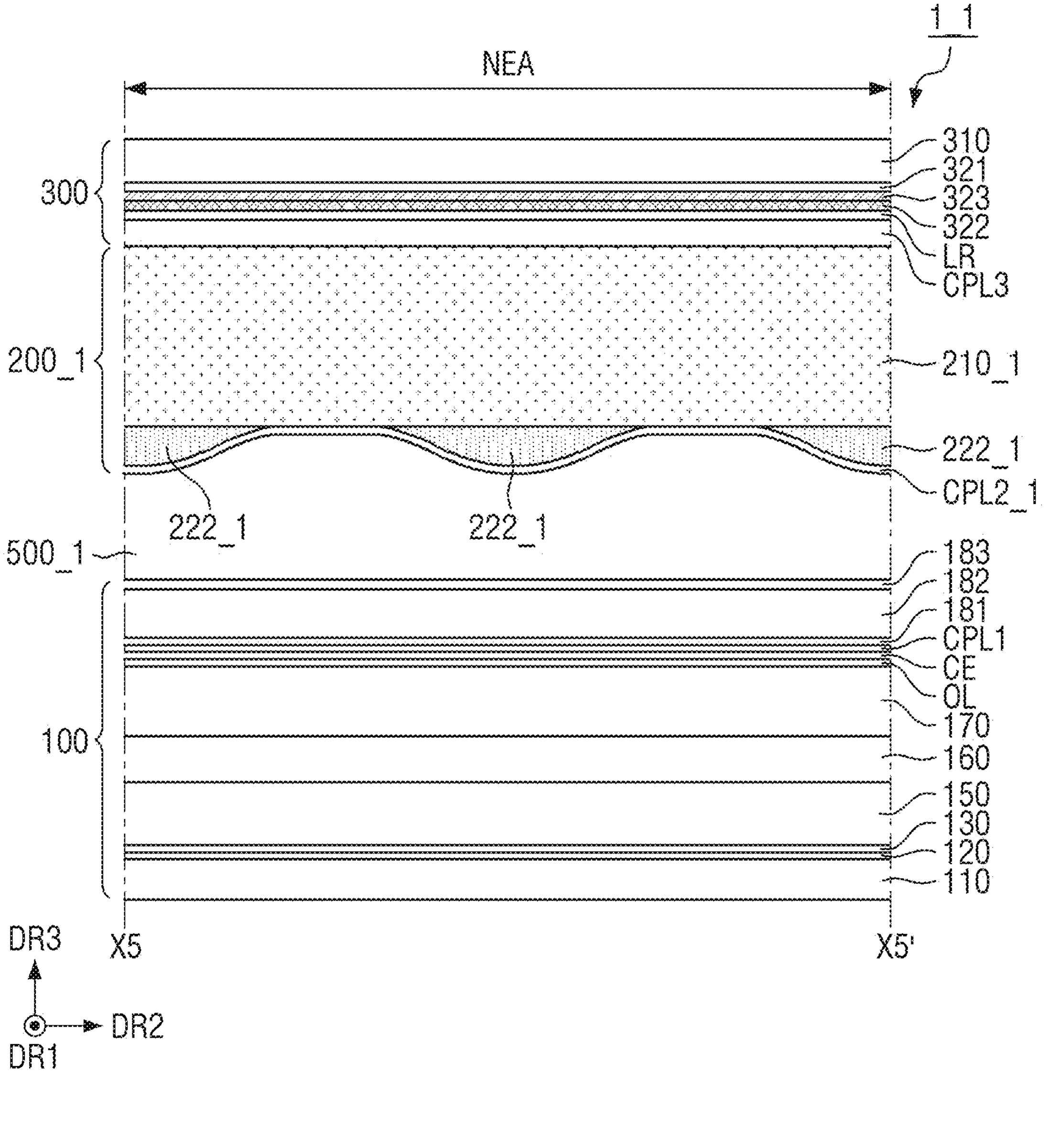
FIG. 16 is a cross-sectional view schematically taken along the line X5-X5' of FIG. 5.

FIG. 11 is a cross-sectional view schematically taken along the line X1-X1' of FIG. 1 according to another embodiment. FIG. 12 is a cross-sectional view schematically taken along the line X2-X2' of FIG. 5. FIG. 13 is a cross-sectional view schematically taken along the line X3-X3' of FIG. 5. FIG. 14 is an enlarged view of the area A1_1 in FIG. 13. FIG. 15 is a cross-sectional view schematically taken along the line X4-X4' of FIG. 5. FIG. 16 is a cross-sectional view schematically taken along the line X5-X5' of FIG. 5.

The embodiment illustrated in FIG. 11 may be different from that described above with reference to FIG. 2, in that the light transmitting portion 200 may be disposed between the filling portion 500 and the color filter portion 300. In the display device 1 described above with reference to FIG. 2, the light emitting portion 100, the light transmitting portion 200, the filling portion 500, and the color filter portion 300 may be sequentially stacked in the third direction DR3. In the display device 1_1 illustrated in FIG. 11, the light emitting portion 100, a filling portion 500_1, a light transmitting portion 200_1, and the color filter portion 300 may be sequentially stacked in the third direction DR3. The filling portion 500_1 may be disposed between the upper inorganic encapsulation layer 183 and the bank pattern 210 and 220.

The display device 1_1 illustrated in FIGS. 11 to 16 may have an emission area having the same or substantially the same shape as that described above with reference to FIGS. 2 to 10, and the bank pattern of the light transmitting portion 200_1 may be formed by using the masks MASK1 and MASK2 described above with reference to FIG. 4. Accordingly, other than the layout of the filling portion 500_1 and the light transmitting portion 200_1, which may be different, redundant description of the same or substantially the same components as those described above may not be repeated. In addition, the configuration of the light transmitting portion 200 described above with reference to FIGS. 2 to 10 may be applied to the light transmitting portion 200_1 illustrated in FIGS. 11 to 16 with the vertical relationship reversed. In FIG. 2, the protrusion portion 222 disposed between the first bank 210 and the filling portion 500 may be disposed above the main portion 221. In FIG. 11, however, the protrusion portion 222 disposed between the first bank 210 and the filling portion 500 may be disposed below the main portion 221.

The light transmitting portion 200_1 illustrated in FIGS. 11 to 16 may be formed on the color filter portion 300 after the color filter portion 300 is formed on the second substrate 310. Thereafter, the light transmitting portion 200_1 may be bonded to the light emitting portion 100 by the filling portion 500_1.

Figure 17:
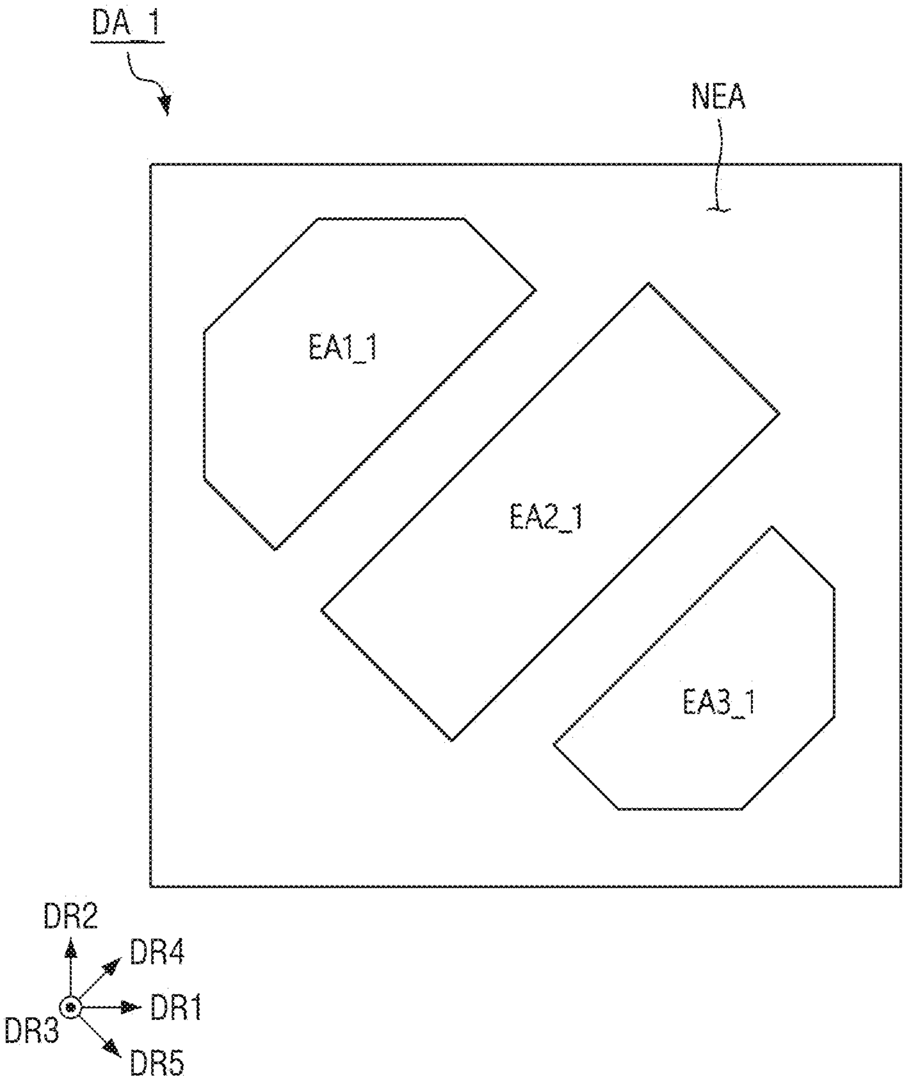
FIG. 17 is a plan view of a display area of a display device according to another embodiment.

FIG. 17 is a plan view of a display area of a display device according to another embodiment. A display area DA_1 shown in FIG. 17 includes emission areas EA1_1, EA2_1, and EA3_1 having shapes that are different from those of the display area DA described above with reference to FIG. 3.

The first emission area EA1_1 to the third emission area EA3_1 may be sequentially disposed along the first direction DR1 or along a fifth direction DR5. A fourth direction DR4 may be any one direction on the plane formed by the first and second directions DR1 and DR2, and the fifth direction DR5 may be a direction perpendicular to or substantially perpendicular to the fourth direction DR4.

The width of the second emission area EA2_1 located between the first emission area EA1_1 and the third emission area EA3_1 may be larger than the width of the first emission area EA1_1 and the width of the third emission area EA3_1. The width of the emission area may be a maximum value among the lengths measured in the fourth direction DR4. In an embodiment, the areas of the first to third emission areas EA1_1 to area EA3_1 may be different from each other. The area of the first emission area EA1_1 may be larger than the area of the third emission area EA3_1. In an embodiment, the second emission area EA2_1 may have a rectangular shape, and the first emission area EA1_1 and the third emission area EA3_1 may have a pentagonal shape to an octagonal shape.

The second emission area EA2_1 may extend in the fourth direction DR4. The entire lateral side of each of the first emission area EA1_1 and the third emission area EA3_1 in the fourth direction DR4 may overlap with the lateral side of the second emission area EA2_1 in the fourth direction DR4 (e.g., along the fifth direction DR5).

Figure 18:
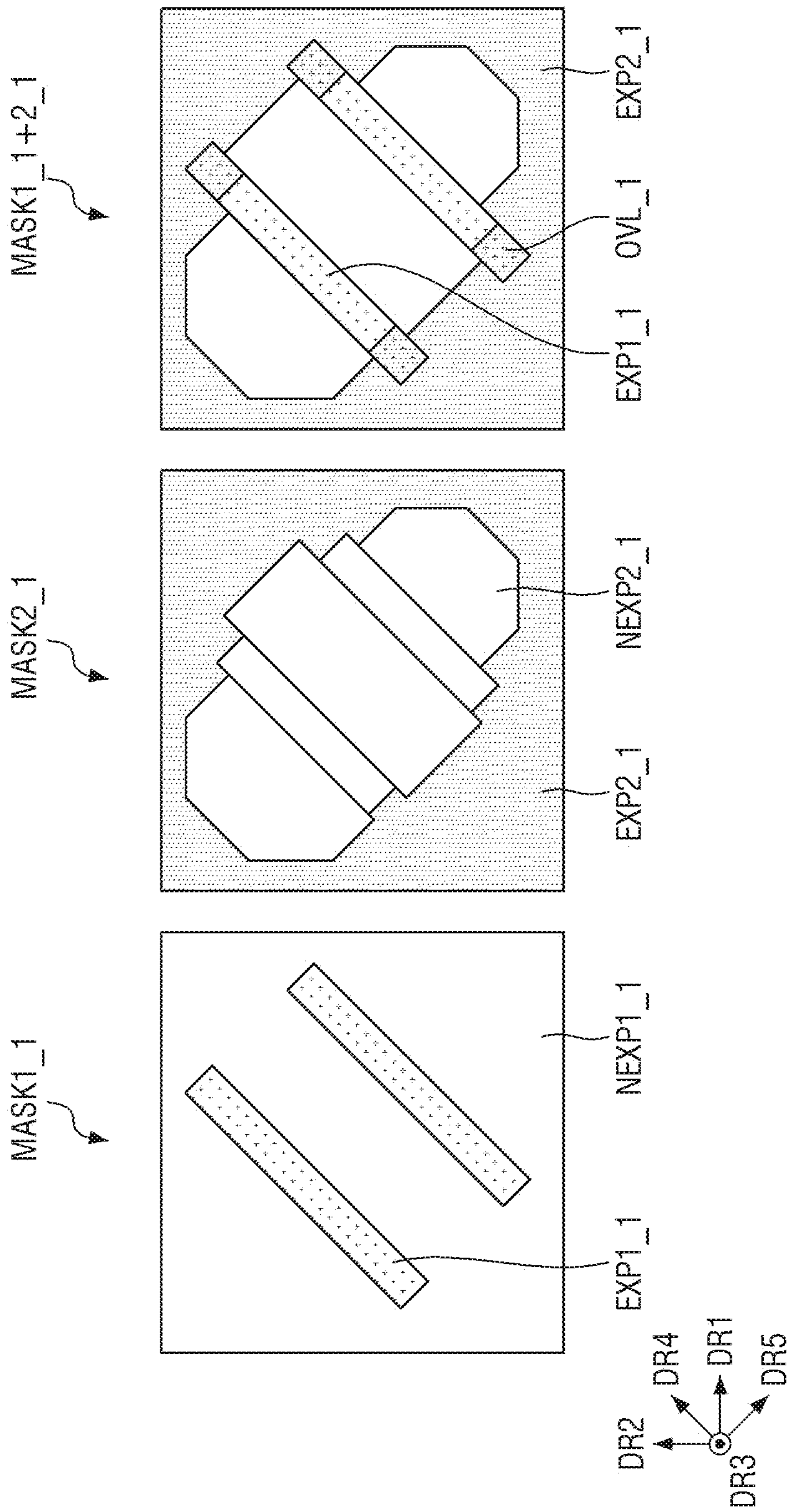
FIG. 18 is a plan view illustrating masks for a bank for forming the display area of FIG. 17 according to an embodiment.
Figure 19:
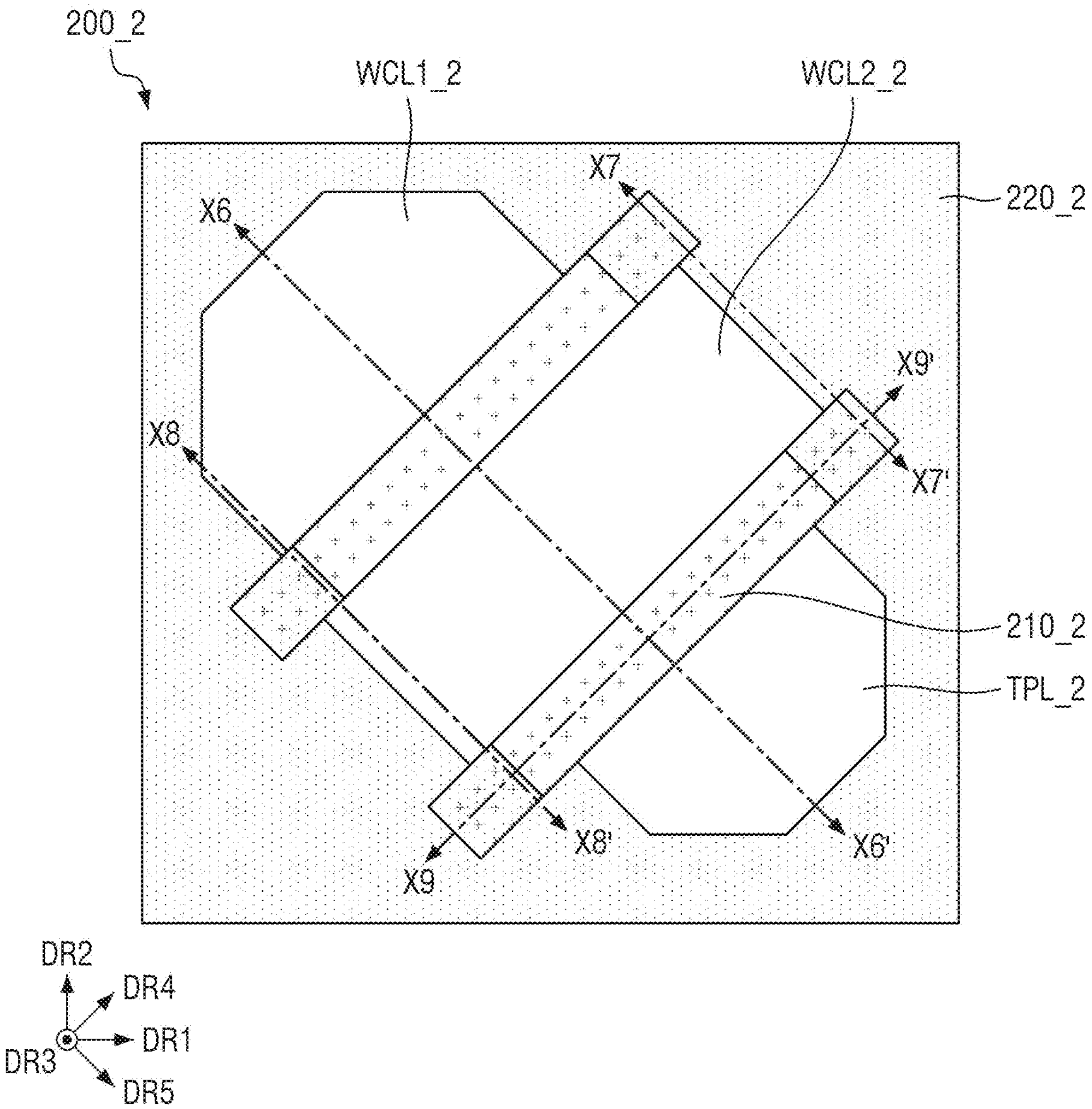
FIG. 19 is a plan view of a light transmitting portion formed by using the masks of FIG. 18.
Figure 20:
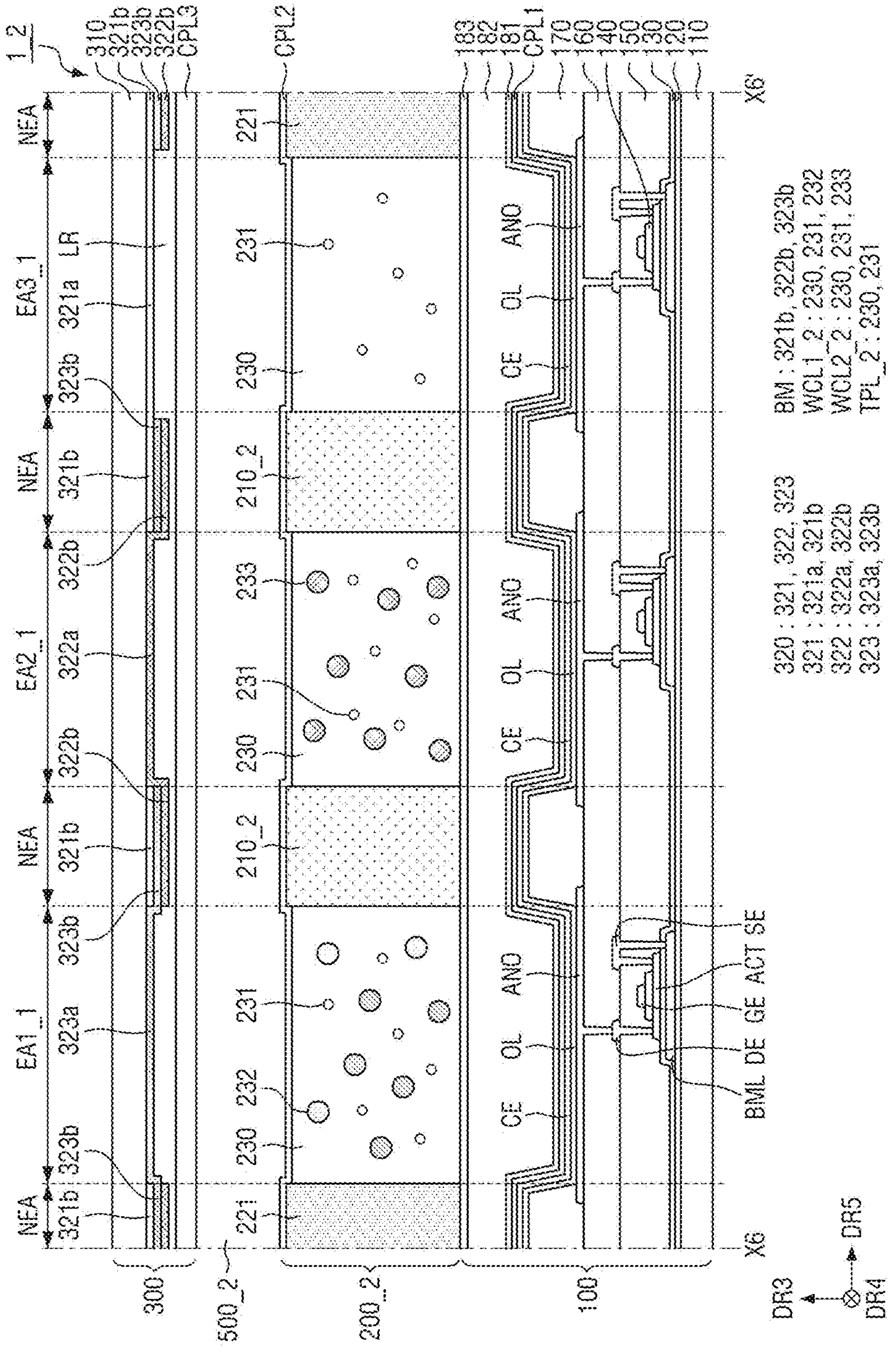
FIGS. 20-23 are cross-sectional views schematically taken along the lines X6-X6' to X9-X9', respectively, of the light transmitting portion of FIG. 19 according to one or more embodiments.
Figure 21:
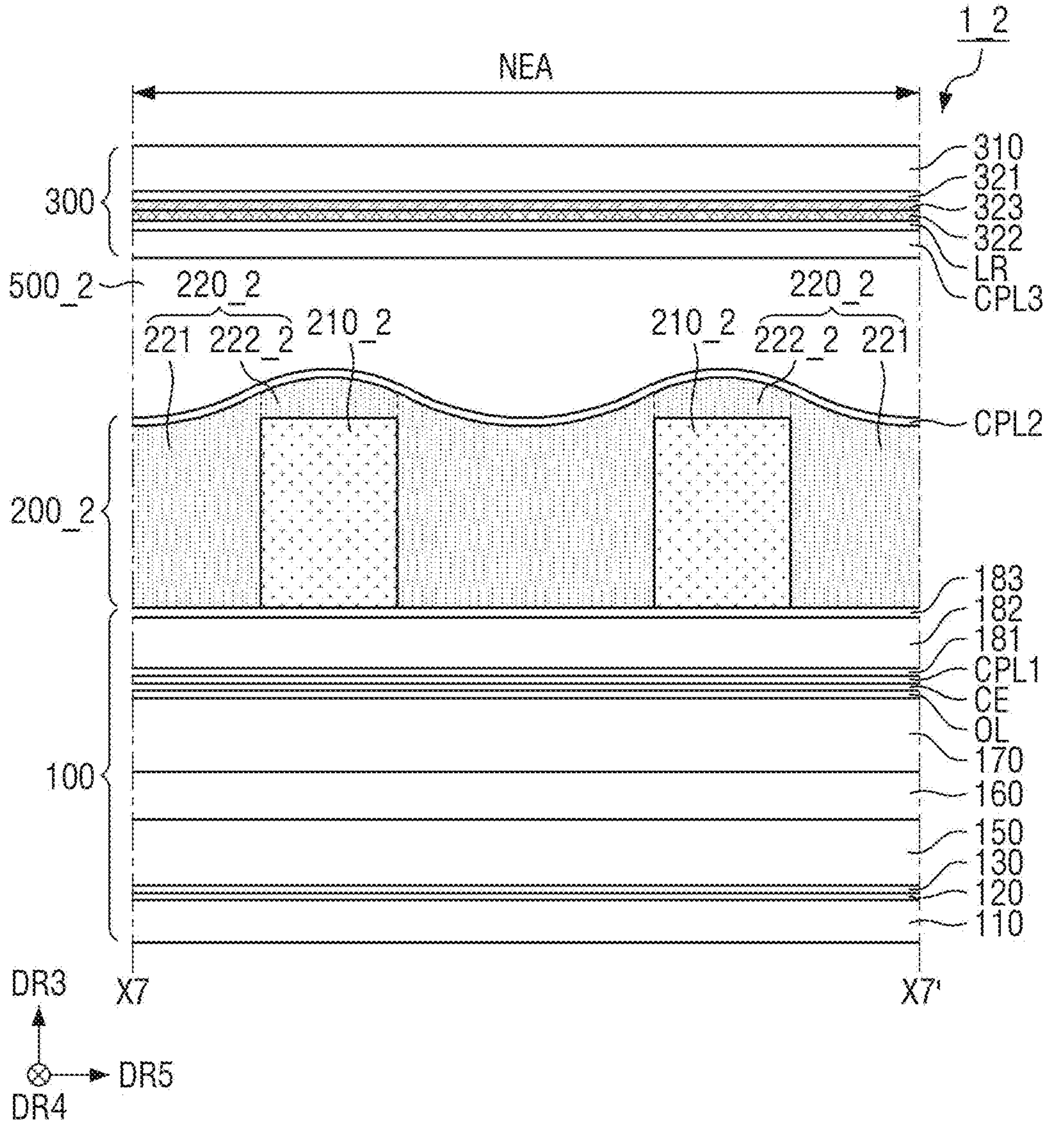

FIG. 18 is a plan view illustrating masks MASK1_1 and MASK2_1 for a bank for forming the display area DA_1 of FIG. 17 according to an embodiment. FIG. 19 is a plan view of a light transmitting portion 200_2 formed by using the masks MASK1_1 and MASK2_1 of FIG. 18. FIGS. 20 through 23 are cross-sectional views schematically taken along the lines X6-X6' to X9-X9', respectively, of the light transmitting portion of FIG. 19 according to one or more embodiments.

Referring to FIGS. 18 and 19, a first bank 210_2 is formed to overlap with an exposed portion EXP1_1 of the first mask MASK1_1, and a second bank 220_2 is formed to overlap with an exposed portion EXP2_1 of the second mask MASK2_1. A protrusion portion 222_2 of the second bank 220_2 may be formed to overlap with the overlapping area OVL_1 between the exposed portion EXP1_1 of the first mask MASK1_1 and the exposed portion EXP2_1 of the second mask MASK2_1.

Referring to FIG. 19, the first bank 210_2 may include a plurality of sub-banks, and each of the sub-banks of the first bank 210_2 may include an area overlapping with the second bank 220_2. The sub-bank of the first bank 210_2 may extend in the fourth direction DR4, and one end and the other end (e.g., an opposite end) of the sub-bank of the first bank 210_2 in the fourth direction DR4 may overlap with the second bank 220_2. The sub-bank of the first bank 210_2 may include a central portion located between the one end and the other end in the fourth direction DR4, and the central portion of the sub-bank of the first bank 210_2 may or may not overlap with the second bank 220_2.

Referring to FIGS. 20 to 23, the light emitting portion 100, the light transmitting portion 200_2, a filling portion 500_2, and the color filter portion 300 may be sequentially stacked in the third direction DR3.

Figure 22:
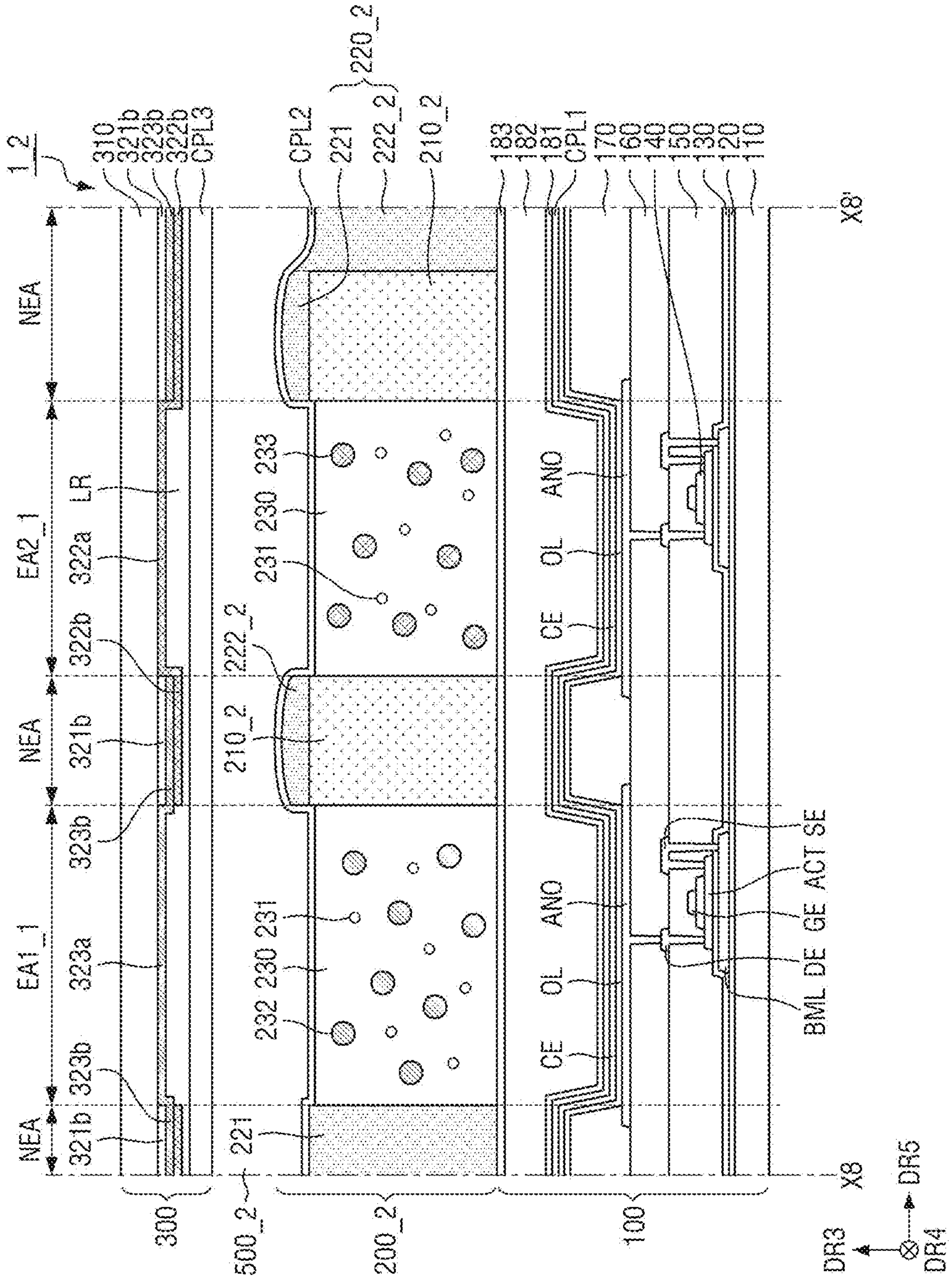
Figure 23:
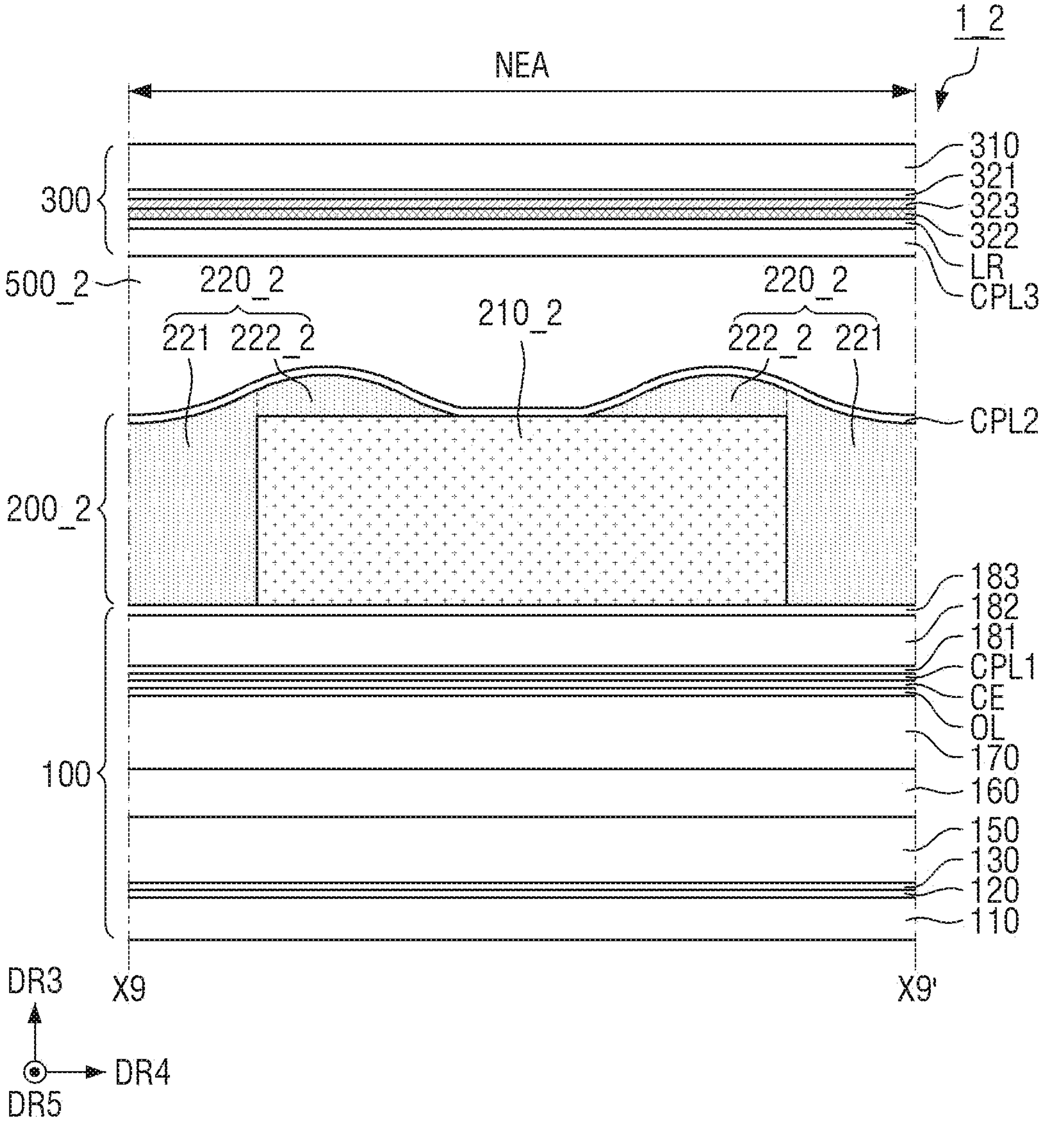
Figure 24:
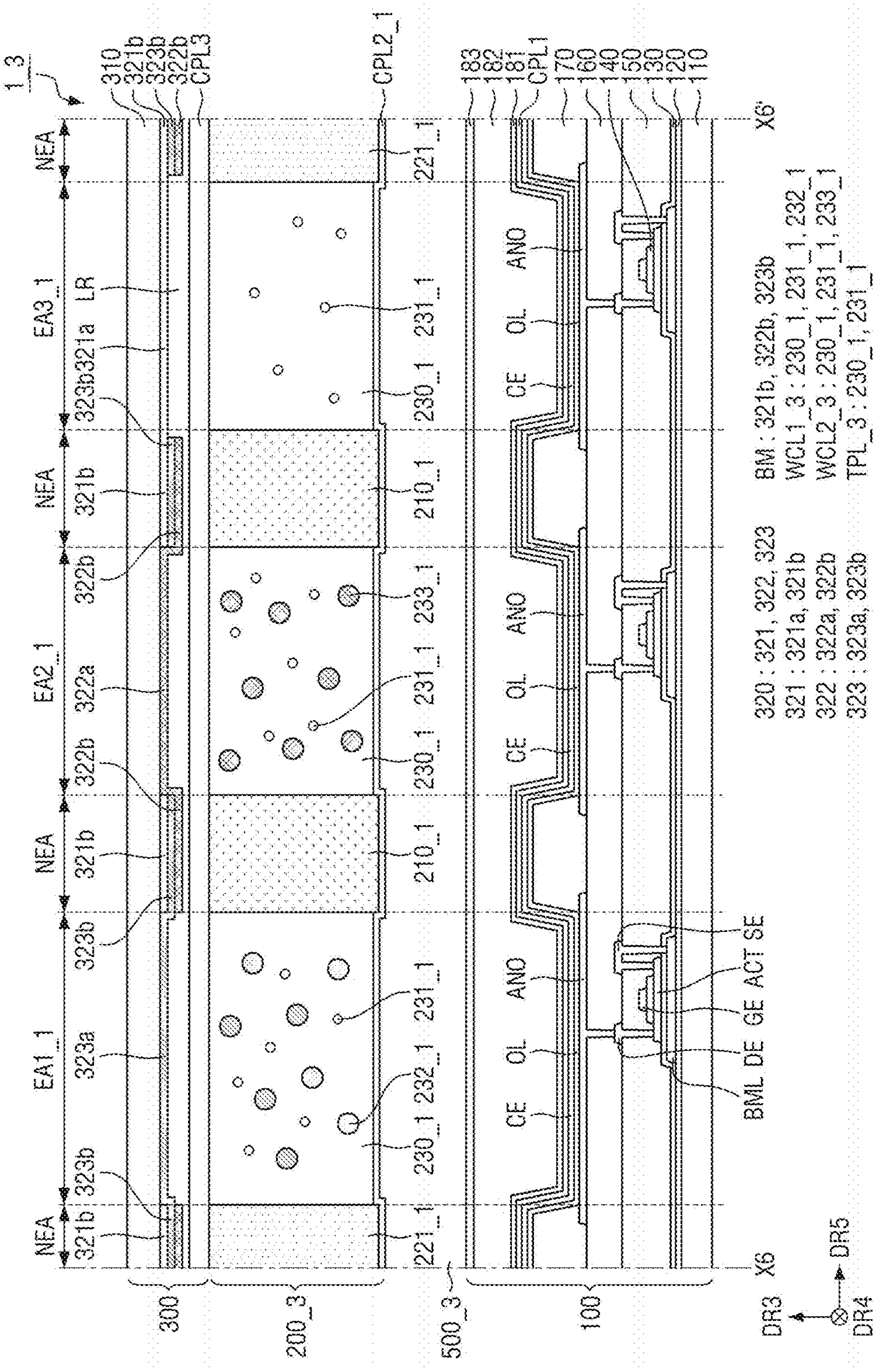
FIGS. 24-27 are cross-sectional views schematically taken along lines X6-X6' to X9-X9', respectively, of the light transmitting portion of FIG. 19 according to one or more embodiments.
Figure 25:
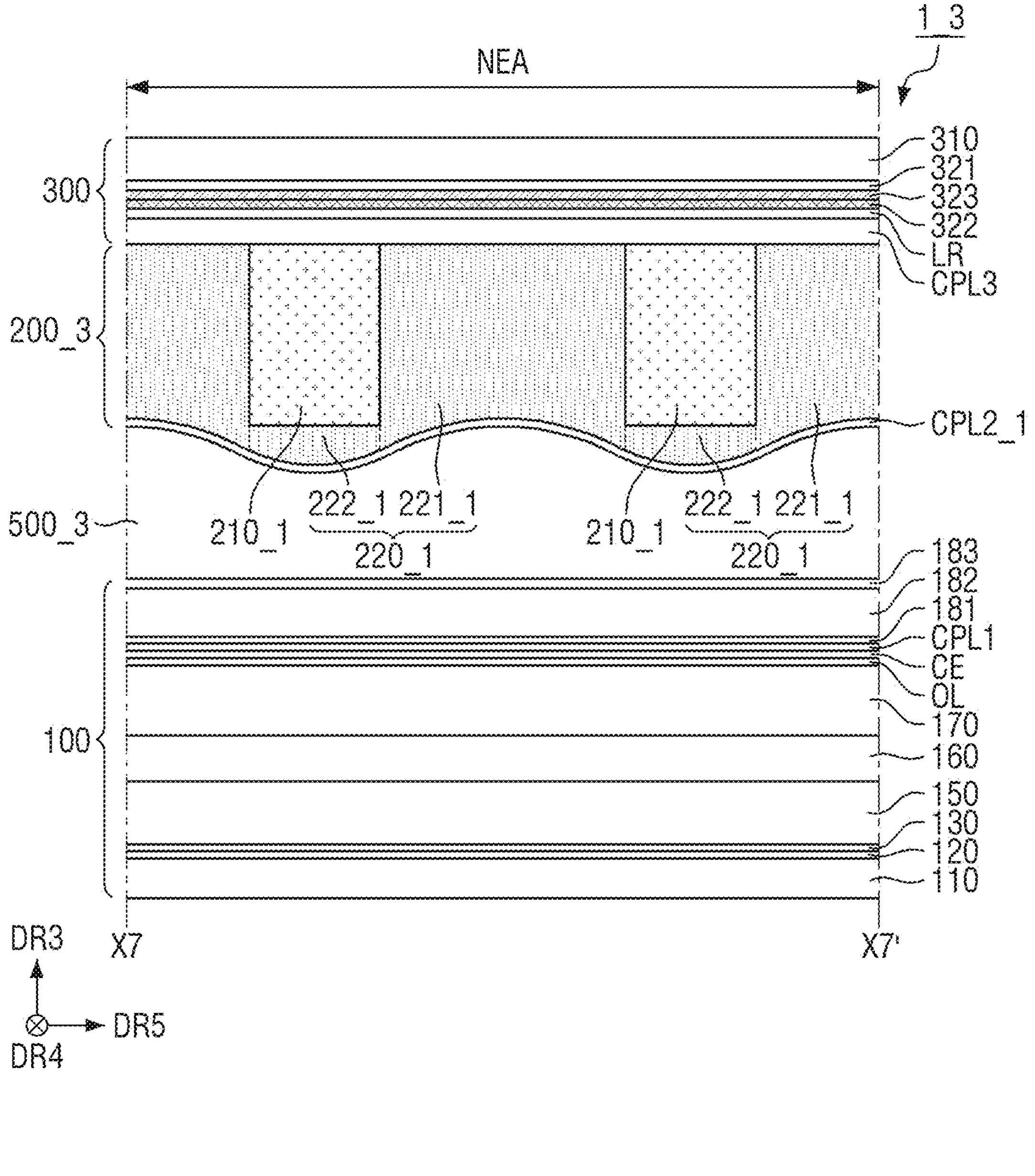
Figure 26:
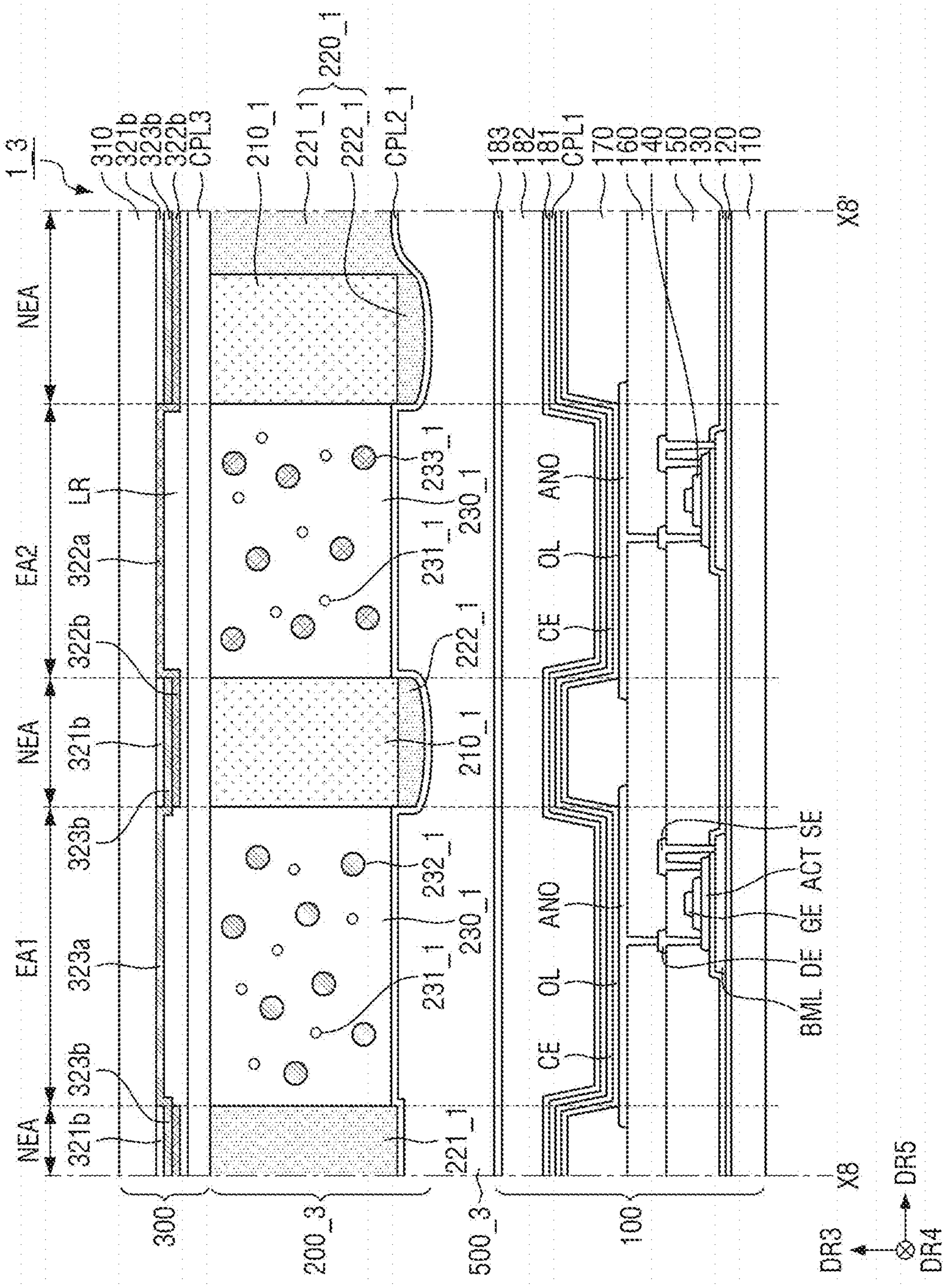
Figure 27:
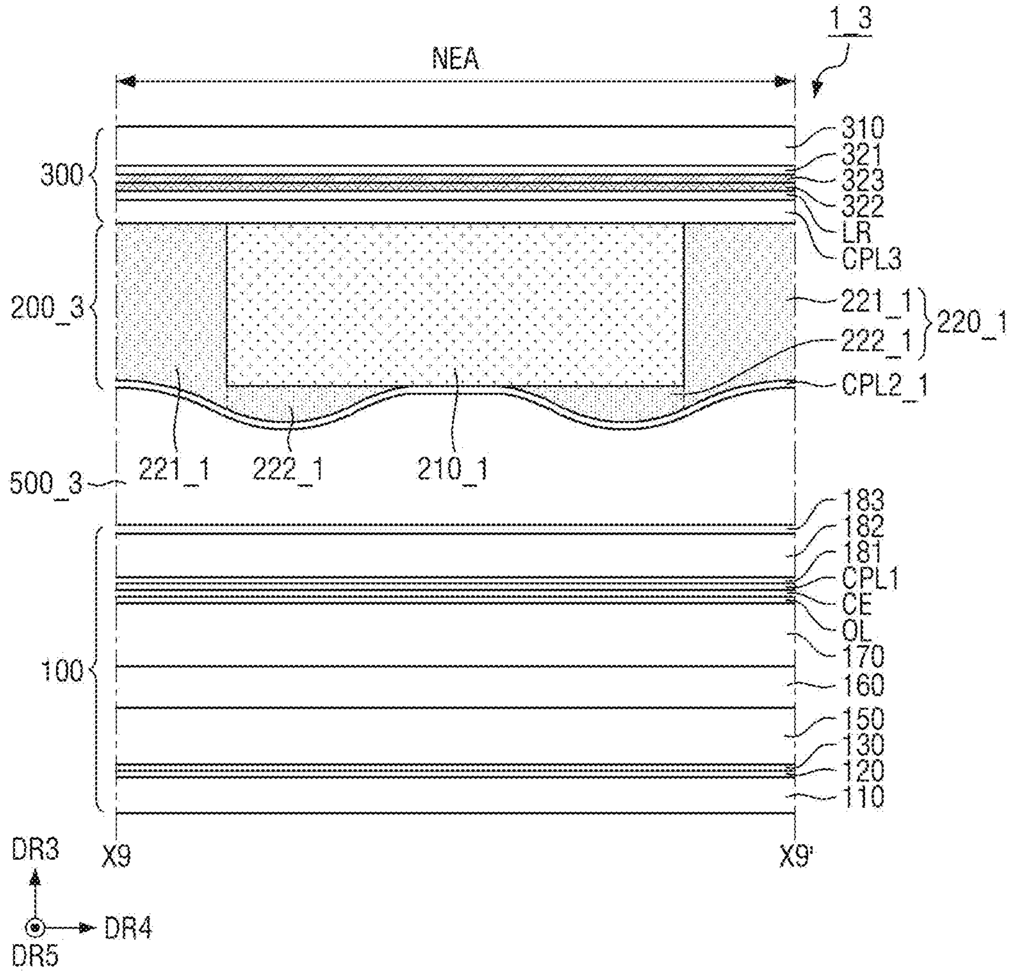

Referring to FIGS. 19 and 22, the first bank 210_2 and the protrusion portion 222_2 of the second bank 220_2 may be disposed between the first emission area EA1_1 and the second emission area EA2_1.

FIGS. 24 through 27 are cross-sectional views schematically taken along the lines X6-X6' to X9-X9', respectively, of the light transmitting portion of FIG. 19 according to one or more embodiments. A display device 1_3 of FIGS. 24 to 27 may be different from the display device 1_2 described above with reference to FIGS. 20 to 23, in that a light transmitting portion 200_3 may be disposed between a filling portion 500_3 and the color filter portion 300. In other words, the display device 1_3 of FIGS. 24 to 27 may have a similar stacked structure as that shown in FIG. 11.

The display device 1_3 of FIGS. 24 to 27 may have an emission area having the same or substantially the same shape as that described above with reference to FIG. 17, and the bank pattern of the light transmitting portion 200_3 may be formed by using the masks MASK1_1 and MASK2_1 described above with reference to FIG. 18. Accordingly, other than the layout of the filling portion 500_3 and the light transmitting portion 200_3, which may be different, redundant description of the same or substantially the same components as those described above may not be repeated. In addition, the configuration of the light transmitting portion 200_2 described above with reference to FIGS. 20 to 23 may be applied to the light transmitting portion 200_3 illustrated in FIGS. 24 to 27 with the vertical relationship reversed.

Figure 28:
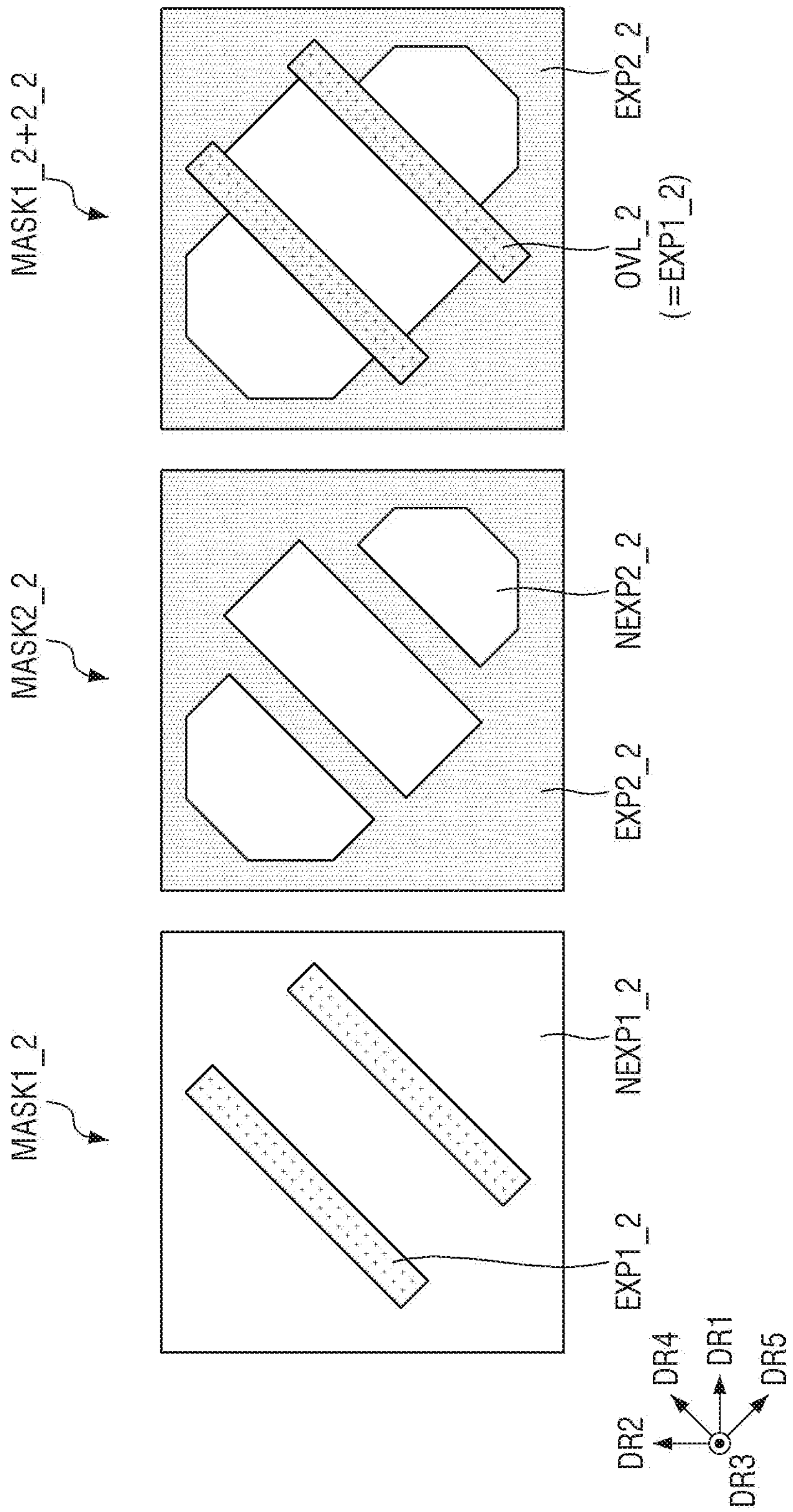
FIG. 28 is a plan view of a mask for a bank for forming the display area of FIG. 17 according to another embodiment.
Figure 29:
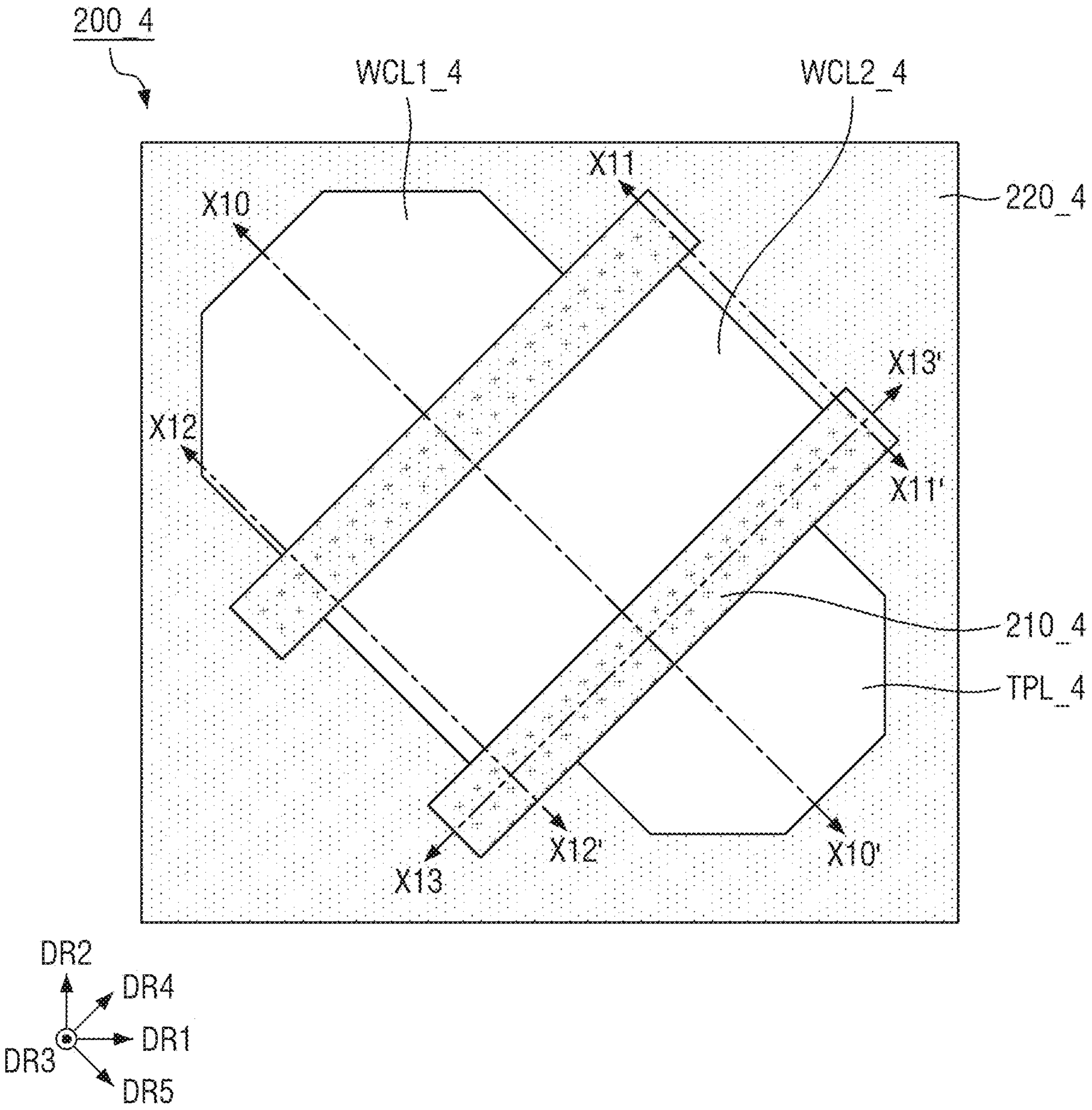
FIG. 29 is a plan view of a light transmitting portion formed by using the mask of FIG. 28.
Figure 30:
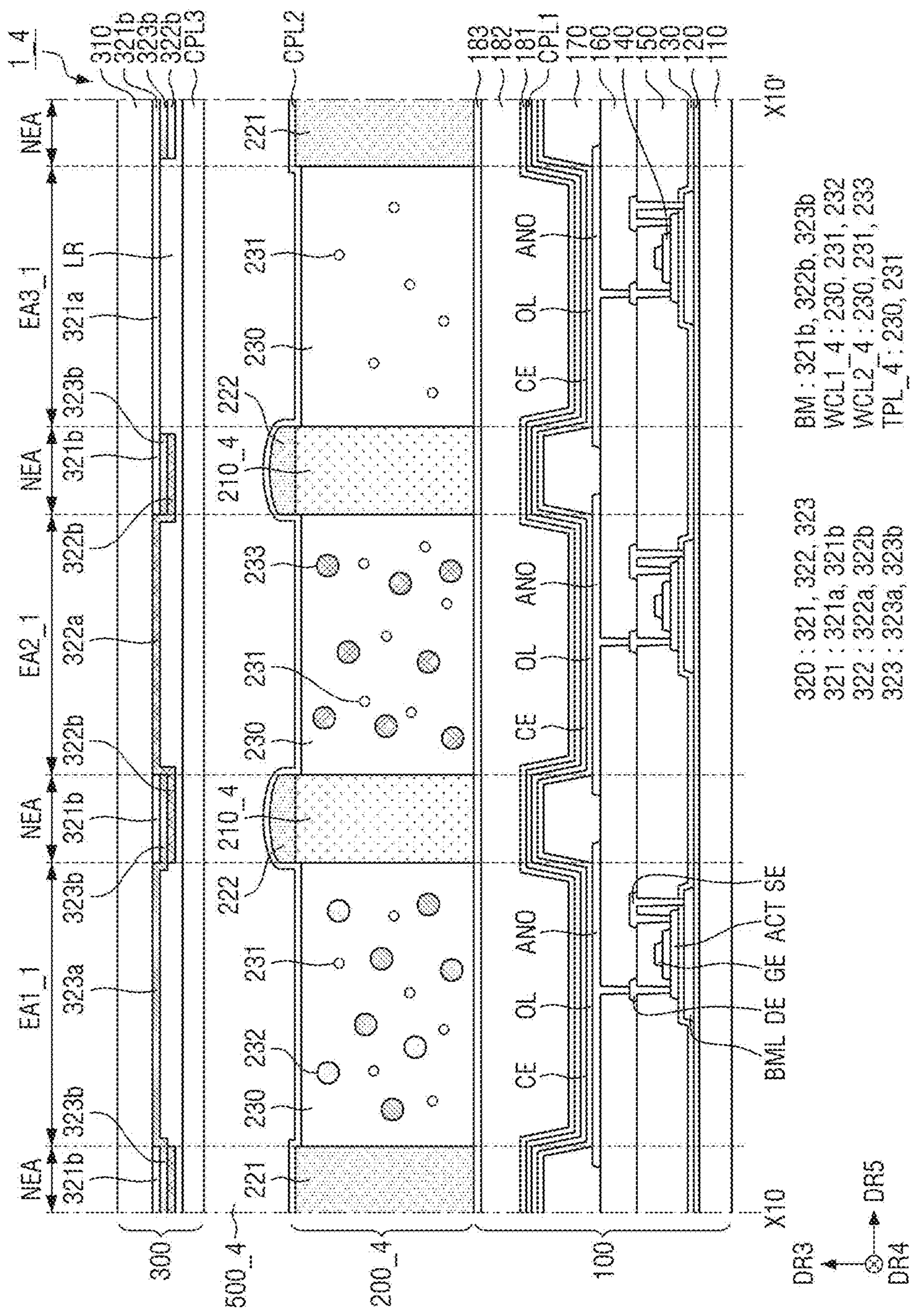
FIGS. 30-33 are cross-sectional views schematically taken along the lines X10-X10' to X13-X13', respectively, of a light transmitting portion of FIG. 29 according to one or more embodiments.
Figure 31:
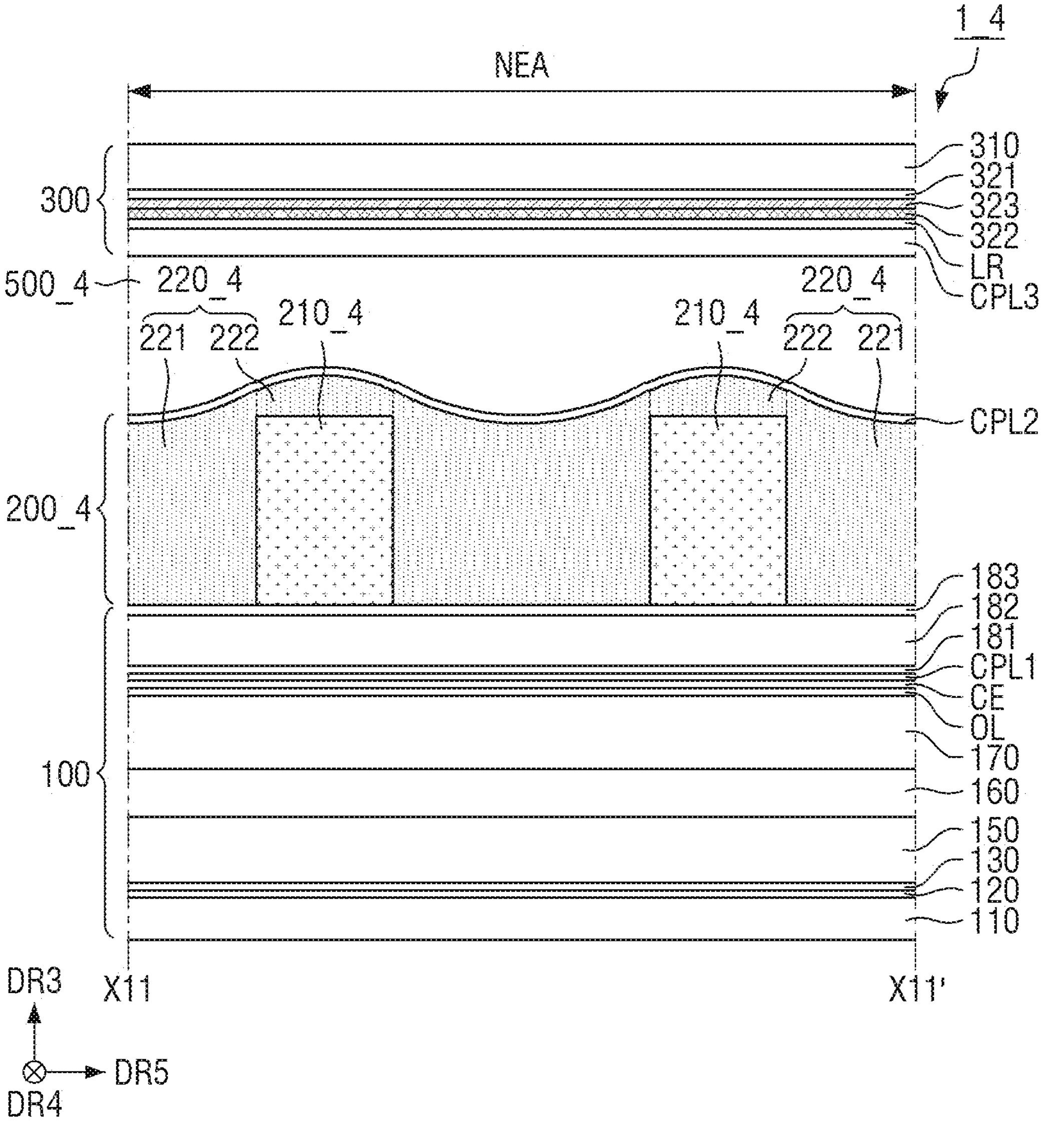
Figure 32:
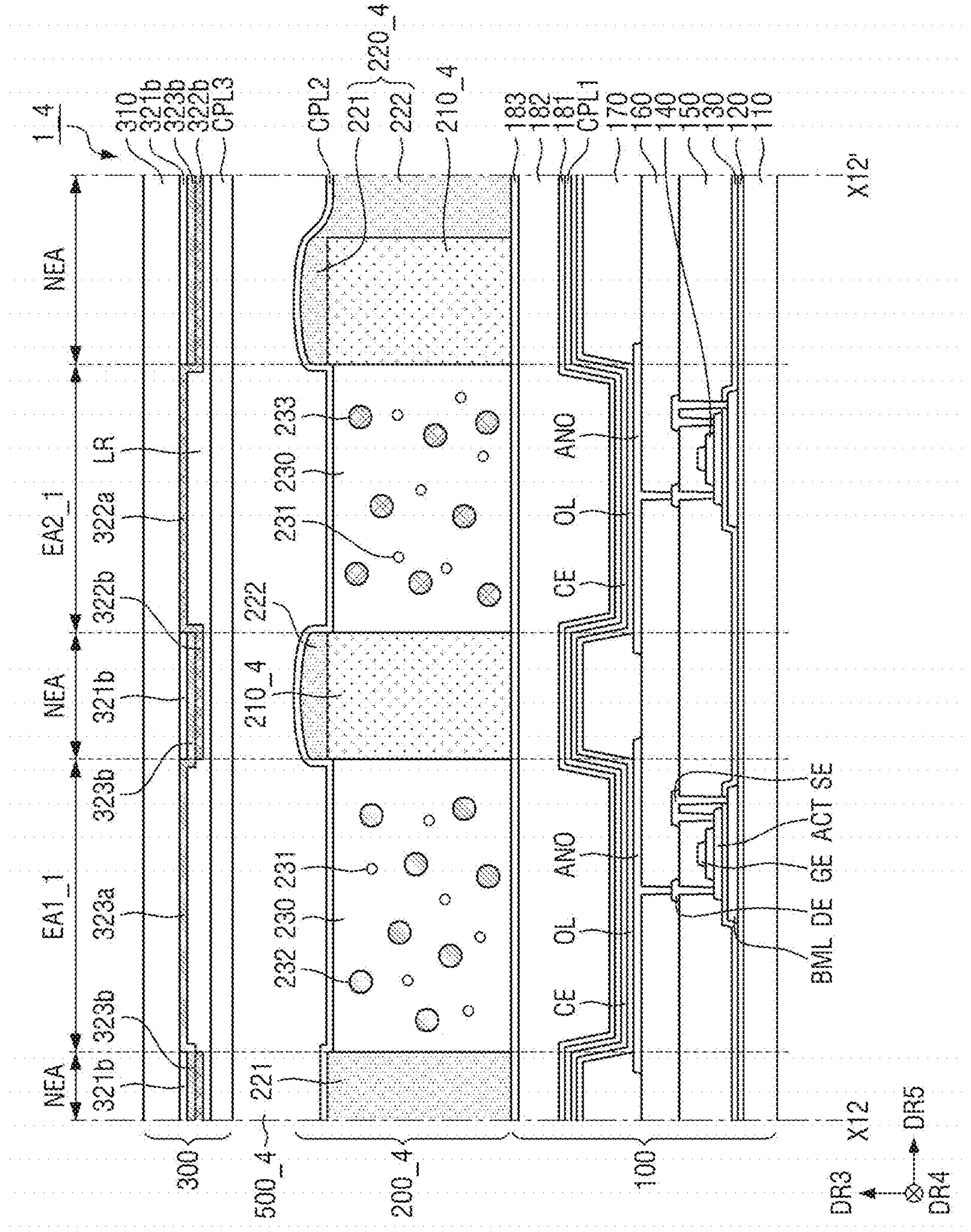
Figure 33:
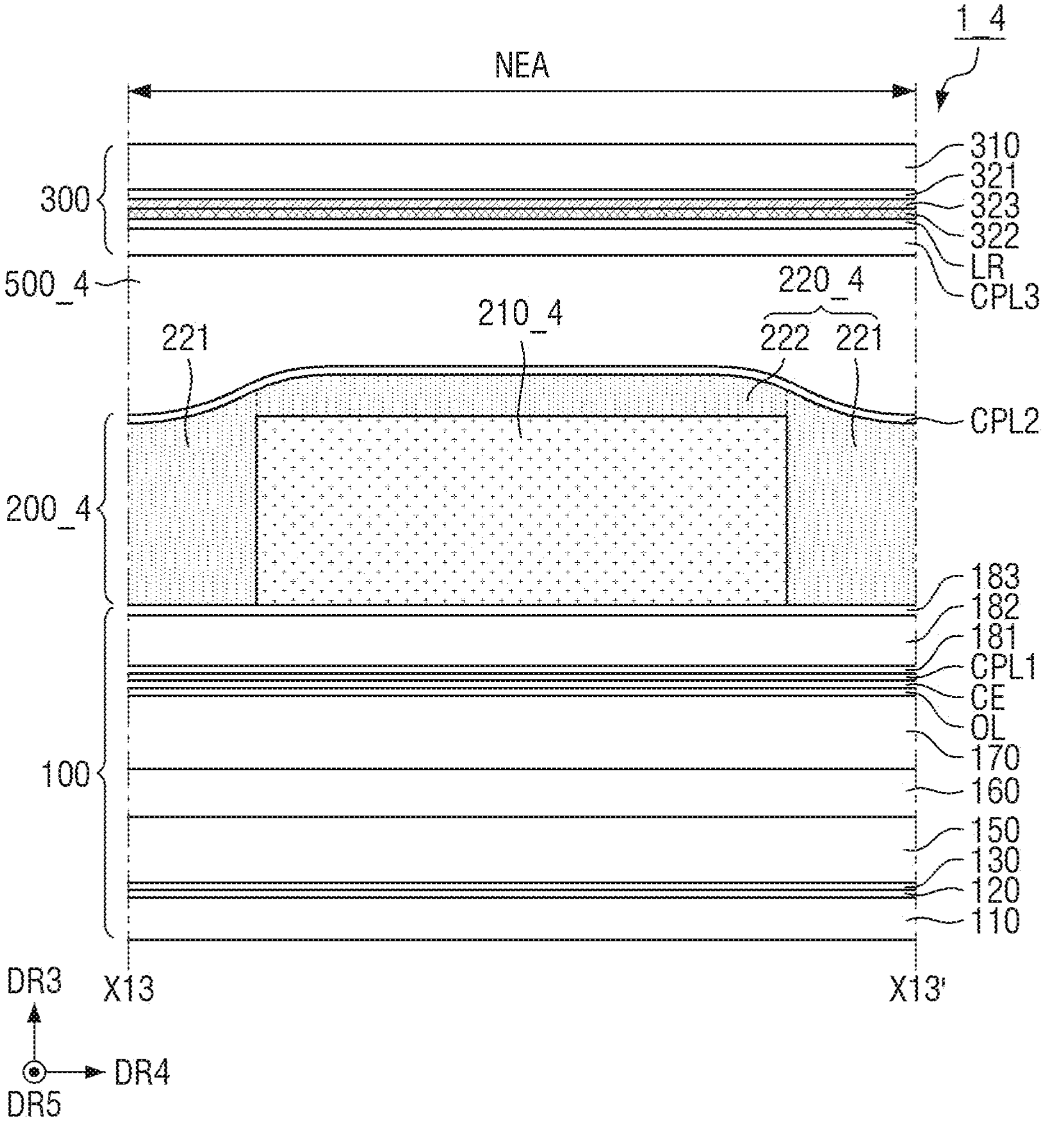
Figure 34:
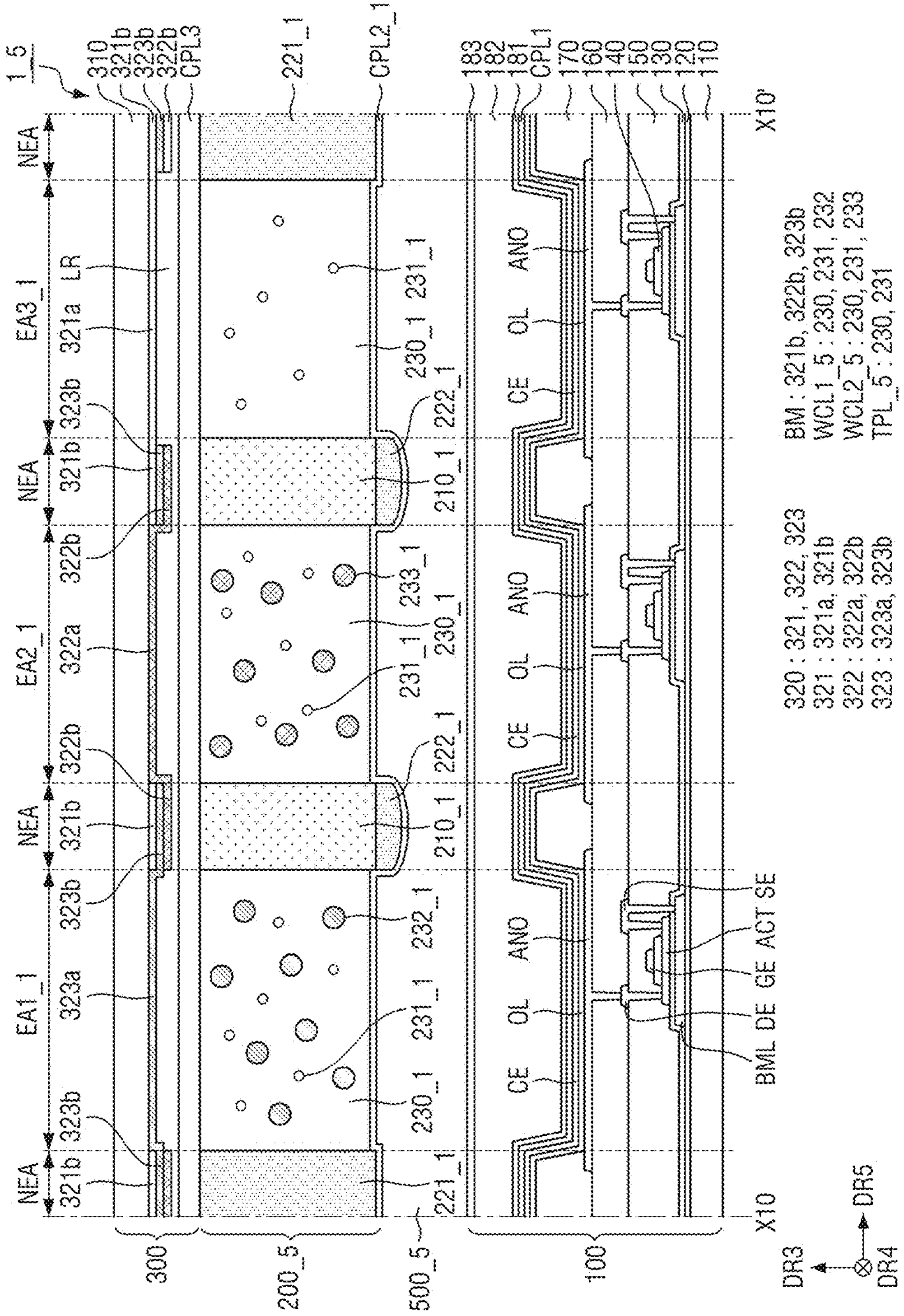
FIGS. 34-37 are cross-sectional views schematically taken along the lines X10-X10' to X13-X13', respectively, of the light transmitting portion of FIG. 29 according to one or more embodiments.
Figure 35:
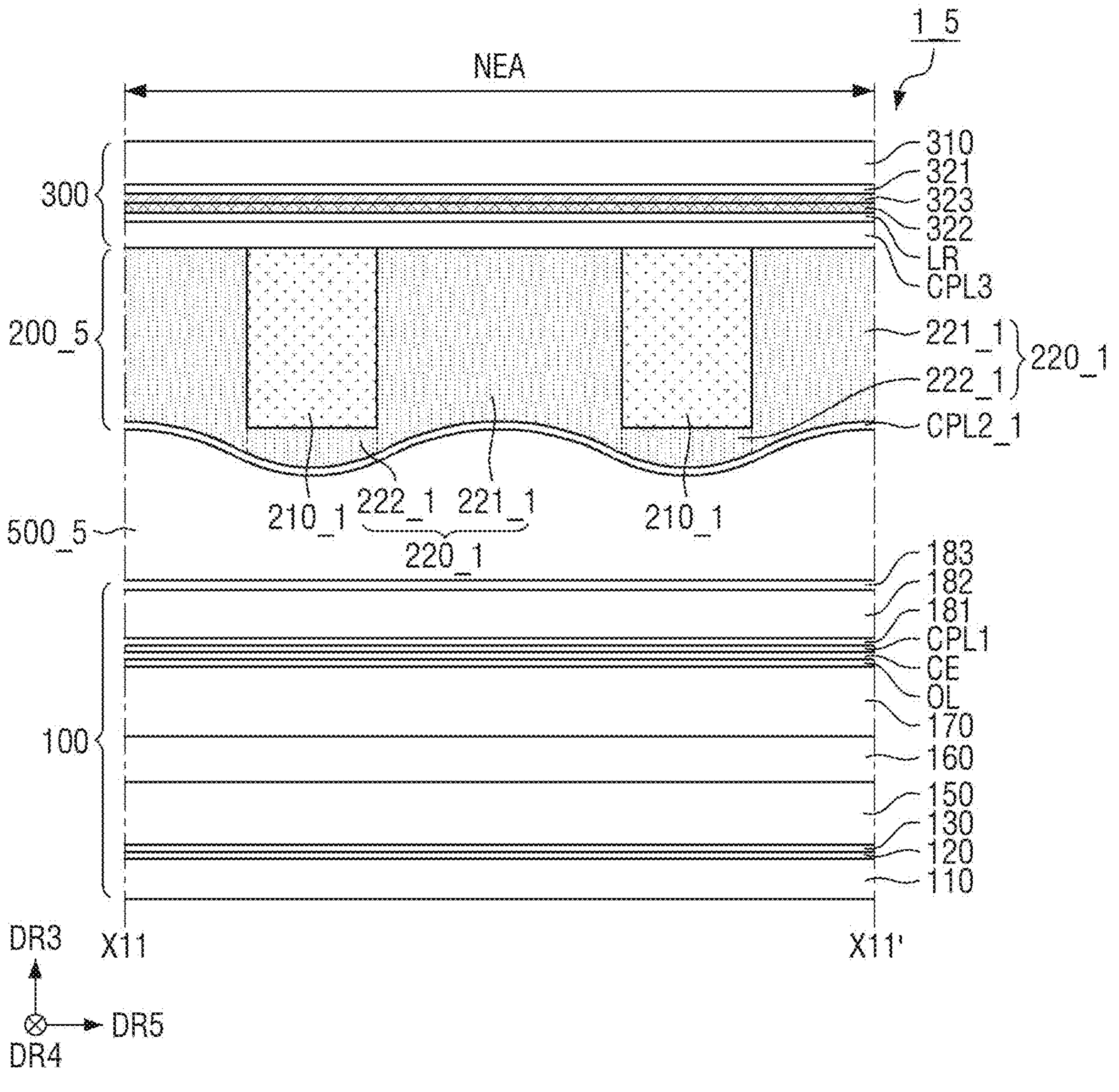
Figure 36:
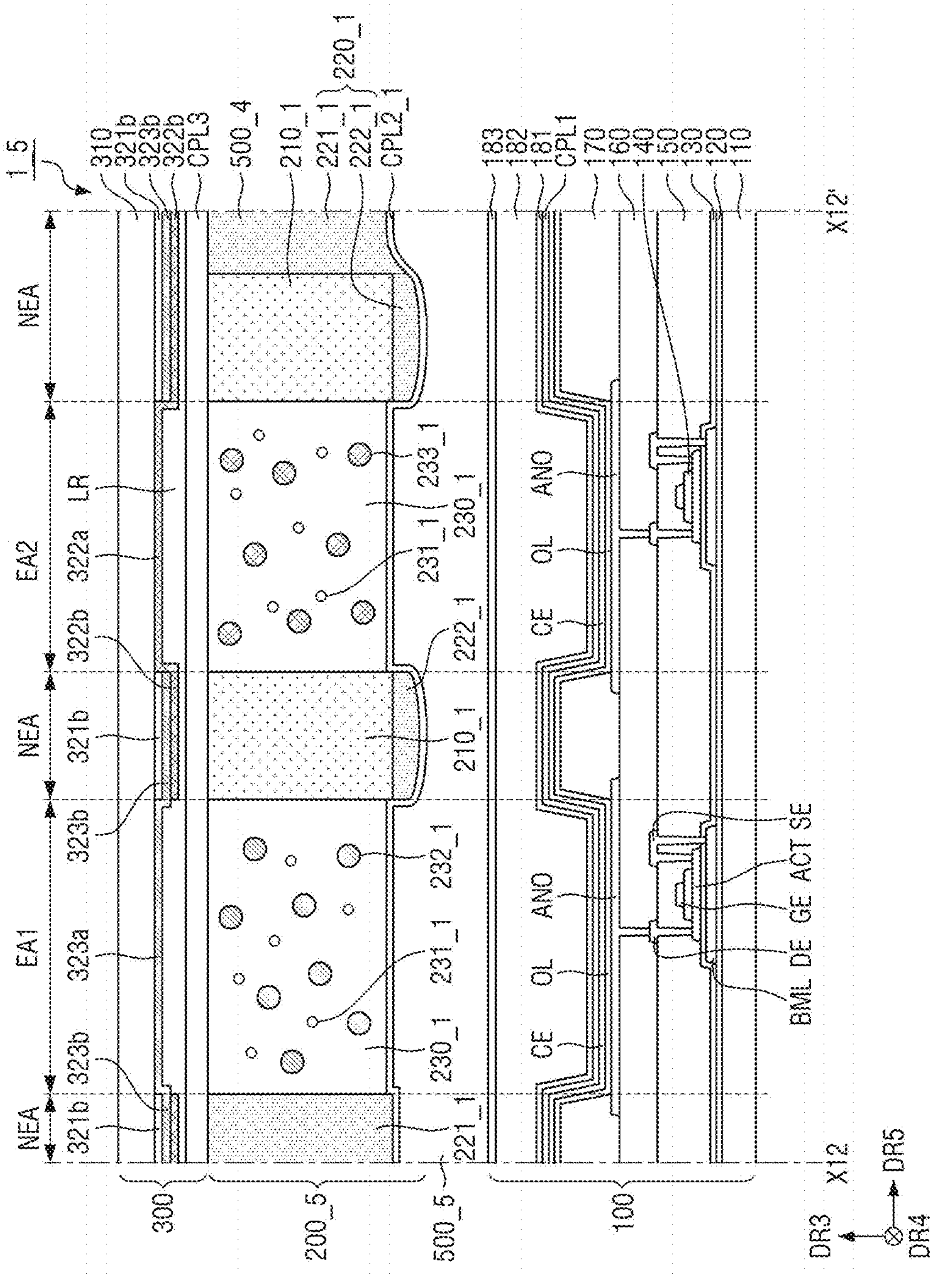
Figure 37:
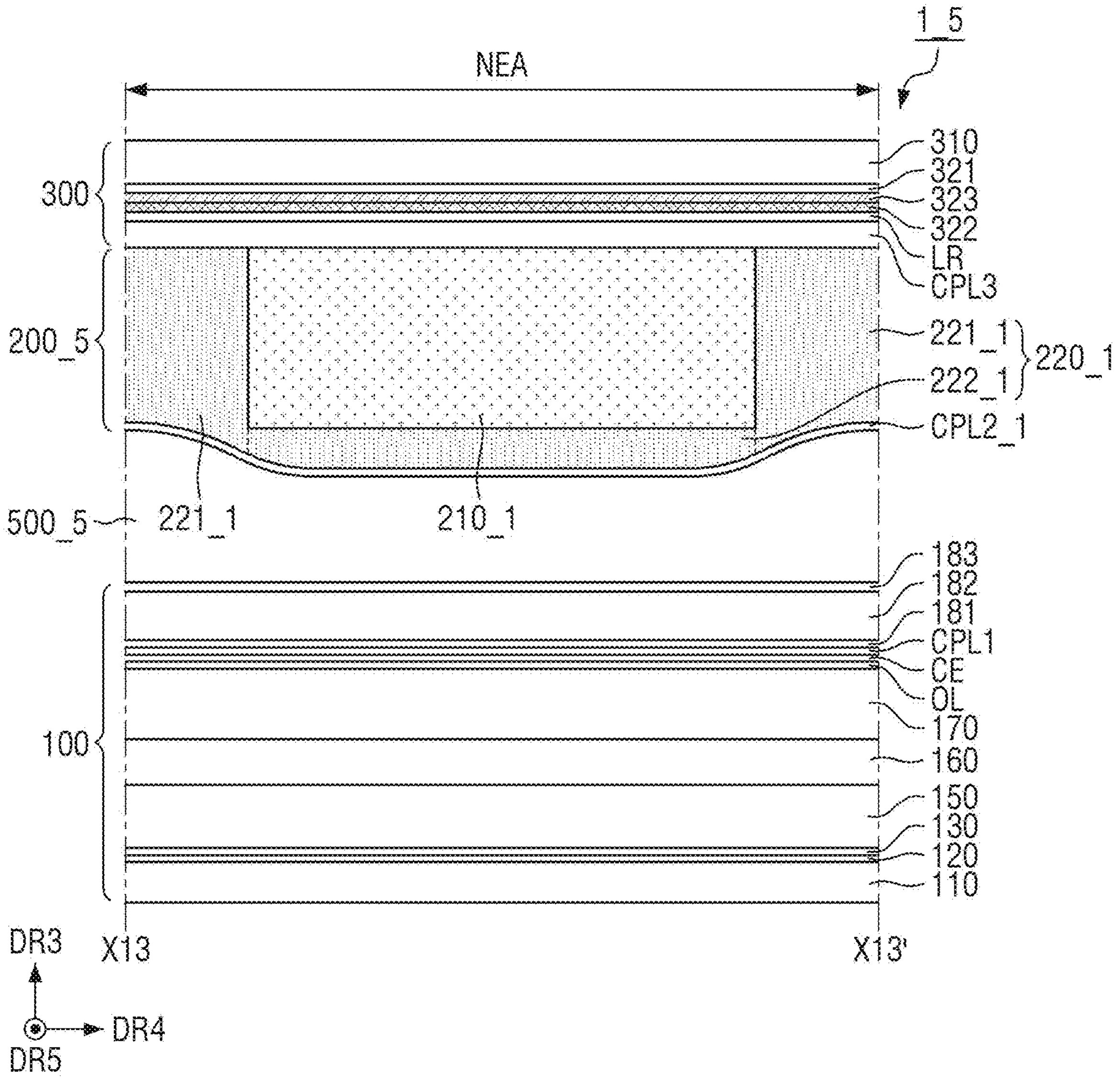

FIG. 28 is a plan view of a mask for a bank for forming the display area of FIG. 17 according to another embodiment. FIG. 29 is a plan view of a light transmitting portion formed by using the mask of FIG. 28.

To form the display area of FIG. 17, various suitable mask designs may be adopted. A first mask MASK1_2 illustrated in FIG. 28 may be the same or substantially the same as the first mask MASK1_1 described above with reference to FIG. 18. Compared to the second mask MASK2_1 described above with reference to FIG. 18, the area of an exposed portion EXP2_2 of the second mask MASK2_2 illustrated in FIG. 28 may be increased, and thus, the area of an overlapping area OVL_2 between the first mask MASK1_2 and the second mask MASK2_2 may also be increased. The exposed portion EXP2_2 of the second mask MASK2_2 illustrated in FIG. 28 may completely cover the exposed portion EXP1_2 of the first mask MASK1_2.

FIGS. 30 through 33 are cross-sectional views schematically taken along the lines X10-X10' to X13-X13', respectively, of a light transmitting portion of FIG. 29 according to one or more embodiments.

A central portion of a sub-bank of a first bank 210_4 extending in the fourth direction DR4 may overlap with a second bank 220_4. The entire top surface of the first bank 210_4 may overlap with the protrusion portion 222 of the second bank 220_4.

FIGS. 34 through 37 are cross-sectional views schematically taken along the lines X10-X10' to X13-X13', respectively, of the light transmitting portion of FIG. 29 according to one or more embodiments.

A display device 1_5 illustrated in FIGS. 34 to 37 may be different from the display device 1_4 described above with reference to FIGS. 30 to 33, in that a light transmitting portion 200_5 may be disposed between a filling portion 500_5 and the color filter portion 300. The bank pattern of the light transmitting portion 200_5 of FIGS. 34 to 37 may be formed by using the masks MASK1_2 and MASK2_2 described above with reference to FIG. 28. In addition, the configuration of the light transmitting portion 200_4 described above with reference to FIGS. 30 to 33 may be applied to the light transmitting portion 200_5 illustrated in FIGS. 34 to 37 with the vertical relationship reversed.

Figure 38:
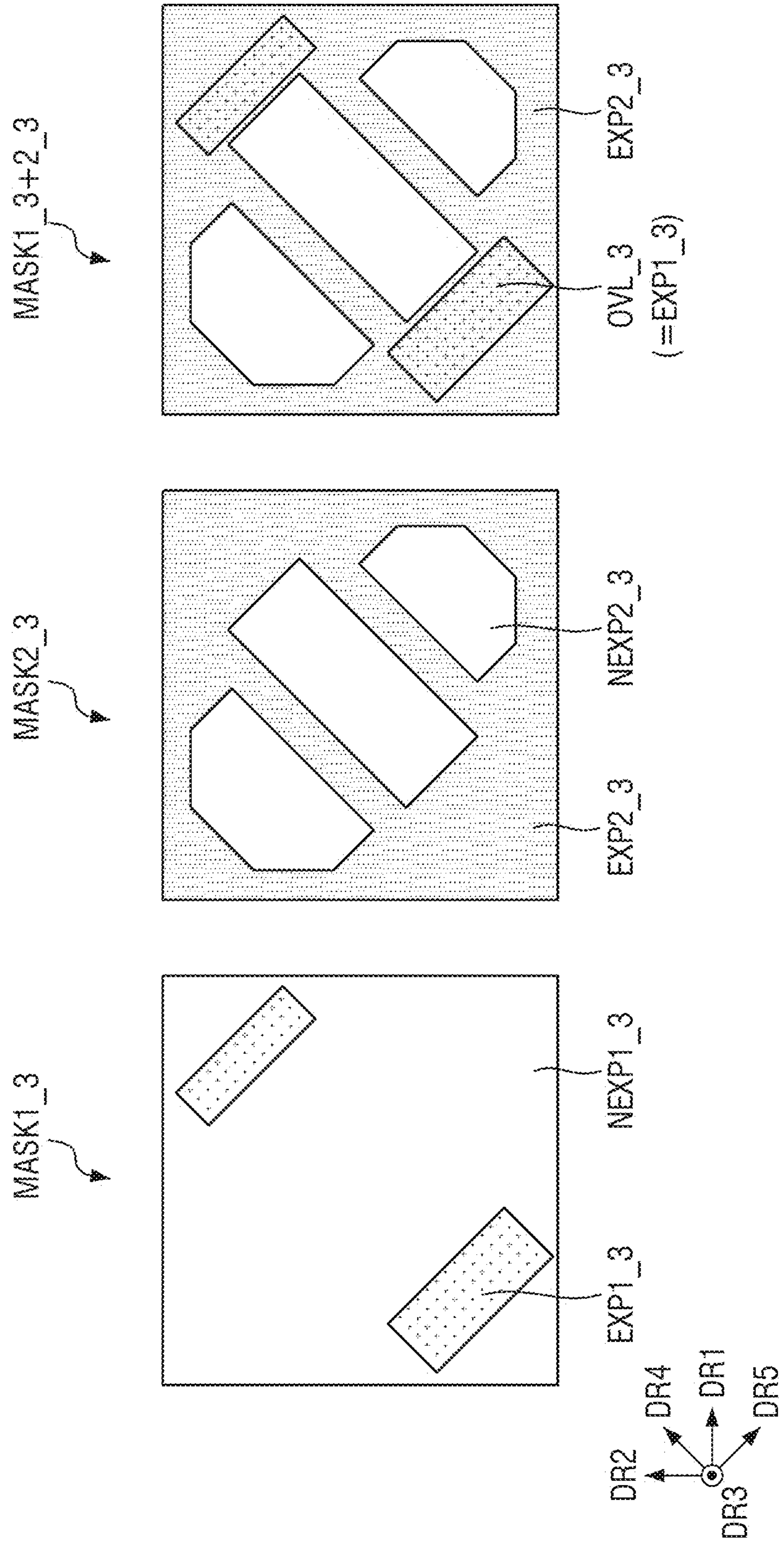
FIG. 38 is a plan view of a mask for a bank for forming a display area of FIG. 17 according to another embodiment.
Figure 39:
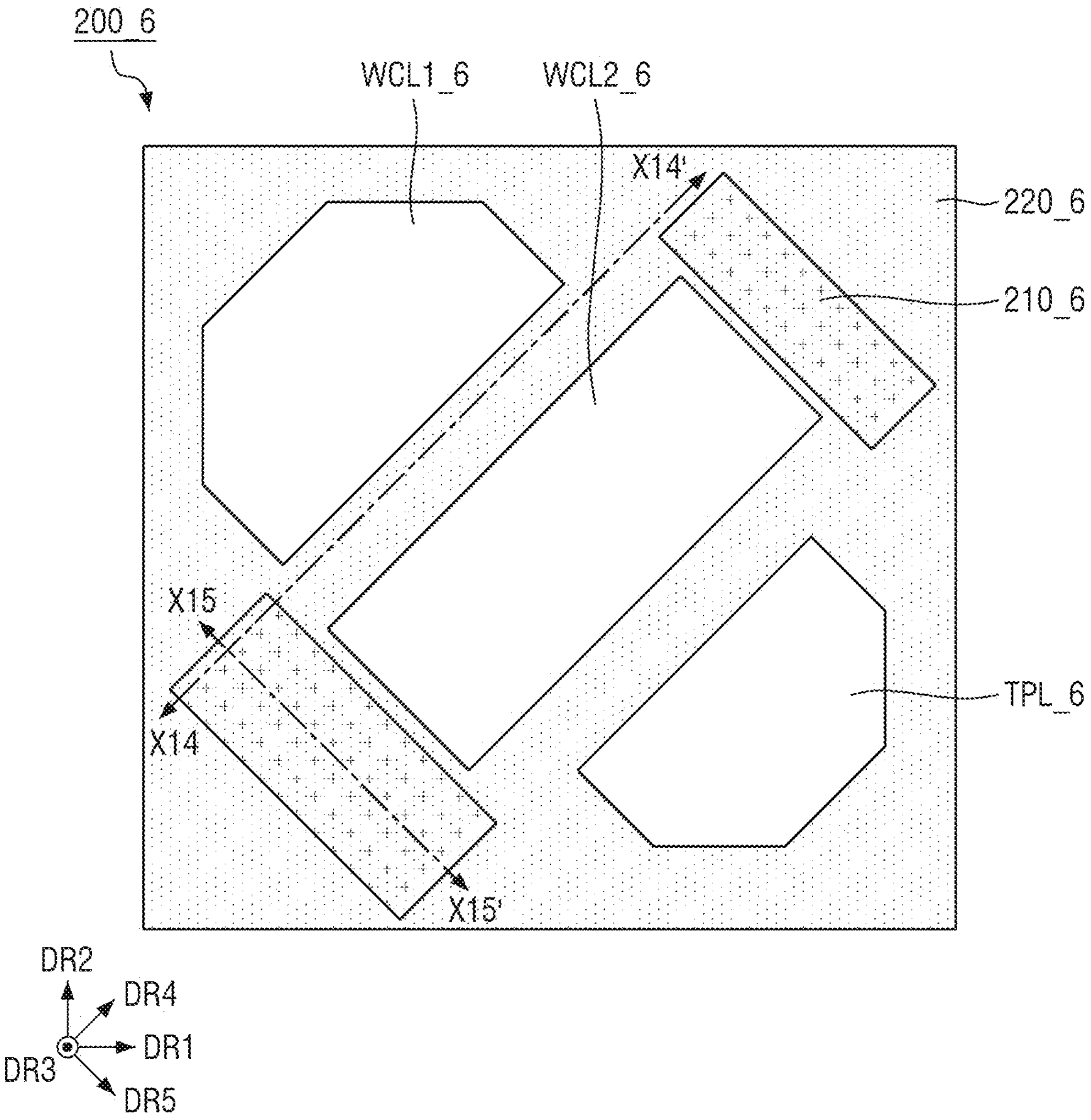
FIG. 39 is a plan view of a light transmitting portion formed by using the mask of FIG. 38.

FIG. 38 is a plan view of a mask for a bank for forming a display area of FIG. 17 according to another embodiment. FIG. 39 is a plan view of a light transmitting portion formed by using the mask of FIG. 38.

A first mask MASK1_3 illustrated in FIG. 38 may be different from the first mask MASK1_2 described above with reference to FIG. 28. A second mask MASK2_3 illustrated in FIG. 38 may be different from the second mask MASK2_2 described above with reference to FIG. 28.

Sub-banks of a first bank 210_6 may be disposed on one side and the other side of a second emission area EA2_3 in the fourth direction DR4. The entire top surface of each of the sub-banks of the first bank 210_6 may overlap with a second bank 220_6.

Figure 40:
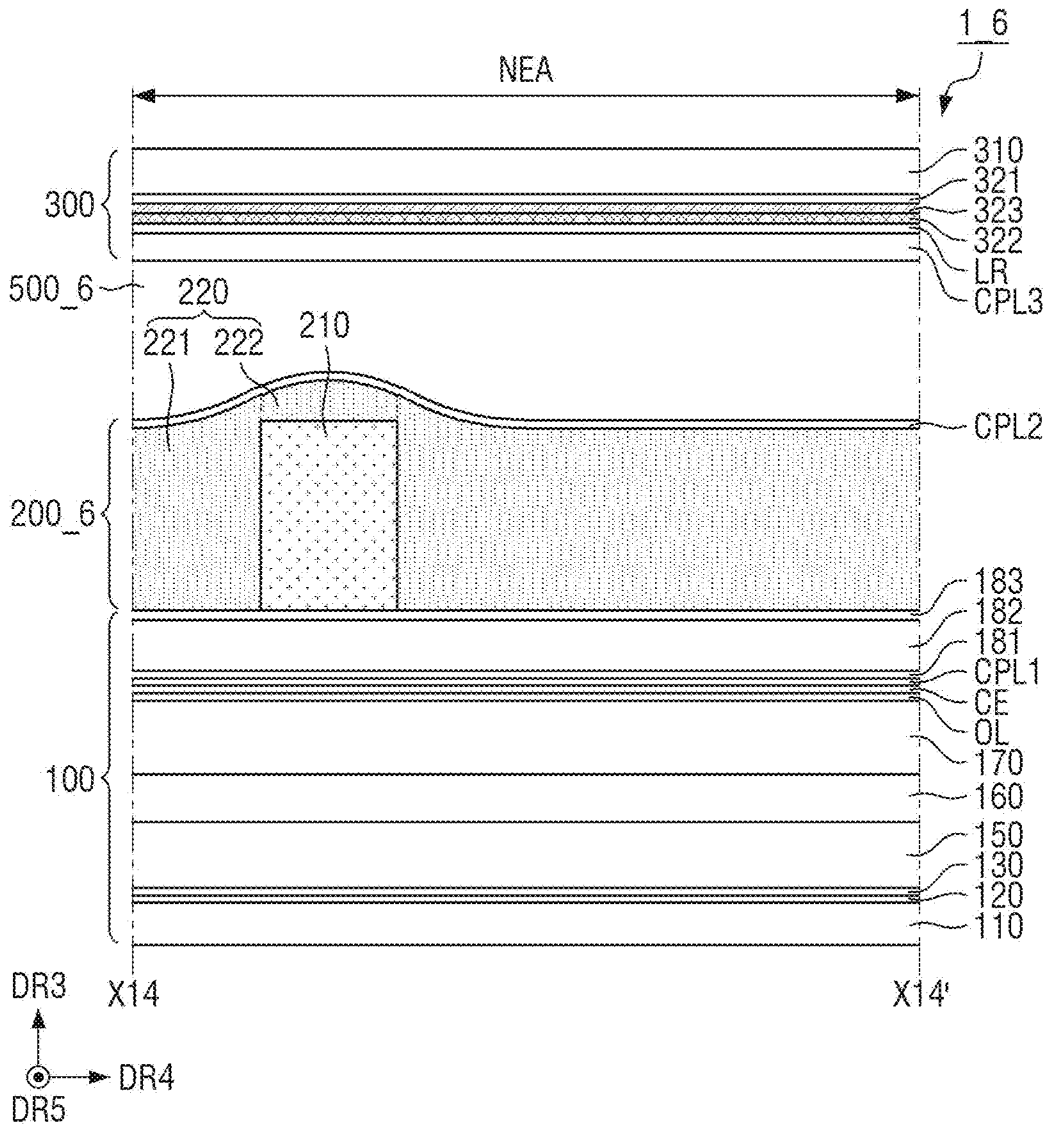
FIGS. 40-41 are cross-sectional views schematically taken along the lines X14-X14' to X15-X15', respectively, of the light transmitting portion of FIG. 39 according to one or more embodiments.
Figure 41:
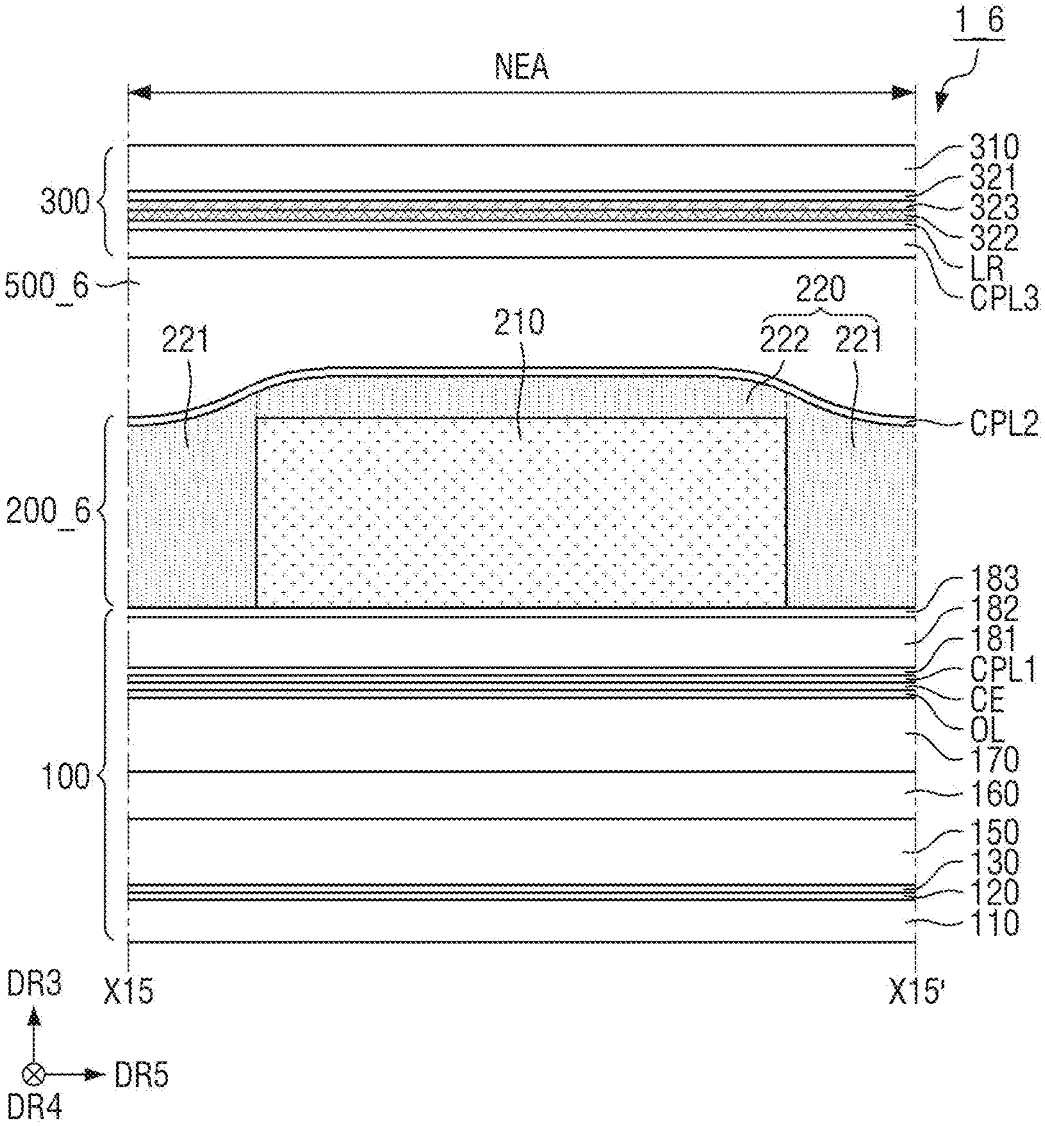

FIGS. 40 through 41 are cross-sectional views schematically taken along the lines X14-X14' to X15-X15', respectively, of the light transmitting portion of FIG. 39 according to one or more embodiments.

Figure 42:
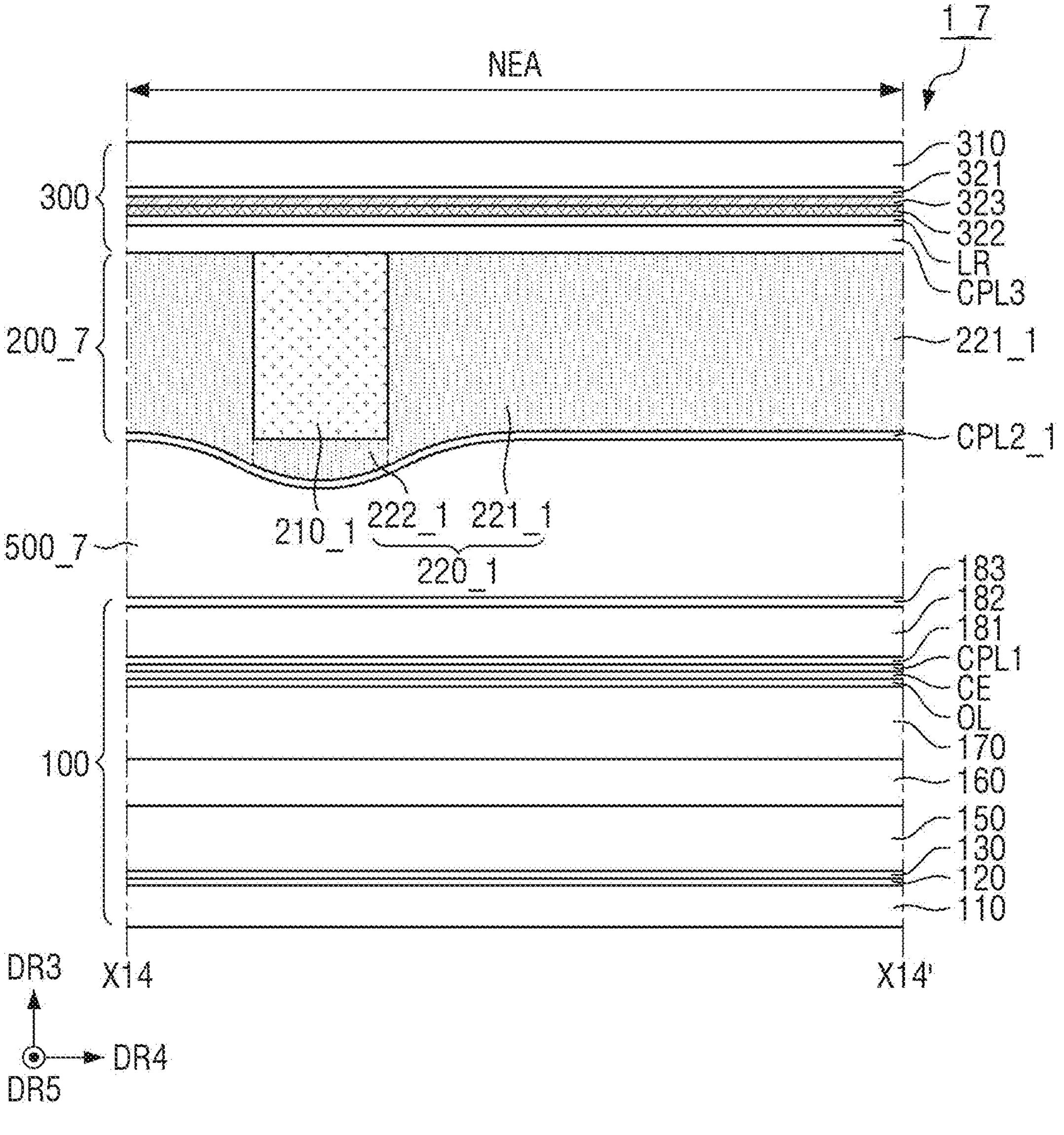
FIGS. 42-43 are cross-sectional views schematically taken along the lines X14-X14' to X15-X15', respectively, of the light transmitting portion of FIG. 39 according to one or more embodiments.
Figure 43:
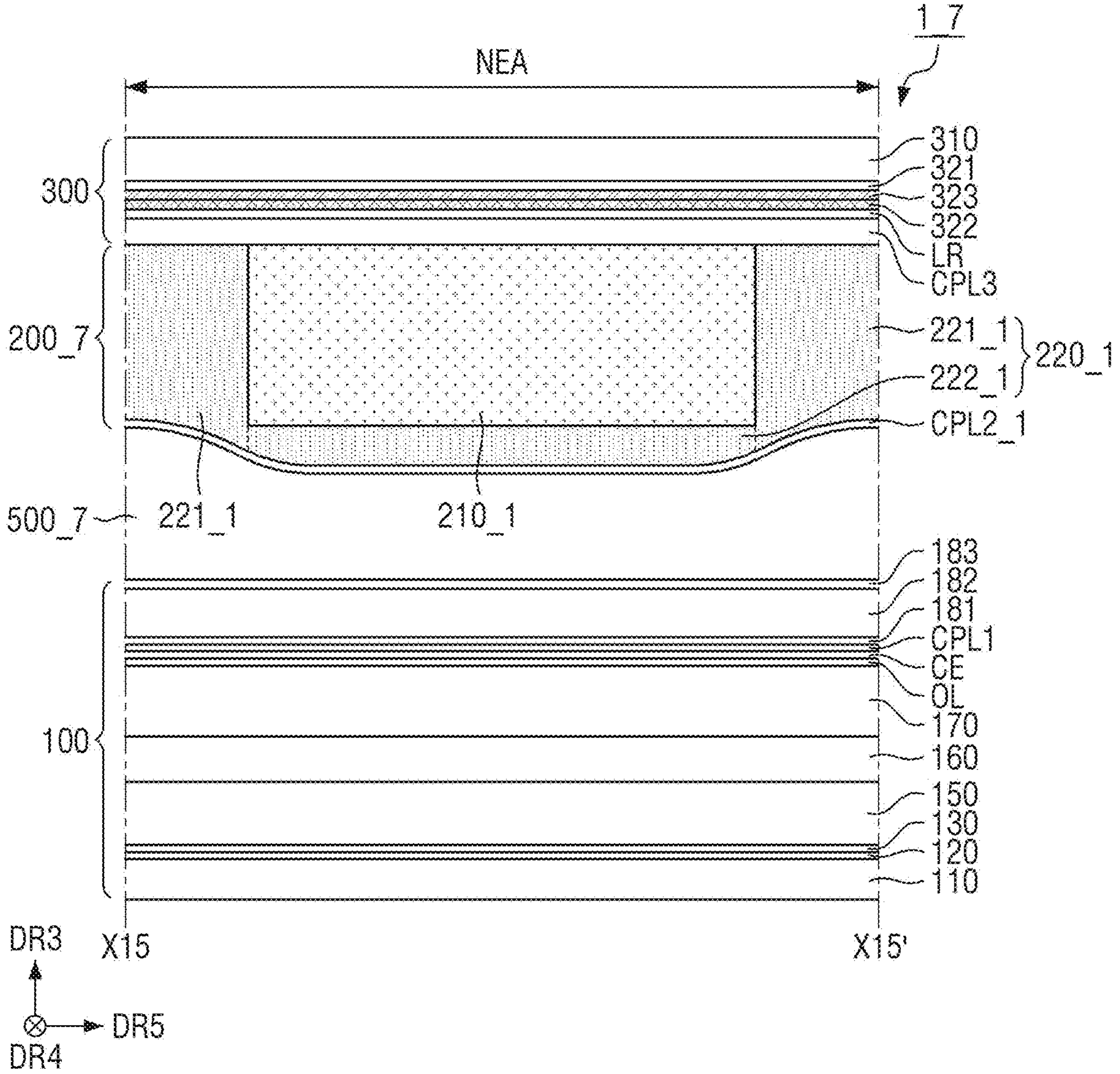

FIGS. 42 through 43 are cross-sectional views schematically taken along the lines X14-X14' to X15-X15', respectively, of the light transmitting portion of FIG. 39 according to one or more embodiments.

A display device 1_7 illustrated in FIGS. 42 to 43 may be different from a display device 1_6 illustrated in FIGS. 40 to 41, in that a light transmitting portion 200_7 may be disposed between a filling portion 500_7 and the color filter portion 300. The bank pattern of the light transmitting portion 200_7 of FIGS. 42 and 43 may be formed by using the masks MASK1_3 and MASK2_3 described above with reference to FIG. 38. The configuration of the light transmitting portion 200_6 illustrated in FIGS. 40 to 41 may be applied to the light transmitting portion 200_7 illustrated in FIGS. 42 and 43 with the vertical relationship reversed.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:

a first substrate comprising an emission area and a non-emission area;

a light emitting element on the first substrate in the emission area;

a pixel defining layer on the first substrate in the non-emission area;

an encapsulation layer on the light emitting element and the pixel defining layer;

a first bank on the encapsulation layer in the non-emission area; and a second bank on the encapsulation layer in the non-emission area, and comprising:

a main portion that does not overlap with the first bank; and a protrusion portion overlapping with the first bank, and connected to the main portion.

2. The display device of claim 1, wherein the first bank and the main portion of the second bank are located at the same layer as each other.

3. The display device of claim 1, wherein a minimum height of the main portion of the second bank is less than a height of the first bank.

4. The display device of claim 1, further comprising a capping layer on the first bank and the second bank, wherein the capping layer comprises a section curved along the protrusion portion of the second bank in a cross-sectional view.

5. The display device of claim 1, further comprising:

a filling portion on the first bank and the second bank; and a second substrate on the filling portion, wherein the protrusion portion of the second bank is located between the first bank and the filling portion.

6. The display device of claim 1, further comprising:

a filling portion between the encapsulation layer and the first bank, and between the encapsulation layer and the second bank; and a second substrate on the filling portion, wherein the protrusion portion of the second bank is located between the first bank and the filling portion.

7. The display device of claim 1, wherein the first bank comprises a plurality of sub-banks, and the sub-banks of the first bank are spaced from each other in a first direction, and wherein the second bank comprises a plurality of sub-banks, and the sub-banks of the second bank are spaced from each other in a second direction crossing the first direction.

8. The display device of claim 7, wherein two sub-banks from among the plurality of sub-banks of the first bank are spaced from each other with the main portion of the second bank interposed therebetween.

9. The display device of claim 8, wherein each of the sub-banks of the second bank extends in the first direction, and over the sub-banks of the first bank.

10. The display device of claim 8, wherein the main portion of the second bank is connected to the protrusion portion overlapping with the first bank located on one side of the second bank in the first direction, and the protrusion portion overlapping with the first bank located on another side of the second bank in the first direction.

11. The display device of claim 8, further comprising a capping layer in contact with the first bank, and in contact with the main portion and the protrusion portion of the second bank.

12. The display device of claim 1, wherein the emission area comprises a first emission area, a second emission area, and a third emission area sequentially along a first direction, and wherein a width of the second emission area is greater than a width of the first emission area and a width of the third emission area.

13. The display device of claim 12, wherein the protrusion portion of the second bank is located between the first emission area and the second emission area.

14. The display device of claim 12, wherein the first bank comprises a plurality of sub-banks, and each of the sub-banks of the first bank overlaps with the second bank.

15. The display device of claim 14, wherein any one of the sub-banks of the first bank extends in a second direction crossing the first direction, and wherein one end and another end of the one of the sub-banks of the first bank in the second direction overlaps with the second bank.

16. The display device of claim 15, wherein the one of the sub-banks of the first bank comprises a central portion located between the one end and the other end, and wherein the central portion of the one of the sub-banks of the first bank overlaps with the second bank.

17. The display device of claim 12, wherein the second emission area extends in a second direction crossing the first direction, and wherein the first bank comprises sub-banks located on one side and another side of the second emission area in the second direction, respectively.

18. The display device of claim 17, wherein an entire top surface of the first bank overlaps with the second bank.

19. A display device comprising:

a first substrate comprising an emission area and a non-emission area;

a light emitting element on the first substrate in the emission area;

a pixel defining layer on the first substrate in the non-emission area;

an encapsulation layer on the light emitting element and the pixel defining layer;

a first bank on the encapsulation layer in the non-emission area, and comprising a plurality of sub-banks spaced from each other;

a second bank on the encapsulation layer in the non-emission area, and comprising a main portion that does not overlap with the first bank, and a protrusion portion overlapping with the first bank; and a capping layer in contact with the first bank and the second bank.

20. The display device of claim 19, further comprising a light transmitting member on the encapsulation layer in the emission area, wherein a side surface of the light transmitting member faces a side surface of the first bank and a side surface of the main portion of the second bank.

* * * * *